United States Patent
Oota et al.

(10) Patent No.: US 9,437,428 B2
(45) Date of Patent: Sep. 6, 2016

(54) METHOD OF MANUFACTURING A SEMICONDUCTOR DEVICE HAVING AN OXIDE SEMICONDUCTOR LAYER WITH INCREASED HYDROGEN CONCENTRATION

(71) Applicant: Semiconductor Energy Laboratory Co., Ltd., Atsugi-shi, Kanagawa-ken (JP)

(72) Inventors: Masashi Oota, Atsugi (JP); Noritaka Ishihara, Koza (JP); Motoki Nakashima, Atsugi (JP); Yoichi Kurosawa, Atsugi (JP); Shunpei Yamazaki, Setagaya (JP); Yasuharu Hosaka, Tochigi (JP); Toshimitsu Obonai, Shimotsuke (JP); Junichi Koezuka, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/552,064

(22) Filed: Nov. 24, 2014

(65) Prior Publication Data

US 2015/0155169 A1      Jun. 4, 2015

(30) Foreign Application Priority Data

Nov. 29, 2013   (JP) .................................. 2013-248320
Feb. 25, 2014   (JP) .................................. 2014-033904
May 23, 2014   (JP) .................................. 2014-107582

(51) Int. Cl.
*H01L 21/02*       (2006.01)
*H01L 49/02*       (2006.01)
(Continued)

(52) U.S. Cl.
CPC ..... *H01L 21/02554* (2013.01); *H01L 21/0242* (2013.01); *H01L 21/0262* (2013.01);
(Continued)

(58) Field of Classification Search
None
See application file for complete search history.

(56) References Cited

U.S. PATENT DOCUMENTS 4,678,542 A *   7/1987   Boer et al. .................... 438/479
5,731,856 A      3/1998   Kim et al.
(Continued)

FOREIGN PATENT DOCUMENTS

CN       101057339 A    10/2007
EP         1737044 A    12/2006
(Continued)

OTHER PUBLICATIONS

Written Opinion (Application No. PCT/IB2014/066312) Dated Apr. 21, 2015.
International Search Report (Application No. PCT/IB2014/066312) Dated Apr. 21, 2015.
Oota, M. et al., "Study of transparent conductive InGaZnO thin films", Extended Abstracts (The 61st Spring Meeting 2014), The Japan Society of Applied Physics and Related Societies, 2014, pp. 21-060.
Nakashima, M. et al., "Calculation for mechanism of N-type behavior in InGaZnO", Extended Abstracts (The 61st Spring Meeting 2014), The Japan Society of Applied Physics and Related Societies, 2014, pp. 21-061.
(Continued)

*Primary Examiner* — Charles Garber
*Assistant Examiner* — Brigitte Paterson
(74) *Attorney, Agent, or Firm* — Robinson Intellectual Property Law Office; Eric J. Robinson

(57) ABSTRACT

To provide a method for manufacturing a semiconductor device including an oxide semiconductor film having conductivity, or a method for manufacturing a semiconductor device including an oxide semiconductor film having a light-transmitting property and conductivity. The method for manufacturing a semiconductor device includes the steps of forming an oxide semiconductor film over a first insulating film, performing first heat treatment in an atmosphere where oxygen contained in the oxide semiconductor film is released, and performing second heat treatment in a hydrogen-containing atmosphere, so that an oxide semiconductor film having conductivity is formed.

14 Claims, 79 Drawing Sheets

(51) Int. Cl.
*H01L 29/66* (2006.01)
*H01L 29/786* (2006.01)
(52) U.S. Cl.
CPC ... *H01L21/02422* (2013.01); *H01L 21/02565* (2013.01); *H01L 21/02631* (2013.01); *H01L 28/20* (2013.01); *H01L 28/60* (2013.01); *H01L 29/66969* (2013.01); *H01L 29/7869* (2013.01); *H01L 29/78693* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,804,091 B2 | 9/2010 | Takechi et al. |
| 7,993,964 B2 | 8/2011 | Hirao et al. |
| 8,110,436 B2 | 2/2012 | Hayashi et al. |
| 8,232,124 B2 | 7/2012 | Takechi et al. |
| 8,502,217 B2 | 8/2013 | Sato et al. |
| 8,530,273 B2 | 9/2013 | Den |
| 8,653,517 B2 | 2/2014 | Kawamura et al. |
| 2001/0046027 A1 | 11/2001 | Tai et al. |
| 2002/0056838 A1 | 5/2002 | Ogawa |
| 2002/0058412 A1* | 5/2002 | Ono .................. H01L 21/288 438/678 |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0035920 A1 | 2/2008 | Takechi et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2010/0233847 A1* | 9/2010 | Ohara ................ C01G 15/006 438/104 |
| 2010/0320471 A1 | 12/2010 | Takechi et al. |
| 2012/0001167 A1 | 1/2012 | Morosawa |
| 2012/0107996 A1* | 5/2012 | Sheng et al. .................... 438/71 |
| 2012/0248433 A1* | 10/2012 | Nakano et al. .................. 257/43 |
| 2013/0043469 A1 | 2/2013 | Kawamura et al. |
| 2013/0127694 A1 | 5/2013 | Kim |
| 2013/0277672 A1 | 10/2013 | Sano et al. |
| 2013/0309808 A1 | 11/2013 | Zhang et al. |
| 2014/0034954 A1 | 2/2014 | Yamazaki et al. |
| 2014/0357019 A1 | 12/2014 | Koyama et al. |
| 2015/0155313 A1 | 6/2015 | Yamazaki et al. |

FOREIGN PATENT DOCUMENTS

| | | |
|---|---|---|
| EP | 2226847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |

(56) References Cited

FOREIGN PATENT DOCUMENTS

| | | |
|---|---|---|
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2007-096055 A | 4/2007 |
| JP | 2007-123861 A | 5/2007 |
| JP | 2008-040343 A | 2/2008 |
| JP | 2011-077106 A | 4/2011 |
| JP | 2011-091279 A | 5/2011 |
| JP | 5554832 | 7/2014 |
| KR | 2007-0090182 A | 9/2007 |
| KR | 2012-0130243 A | 11/2012 |
| WO | WO-2004/114391 | 12/2004 |
| WO | WO-2006/051993 | 5/2006 |
| WO | WO-2011/125940 | 10/2011 |
| WO | WO-2015/079362 | 6/2015 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of The 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electromechanical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of The 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Sato.A et al., "Amorphous In—Ga—Zn—O coplanar homojunction thin-film transistor", Appl. Phys. Lett. (Applied Physics Letters) , 2009, vol. 94, pp. 133502-1-133502-3.

Oota et al. "Study of the Origin of Major Donor States in Oxide Semiconductor", SID 2014 Digest, 2014, pp. 975-978.

Nonaka et al. "Investigation of defects in In—Ga—Zn oxide thin film using electron spin resonance signals" Journal of Applied Physics, 2014, 115, pp. 163707-1-163707-5.

* cited by examiner path of hydrogen transfer (a.u)

FIG. 19A
FIG. 19B
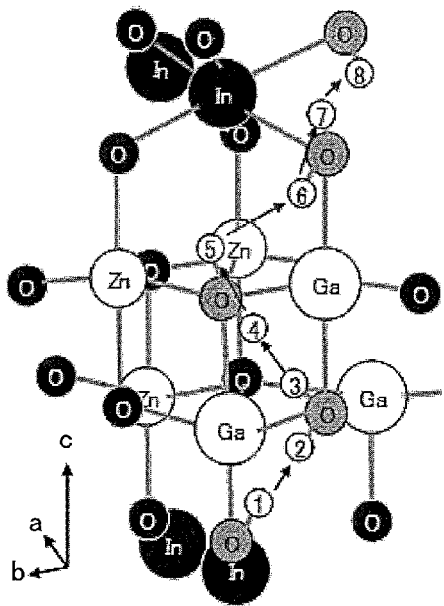
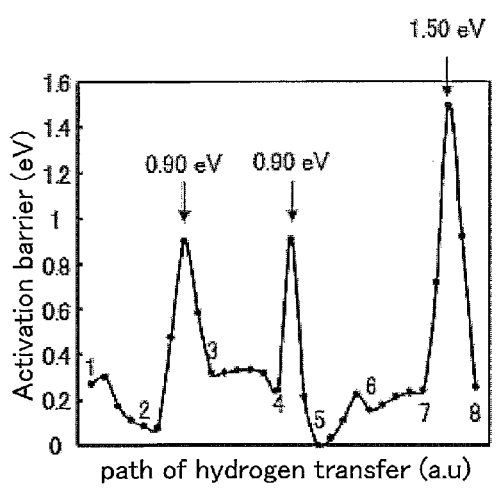

FIG. 23A  Initial state ($H_O$)
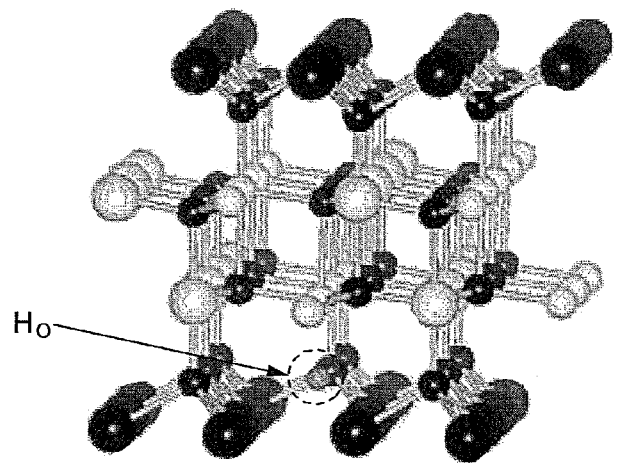
FIG. 23B  Final state ($V_O$, H-O)
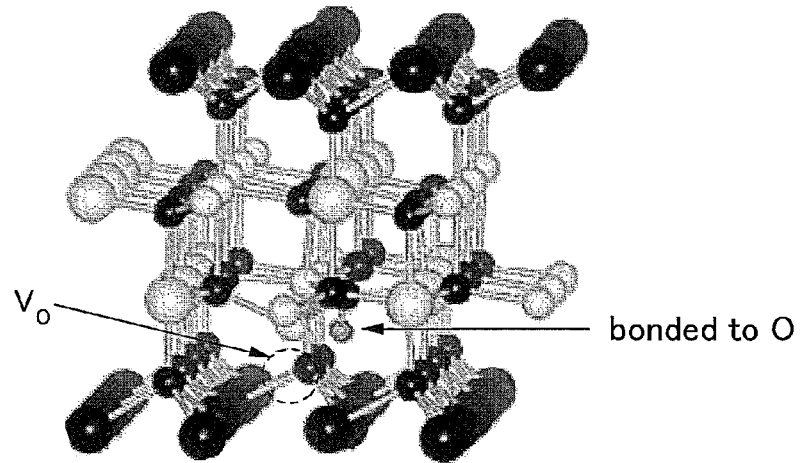

FIG. 25A  Initial state ($H_O$)
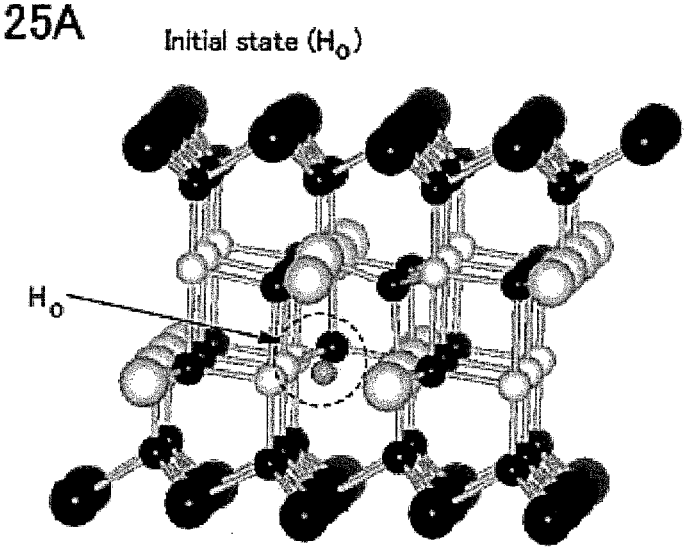
FIG. 25B  Final state ($V_O$, H–O)
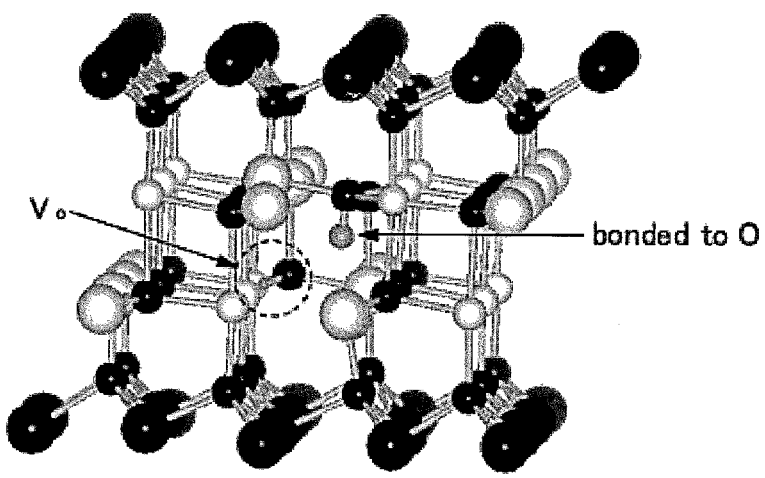

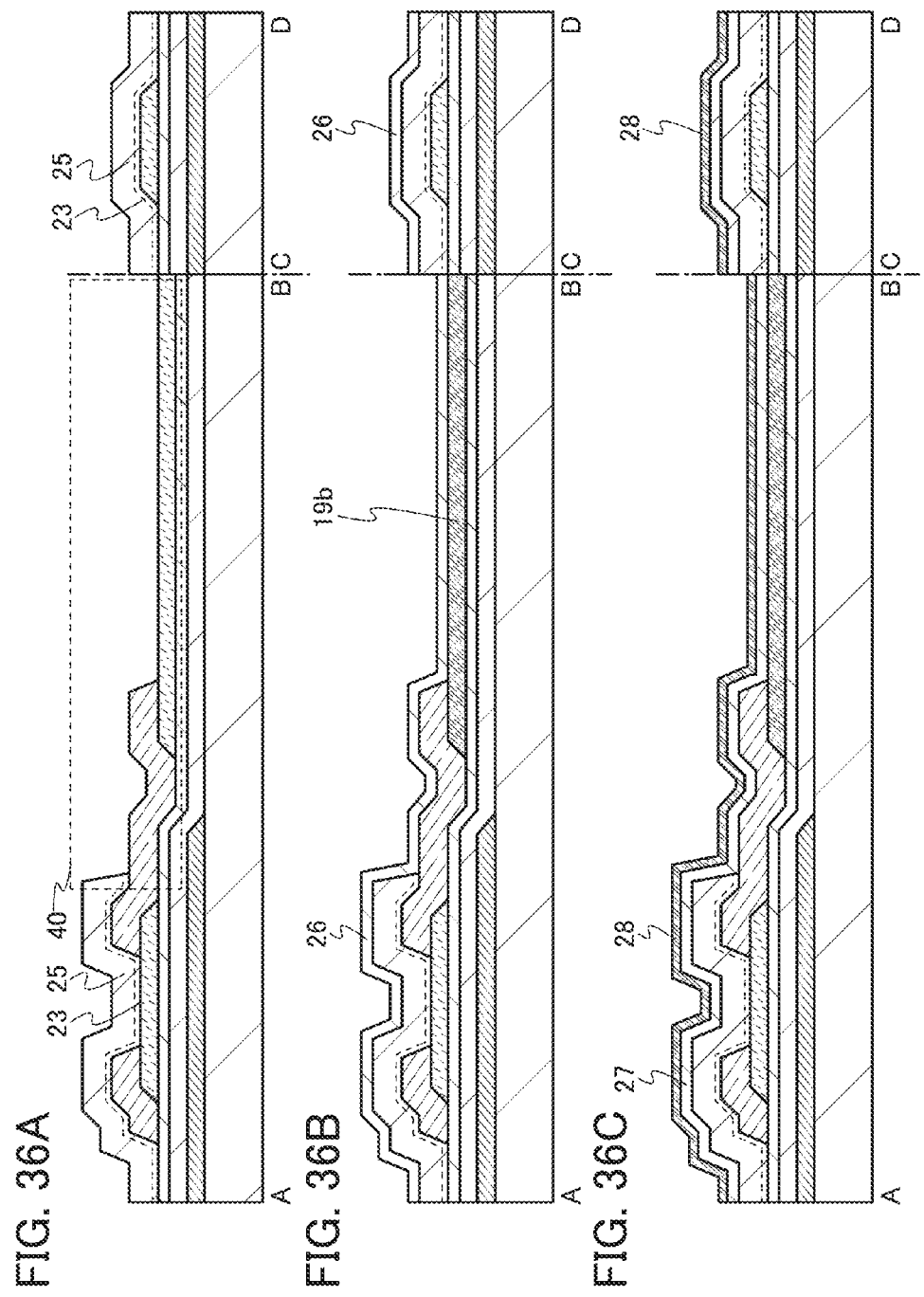

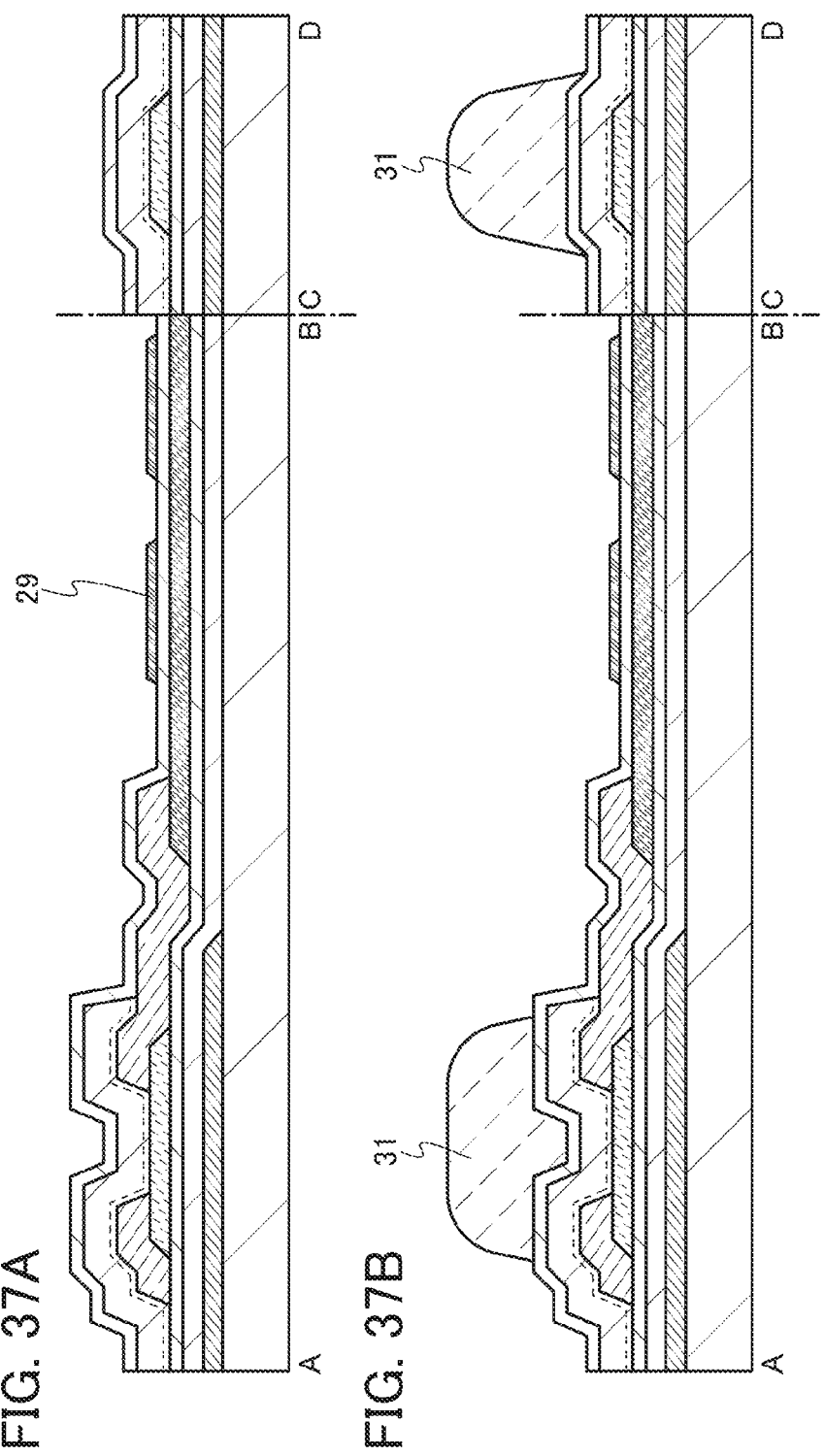

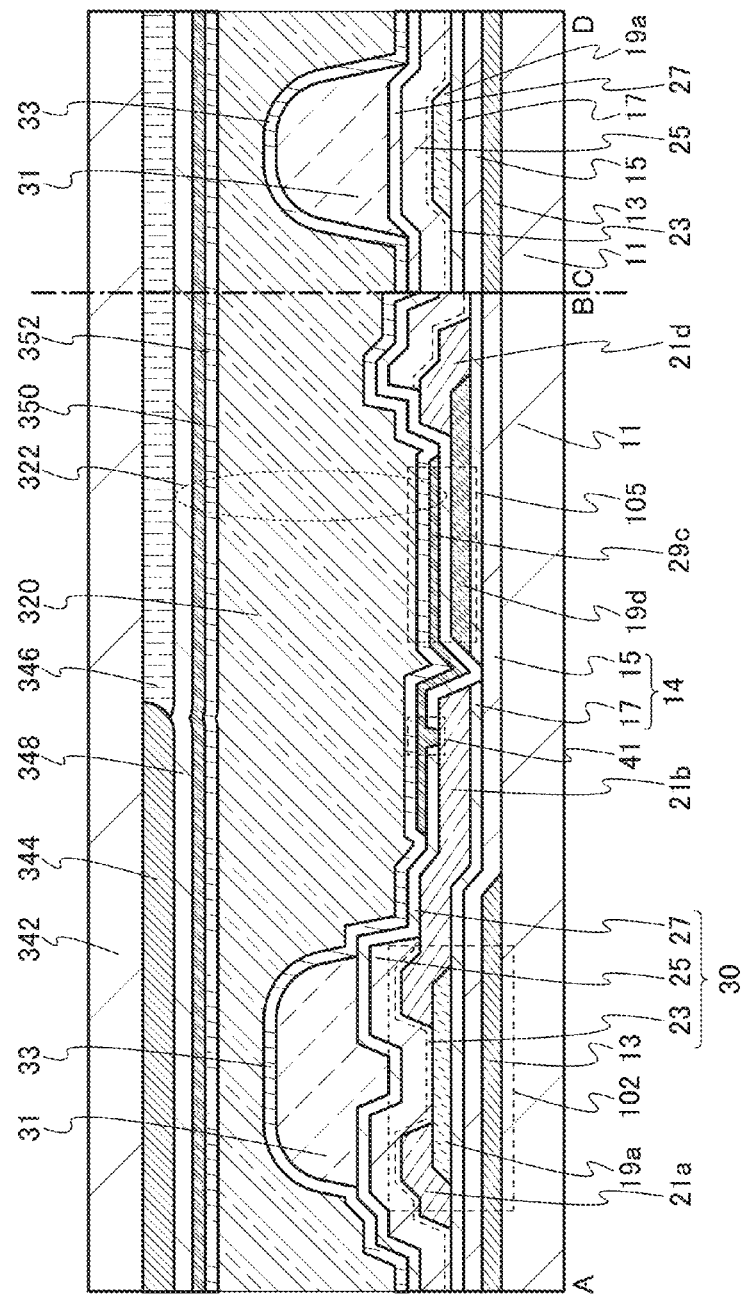

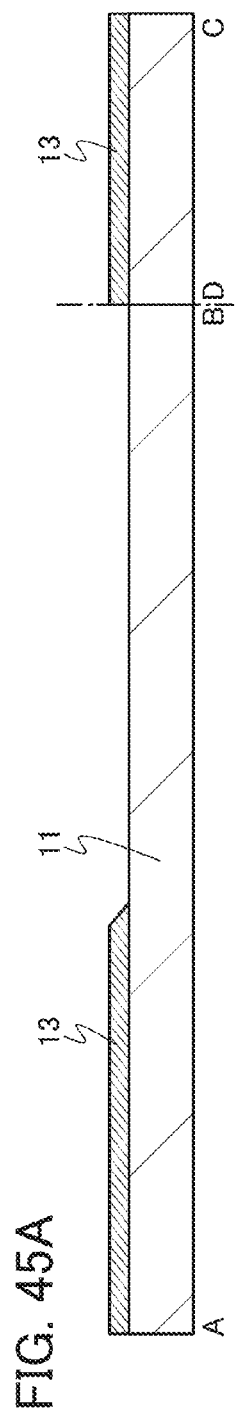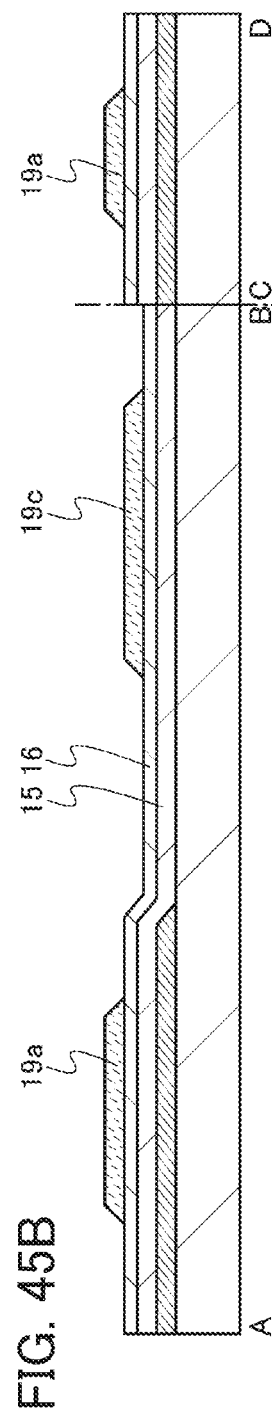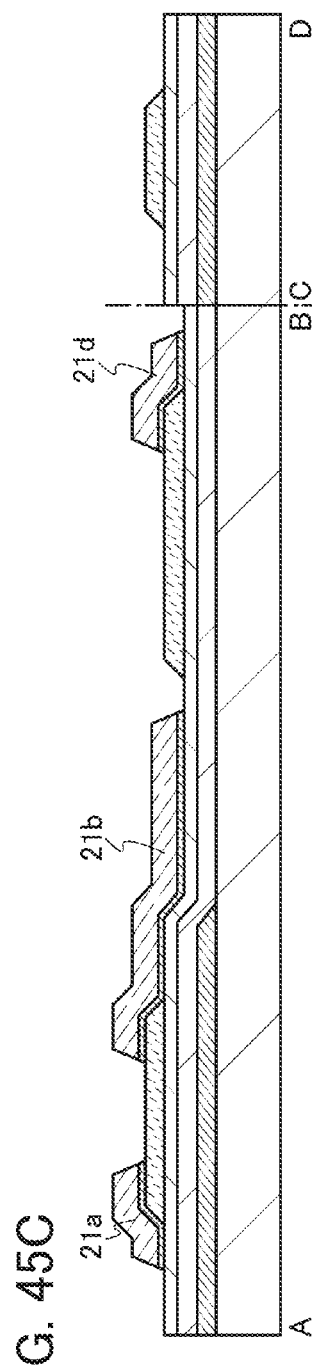

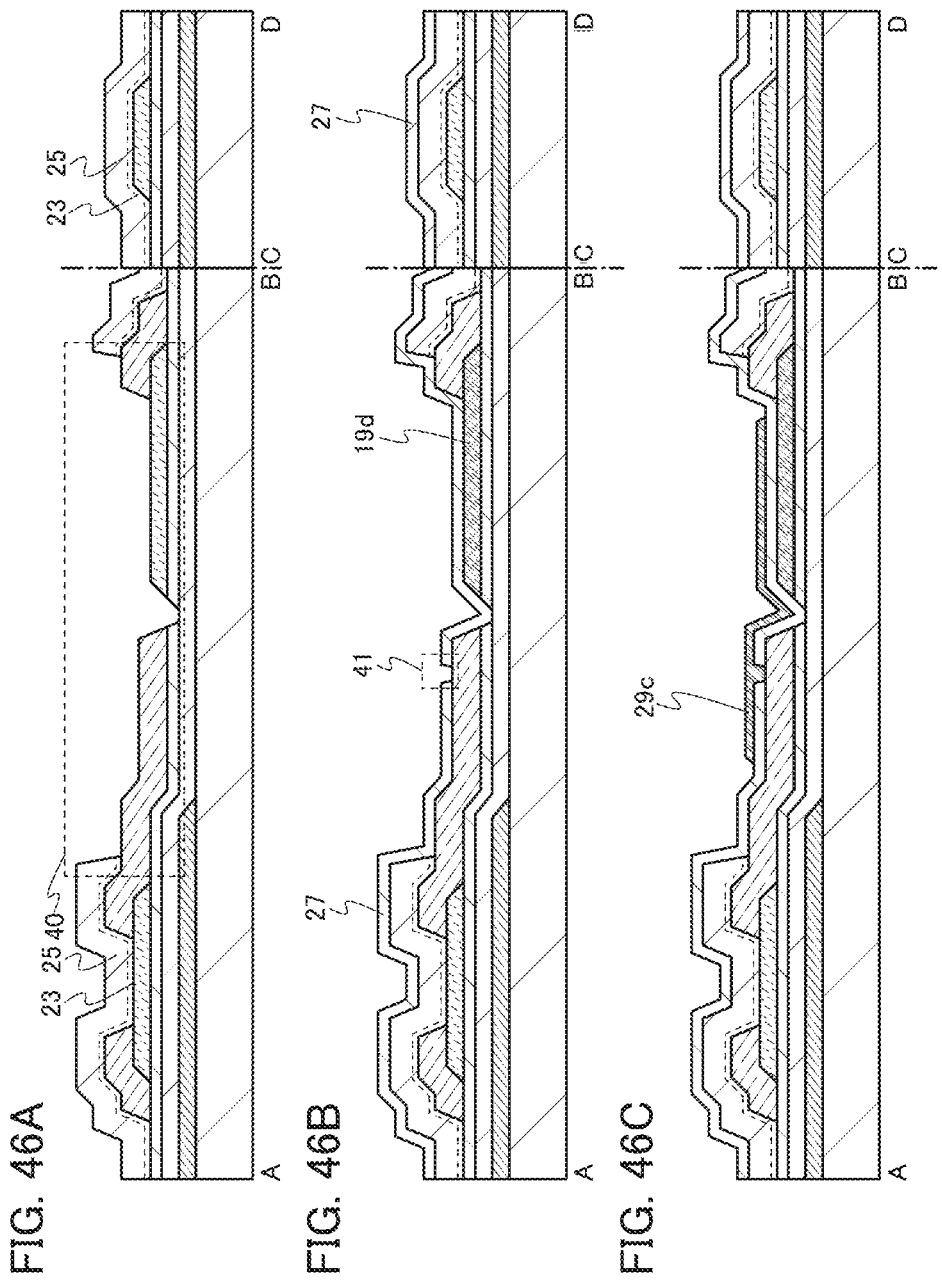

FIG. 73A
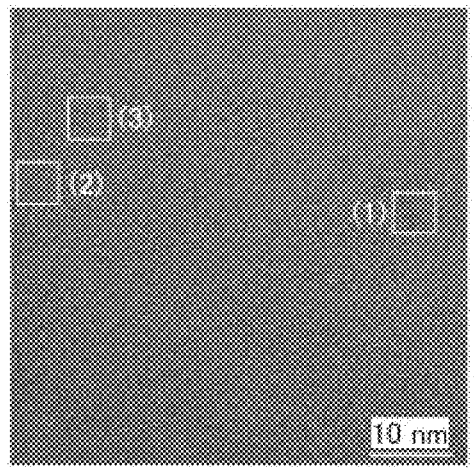
FIG. 73B          FIG. 73C          FIG. 73D
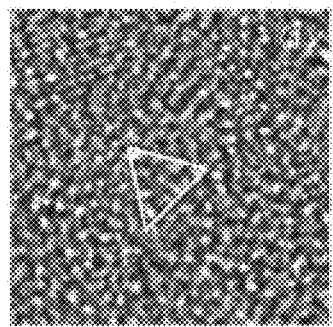 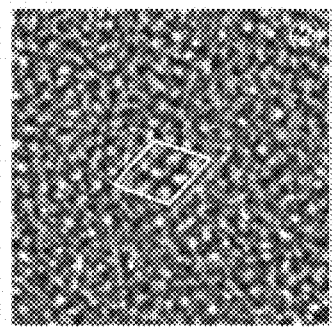 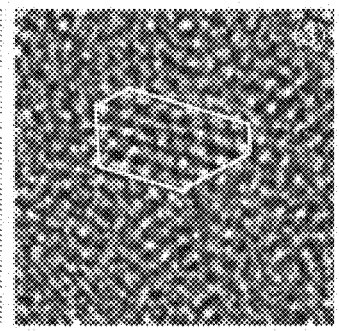

Sample irradiated with electron
beam parallel to sample surface

Sample irradiated with electron
beam perpendicular to sample
surface

Cross-sectional view of pellet

Top view of pellet

METHOD OF MANUFACTURING A SEMICONDUCTOR DEVICE HAVING AN OXIDE SEMICONDUCTOR LAYER WITH INCREASED HYDROGEN CONCENTRATION

TECHNICAL FIELD

One embodiment of the present invention relates to a semiconductor device including an oxide semiconductor, and a manufacturing method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

Transistors used for most flat panel displays typified by a liquid crystal display device or a light-emitting display device are formed using a silicon semiconductor such as amorphous silicon, single crystal silicon, or polycrystalline silicon provided over a glass substrate. Furthermore, transistors formed using such silicon semiconductors are used in integrated circuits (IC) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a technique is disclosed in which a transistor is formed using zinc oxide or an In—Ga—Zn-based oxide as an oxide semiconductor and the transistor is used as a switching element or the like of a pixel in a display device (see Patent Documents 1 and 2).

REFERENCE

Patent Documents

[Patent Document 1] Japanese Published Patent Application No. 2007-123861
[Patent Document 2] Japanese Published Patent Application No. 2007-096055

DISCLOSURE OF INVENTION

One embodiment of the present invention provides a method for manufacturing a semiconductor device including an oxide semiconductor film having conductivity (hereinafter also referred to as a conductive oxide semiconductor film). Another embodiment of the present invention provides a method for manufacturing a semiconductor device including an oxide semiconductor film having a light-transmitting property and conductivity. Another embodiment of the present invention provides a method for manufacturing a semiconductor device including a transistor and a capacitor in a small number of steps. Another embodiment of the present invention provides a method for manufacturing a novel semiconductor device.

In a capacitor, a dielectric film is provided between a pair of electrodes at least one of which is formed, in many cases, using a light-blocking conductive film partly serving as a gate electrode, a source electrode, a drain electrode, or the like of a transistor.

In a liquid crystal display device, an increase in the capacitance of a capacitor increases the period during which the alignment of liquid crystal molecules in a liquid crystal element can be kept constant while an electric field is applied. In the case where a still image is displayed, the increased period reduces the number of times of rewriting image data, leading to a reduction in power consumption. Note that the driving method for reducing the number of times of rewriting image data is referred to as a low-frequency driving method.

One of methods for increasing the capacitance of a capacitor is to increase the area occupied by the capacitor, specifically, to increase the area of a portion where a pair of electrodes overlap with each other. However, in a liquid crystal display device, when the area of a light-blocking conductive film is increased to increase the area of a portion where the electrodes overlap with each other, the aperture ratio of a pixel decreases and thus image display quality is degraded. Such a problem is remarkable particularly in a liquid crystal display device with high resolution.

In view of the above, one embodiment of the present invention provides a method for manufacturing a display device that has a high aperture ratio and includes a capacitor with a high capacitance. Another embodiment of the present invention provides a method for manufacturing a display device consuming less power. Another embodiment of the present invention provides a method for manufacturing a display device with a high aperture ratio and a wide viewing angle in a small number of steps.

Note that the description of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a method for manufacturing a semiconductor device, including the steps of forming an oxide semiconductor film over a first insulating film; performing first heat treatment in an atmosphere where oxygen contained in the oxide semiconductor film is released; and performing second heat treatment in a hydrogen-containing atmosphere, thereby forming an oxide semiconductor film having conductivity.

Note that the first heat treatment is preferably performed at a temperature higher than or equal to 350° C. and lower than or equal to 800° C., preferably higher than or equal to 450° C. and lower than or equal to 800° C. When the heat treatment is performed at a temperature higher than or equal to 350° C., oxygen is released from the oxide semiconductor film. In contrast, when the heat treatment is performed at a temperature lower than or equal to 800° C. oxygen can be released from the oxide semiconductor film while the crystal structure in the oxide semiconductor film is maintained. In addition, the heat treatment is preferably performed in a vacuum atmosphere, typically in an atmosphere with a pressure greater than or equal to $1\times10^{-7}$ Pa and less than or equal to 10 Pa, preferably greater than or equal to $1\times10^{-7}$ Pa and less than or equal to 1 Pa, and more preferably greater than or equal to $1\times10^{-7}$ Pa and less than or equal to $1\times10^{-1}$ Pa.

Another embodiment of the present invention is a method for manufacturing a semiconductor device, including the steps of forming an oxide semiconductor film over a first insulating film; adding a rare gas to the oxide semiconductor film; and performing heat treatment in a hydrogen-containing atmosphere, thereby forming an oxide semiconductor film having conductivity.

Note that the rare gas is helium, neon, argon, krypton, or xenon.

Another embodiment of the present invention is a method for manufacturing a semiconductor device, including the steps of forming an oxide semiconductor film over a first insulating film; and forming a second insulating film over the oxide semiconductor film by a sputtering method or a plasma CVD method, thereby forming an oxide semiconductor film having conductivity.

Note that the first insulating film or the second insulating film preferably contains hydrogen, typically includes a silicon nitride film containing hydrogen.

The hydrogen concentration in the oxide semiconductor film having conductivity is preferably higher than or equal to $8\times10^{19}$ atoms/cm$^3$.

The resistivity of the oxide semiconductor film having conductivity is preferably greater than or equal to $1\times10^{-3}$ Ω cm and less than $1\times10^{-4}$ Ω cm.

The oxide semiconductor film having conductivity may include a crystal part, and the c-axis of the crystal part may be parallel to a normal vector of a surface over which the oxide semiconductor film is formed.

The oxide semiconductor film having conductivity preferably includes at least one of an In—Ga oxide, an In—Zn oxide, and an In-M-Zn oxide (M is Al, Ga, Y, Zr, Sn, La, Ce, or Nd).

According to one embodiment of the present invention, a semiconductor device including an oxide semiconductor film having conductivity can be manufactured. According to another embodiment of the present invention, a semiconductor device including an oxide semiconductor film having a light-transmitting property and conductivity can be manufactured. According to another embodiment of the present invention, a semiconductor device including a transistor and a capacitor can be manufactured in a small number of steps. According to another embodiment of the present invention, a novel semiconductor device can be manufactured.

According to one embodiment of the present invention, a display device that has a high aperture ratio and includes a capacitor with a high capacitance can be manufactured. According to another embodiment of the present invention, a display device consuming less power can be manufactured. According to another embodiment of the present invention, a display device with a high aperture ratio and a wide viewing angle can be manufactured in a small number of steps.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

In the accompanying drawings:

FIGS. 19A and 19B show a hydrogen transfer path in the c-axis direction and the activation barrier along the path, respectively;

FIGS. 23A and 23B show models in the initial state and the final state, respectively;

FIGS. 25A and 25B show models in the initial state and the final state, respectively;

FIGS. 36A to 36C are cross-sectional views illustrating one mode of the method for manufacturing the display device;

FIGS. 37A and 37B are cross-sectional views illustrating one mode of the method for manufacturing the display device;

FIG. 44 is a cross-sectional view illustrating one mode of the display device;

FIGS. 45A to 45C are cross-sectional views illustrating one mode of the method for manufacturing the display device;

FIGS. 46A to 46C are cross-sectional views illustrating one mode of the method for manufacturing the display device;

FIGS. 73A to 73D are Cs-corrected high-resolution TEM images of a plane of the CAAC-OS;

BEST MODE FOR CARRYING OUT THE INVENTION

Figure 1A:
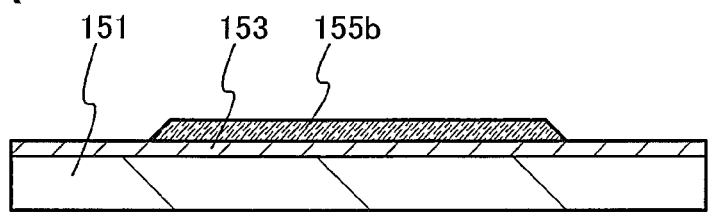
FIGS. 1A to 1C are cross-sectional views illustrating modes of the semiconductor device of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

In this specification, ordinal numbers such as first, second, and third are used to avoid confusion among components, and thus do not limit the components numerically.

In this specification, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

In this specification and the like, a transistor is an element having at least three terminals: a gate, a drain, and a source. The transistor has a channel region between the drain (a drain terminal, a drain region, or a drain electrode layer) and the source (a source terminal, a source region, or a source electrode layer), and current can flow through the drain, the channel region, and the source. Note that in this specification and the like, a channel region refers to a region through which current mainly flows.

Functions of a source and a drain are sometimes replaced with each other when a transistor of opposite polarity is used or when the direction of current flowing is changed in circuit operation, for example. Therefore, the terms "source" and "drain" can be replaced with each other in this specification and the like.

In this specification and the like, the term "electrically connected" includes the case where components are connected through an object having any electric function. There is no particular limitation on an object having any electric function as long as electric signals can be transmitted and received between components that are connected through the object. Examples of the object having any electric function include a switching element such as a transistor, a resistor, an inductor, a capacitor, and an element with a variety of functions, as well as an electrode and a wiring.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

(Embodiment 1)

In this embodiment, a semiconductor device of one embodiment of the present invention will be described with reference to FIGS. 1A to 1C, FIGS. 2A to 2C, FIGS. 3A to 3C, FIGS. 4A to 4C, FIGS. 5A to 5C, and FIG. 6. Described in this embodiment are structures and manufacturing methods of an oxide semiconductor film having conductivity and a conductive film in contact with the oxide semiconductor film having conductivity. Note that here, the oxide semiconductor film having conductivity serves as an electrode or a wiring.

Figure 1B:
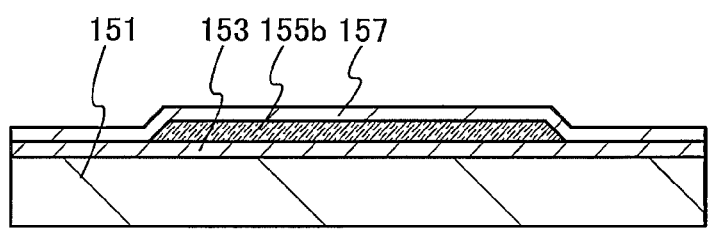
Figure 1C:
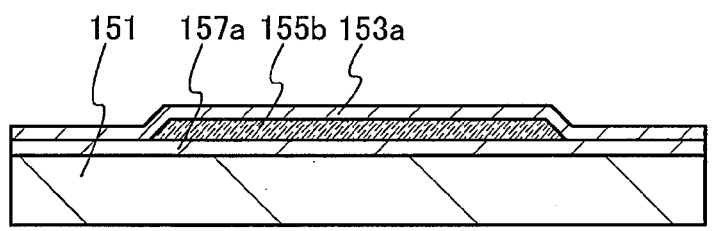

FIGS. 1A to 1C are cross-sectional views of the oxide semiconductor film having conductivity included in the semiconductor device.

In FIG. 1A, an insulating film 153 is formed over a substrate 151, and an oxide semiconductor film 155b having conductivity is formed over the insulating film 153.

As illustrated in FIG. 1B, an insulating film 157 may be formed over the insulating film 153 and the oxide semiconductor film 155b having conductivity.

As illustrated in FIG. 1C, the oxide semiconductor film 155b having conductivity may be formed over an insulating film 157a. In that case, an insulating film 153a can be formed over the oxide semiconductor film 155b having conductivity.

The oxide semiconductor film 155b having conductivity is typically formed using a metal oxide film such as an In—Ga oxide film, an In—Zn oxide film, or an In-M-Zn oxide film (M is Al, Ga, Y, Zr, Sn, La, Ce, or Nd). Note that the oxide semiconductor film 155b having conductivity transmits light.

Note that in the case where the oxide semiconductor film 155b having conductivity is an In-M-Zn oxide film, the proportions of In and M when summation of In and M is assumed to be 100 atomic % are preferably as follows: the proportion of In is greater than 25 atomic % and the proportion of M is less than 75 atomic %, and more preferably, the proportion of In is greater than 34 atomic % and the proportion of M is less than 66 atomic %.

The energy gap of the oxide semiconductor film 155b having conductivity is 2 eV or more, preferably 2.5 eV or more, and more preferably 3 eV or more.

The thickness of the oxide semiconductor film 155b having conductivity is greater than or equal to 3 nm and less than or equal to 200 nm, preferably greater than or equal to 3 nm and less than or equal to 100 nm, and more preferably greater than or equal to 3 nm and less than or equal to 50 nm.

In the case where the oxide semiconductor film 155b having conductivity is an In-M-Zn oxide film (M represents Al, Ga, Y, Zr, Sn, La, Ce, or Nd), the atomic ratio of metal elements of a sputtering target used for forming the In-M-Zn oxide film preferably satisfies In ≥M and Zn≥M. Examples of the atomic ratio of metal elements of such a sputtering target preferably include In:M:Zn=1:1:1, In:M:Zn=1:1:1.2, In:M:Zn=2:1:1.5, In:M:Zn=2:1:2.3, In:M:Zn=2:1:3, and In:M:Zn=3:1:2. Note that the atomic ratios of metal elements in the oxide semiconductor film 155b having conductivity vary from the above atomic ratio of metal elements of the sputtering target within a range of ±40% as an error.

The oxide semiconductor film 155b having conductivity may have, for example, a non-single-crystal structure. The non-single crystal structure includes, for example, a c-axis aligned crystalline oxide semiconductor (CAAC-OS) that is described later, a polycrystalline structure, a microcrystalline structure described later, or an amorphous structure. Among the non-single crystal structure, the amorphous structure has the highest density of defect levels, whereas CAAC-OS has the lowest density of defect levels.

Note that the oxide semiconductor film 155b having conductivity may be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film sometimes has a stacked-layer structure of two or more of a region having an amorphous structure, a region having a microcrystalline structure, a region having a polycrystalline structure, a CAAC-OS region, and a region having a single-crystal structure.

The insulating film 157 and the insulating film 157a are preferably formed using a film containing hydrogen, typically, a silicon nitride film containing hydrogen. When the insulating film 157 and the insulating film 157a which are in contact with the oxide semiconductor film contain hydrogen, the hydrogen is supplied to the oxide semiconductor film, whereby the oxide semiconductor film 155b having conductivity can be formed.

The oxide semiconductor film 155b having conductivity includes impurities. An example of the impurities contained in the oxide semiconductor film 155b having conductivity is hydrogen. Instead of hydrogen, boron, phosphorus, nitrogen, tin, antimony, a rare gas element, alkali metal, alkaline earth metal, or the like may be contained as the impurities.

The concentration of hydrogen in the oxide semiconductor film 155b having conductivity is higher than or equal to $8 \times 10^{19}$ atoms/cm$^3$, preferably higher than or equal to $1 \times 10^{20}$ atoms/cm$^3$, and more preferably higher than or equal to $5 \times 10^{20}$ atoms/cm$^3$.

The oxide semiconductor film 155b having conductivity includes defects and impurities, thereby having conductivity. The resistivity of the oxide semiconductor film 155b having conductivity is preferably greater than or equal to $1\times10^{-3}$ $\Omega$ cm and less than $1\times10^{4}$ $\Omega$ cm, more preferably greater than or equal to $1\times10^{-3}$ $\Omega$ cm and less than $1\times10^{-2}$ $\Omega$ cm.

The conductivity of the oxide semiconductor film 155b having conductivity is typically greater than or equal to $1\times10^{-2}$ S/m and less than or equal to $1\times10^{5}$ S/m, or may be greater than or equal to $1\times10^{3}$ S/m and less than or equal to $1\times10^{5}$ S/m.

The oxide semiconductor film 155b having conductivity includes defects as well as impurities. The defects in the oxide semiconductor film 155b having conductivity are typically formed by release of oxygen by heat treatment in a vacuum atmosphere. Alternatively, the defects are formed by addition of a rare gas. Further alternatively, the defects are formed when the insulating film 153a or 157 is exposed to plasma in a deposition process.

When hydrogen enters oxygen vacant sites in an oxide semiconductor, a donor level is formed in the vicinity of the conduction band. As a result, the oxide semiconductor becomes conductive and the conductivity thereof increases. An oxide semiconductor that has become a conductor can be referred to as an oxide conductor. The oxide semiconductor generally has a light-transmitting property because of its large energy gap. The oxide semiconductor becomes conductive while maintaining its large energy gap; therefore, the oxide conductor has a light-transmitting property.

The substrate 151 can be a variety of substrates and is not limited to a certain type of substrate. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include a barium borosilicate glass substrate, an aluminoborosilicate glass substrate, and a soda lime glass substrate. Examples of the flexible substrate, the attachment film, the base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyester; polyamide; polyimide; aramid; epoxy; an inorganic vapor deposition film; and paper. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Alternatively, a flexible substrate may be used as the substrate 151, and the transistor may be provided directly on the flexible substrate. Further alternatively, a separation layer may be provided between the substrate 151 and the transistor. The separation layer can be used when part or the whole of a semiconductor device formed over the separation layer is separated from the substrate 151 and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. With the use of such a substrate, a transistor with excellent properties or a transistor with low power consumption can be formed, a device with high durability and high heat resistance can be provided, or a reduction in weight or thickness can be achieved.

The insulating films 153 and 153a may be formed to have a single-layer structure or a layered structure using an oxide insulating film including, for example, silicon oxide, silicon oxynitride, aluminum oxide, hafnium oxide, gallium oxide, and a Ga—Zn-based metal oxide. Note that in this specification, a silicon oxynitride film refers to a film that contains more oxygen than nitrogen, and a silicon nitride oxide film refers to a film that contains more nitrogen than oxygen.

The insulating films 157 and 157a can be formed using a nitride insulating film containing silicon nitride, silicon nitride oxide, aluminum nitride, aluminum nitride oxide, or the like.

<Method 1 for Manufacturing the Oxide Semiconductor Film 155b Having Conductivity>

First, a method for manufacturing the oxide semiconductor film 155b having conductivity illustrated in FIG. 1A will be described with reference to FIGS. 2A to 2C.

First, the substrate 151 is prepared. Here, a glass substrate is used as the substrate 151.

Figure 2A:
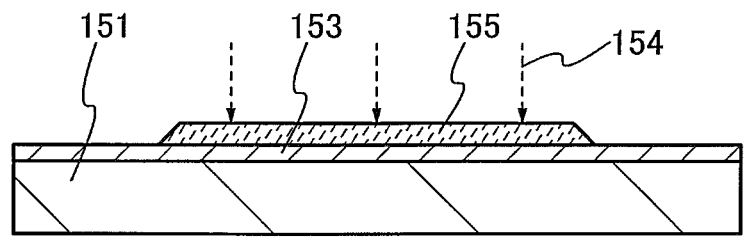
FIGS. 2A to 2C are cross-sectional views illustrating one mode of a method for manufacturing the semiconductor device of the present invention.

As illustrated in FIG. 2A, the insulating film 153 is formed over the substrate 151 and the oxide semiconductor film 155 is formed over the insulating film 153. Then, a rare gas 154 such as helium, neon, argon, krypton, or xenon is added to the oxide semiconductor film 155.

The insulating film 153 can be formed by a sputtering method, a CVD method, a vacuum evaporation method, a pulsed laser deposition (PLD) method, a thermal CVD method, or the like.

A method for forming the oxide semiconductor film 155 will be described below.

An oxide semiconductor film is formed by a sputtering method, a coating method, a pulsed laser deposition method, a laser ablation method, a thermal CVD method, or the like. Then, after a mask is formed over the oxide semiconductor film by a photolithography process, the oxide semiconductor film is etched using the mask. As a result, the oxide semiconductor film 155 can be formed.

As a sputtering gas, a rare gas (typically argon), an oxygen gas, or a mixed gas of a rare gas and an oxygen gas is used as appropriate. In the case where the mixed gas of a rare gas and an oxygen gas is used, the proportion of oxygen to the rare gas is preferably increased.

Furthermore, a target may be appropriately selected in accordance with the composition of the oxide semiconductor film to be formed.

For example, in the case where the oxide semiconductor film is formed by a sputtering method, the substrate temperature is set to higher than or equal to 150° C. and lower than or equal to 750° C., preferably higher than or equal to 150° C. and lower than or equal to 450° C., and more preferably higher than or equal to 200° C. and lower than or equal to 350° C., whereby the oxide semiconductor film can be a CAAC-OS film.

For the deposition of the CAAC-OS film, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) that exist in a deposition chamber may be reduced. Furthermore, the concentration of impurities in a deposition gas may be reduced. Specifically, a deposition gas whose dew point is −80° C. or lower, preferably −100° C. or lower is used.

In the case where an oxide semiconductor film, e.g., an In—Ga—Zn—O film is formed using a deposition apparatus employing atomic layer deposition (ALD), an $In(CH_3)_3$ gas and an $O_3$ gas are sequentially introduced two or more times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. Furthermore, a $Zn(CH_3)_2$ gas may be used.

After that, hydrogen, water, and the like may be released from the oxide semiconductor film 155 by heat treatment to decrease the hydrogen concentration and water concentration in the oxide semiconductor films 155. The heat treatment also allows oxygen to be released from the oxide semiconductor film 155, so that defects can be made, thereby reducing variations in hydrogen concentration in the oxide semiconductor film 155b formed later. The heat treatment is performed typically at a temperature higher than or equal to 250° C. and lower than or equal to 650° C., preferably higher than or equal to 300° C. and lower than or equal to 500° C. When the heat treatment is performed typically at a temperature higher than or equal to 300° C. and lower than or equal to 400° C., preferably higher than or equal to 320° C. and lower than or equal to 370° C., warp or shrinking of a large-sized substrate can be reduced to improve yield.

An electric furnace, an RTA apparatus, or the like can be used for the heat treatment. With the use of an RTA apparatus, the heat treatment can be performed at a temperature higher than or equal to the strain point of the substrate if the heating time is short. This leads to shortening of the heat treatment time and reduces warp of the substrate during the heat treatment, which is particularly advantageous to a large-sized substrate.

The heat treatment may be performed in an atmosphere of nitrogen, oxygen, ultra-dry air (air with a water content of 20 ppm or less, preferably 1 ppm or less, and more preferably 10 ppb or less), or a rare gas (argon, helium, or the like). The atmosphere of nitrogen, oxygen, ultra-dry air, or a rare gas preferably does not contain hydrogen, water, and the like.

As the rare gas 154, helium, neon, argon, xenon, krypton, or the like can be used as appropriate. The rare gas 154 is added to the oxide semiconductor film 155 by a doping method, an ion implantation method, or the like. Alternatively, the oxide semiconductor film 155 may be exposed to plasma containing the rare gas 154, so that the rare gas 154 can be added to the oxide semiconductor film 155.

Figure 2B:
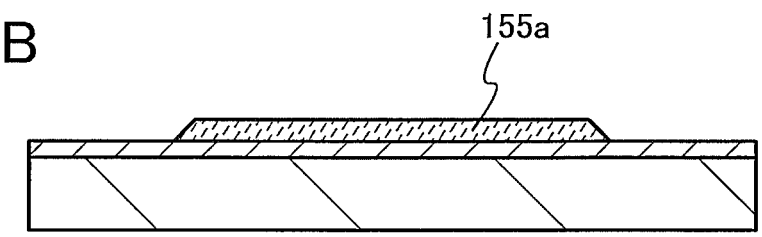

As a result, an oxide semiconductor film 155a including defects can be formed as illustrated in FIG. 2B.

Next, the oxide semiconductor film 155a including defects is heated in an atmosphere containing impurities. An example of the atmosphere containing impurities is an atmosphere containing at least one of hydrogen, nitrogen, water vapor, and the like.

Alternatively, a surface of the oxide semiconductor film 155a including defects is exposed to a solution containing boron, phosphorus, an alkali metal, or an alkaline earth metal, and then heat treatment is performed.

The heat treatment is preferably performed in such a condition as to supply impurities to the oxide semiconductor film, and typically performed at a temperature higher than or equal to 250° C. and lower than or equal to 350° C. When the heat treatment is performed at a temperature lower than or equal to 350° C., impurities can be supplied to the oxide semiconductor film while release of impurities from the oxide semiconductor film is minimized. Note that the heat treatment is performed in an atmosphere with a pressure greater than or equal to 0.1 Pa, preferably greater than or equal to 0.1 Pa and less than or equal to 101325 Pa, and more preferably greater than or equal to 1 Pa and less than or equal to 133 Pa.

Figure 2C:
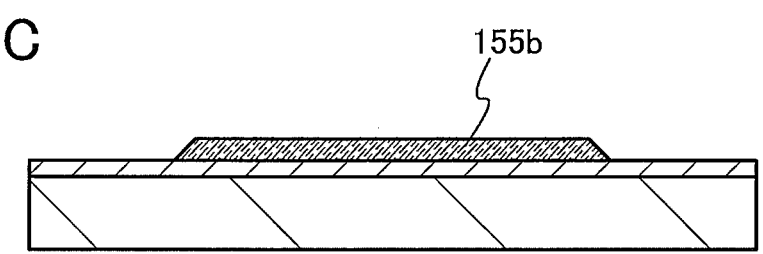

As a result, the oxide semiconductor film 155b having conductivity can be formed as illustrated in FIG. 2C. The oxide semiconductor film 155b having conductivity includes defects and impurities, and has therefore a higher conductivity than the oxide semiconductor film 155 because of the effect of the defects and impurities. As an example of the effect of the defects and impurities, hydrogen enters oxygen vacancies to produce electrons serving as carriers. As another example, part of hydrogen is bonded to oxygen bonded to a metal atom to produce electrons serving as carriers. These effects increase the conductivity of the oxide semiconductor film. As a result, the oxide semiconductor film 155b having conductivity functions as an electrode or a wiring. Furthermore, the oxide semiconductor film 155b having conductivity transmits light, so that a light-transmitting electrode or wiring can be obtained.

Through the above steps, the oxide semiconductor film having conductivity can be formed.

<Method 2 for Manufacturing the Oxide Semiconductor Film 155b Having Conductivity>

A method for manufacturing the oxide semiconductor film 155b having conductivity, which is different from that illustrated in FIGS. 2A to 2C, will be described with reference to FIGS. 3A to 3C.

Figure 3A:
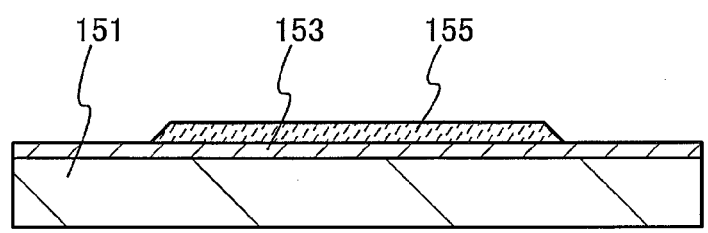
FIGS. 3A to 3C are cross-sectional views illustrating one mode of a method for manufacturing the semiconductor device of the present invention.
Figure 3B:
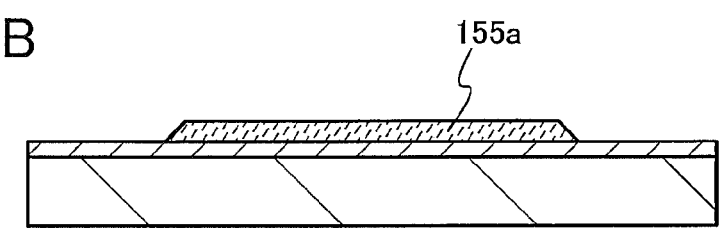

As illustrated in FIG. 3A, the insulating film 153 is formed over the substrate 151 and the oxide semiconductor film 155 is formed over the insulating film 153. Then, heat treatment is performed in a vacuum atmosphere. When the heat treatment is performed in a vacuum atmosphere, oxygen is released from the oxide semiconductor film 155, so that the oxide semiconductor film 155a including defects can be formed as illustrated in FIG. 3B. Note that an oxygen vacancy is a typical example of the defects contained in the oxide semiconductor film 155a illustrated in FIG. 3B.

The heat treatment is preferably performed in such a condition that oxygen is released from the oxide semiconductor film, and typically performed at a temperature higher than or equal to 350° C. and lower than or equal to 800° C., preferably higher than or equal to 450° C. and lower than or equal to 800° C. When the heat treatment is performed at a temperature higher than or equal to 350° C., oxygen is released from the oxide semiconductor film. In contrast, when the heat treatment is performed at a temperature lower than or equal to 800° C., oxygen can be released from the oxide semiconductor film while the crystal structure in the oxide semiconductor film is maintained. In addition, the heat treatment is preferably performed in a vacuum atmosphere, typically in an atmosphere with a pressure greater than or equal to $1\times10^{-7}$ Pa and less than or equal to 10 Pa, preferably greater than or equal to $1\times10^{-7}$ Pa and less than or equal to 1 Pa, and more preferably greater than or equal to $1\times10^{-7}$ Pa and less than or equal to $1\times10^{-1}$ Pa.

Then, the oxide semiconductor film 155a including defects is heated in an atmosphere containing impurities by a method similar to that in FIG. 2B. An example of the atmosphere containing impurities is an atmosphere containing at least one of hydrogen, nitrogen, water vapor, and the like.

Alternatively, a surface of the oxide semiconductor film 155a including defects is exposed to a solution containing boron, phosphorus, an alkali metal, or an alkaline earth metal, and then heat treatment is performed.

Figure 3C:
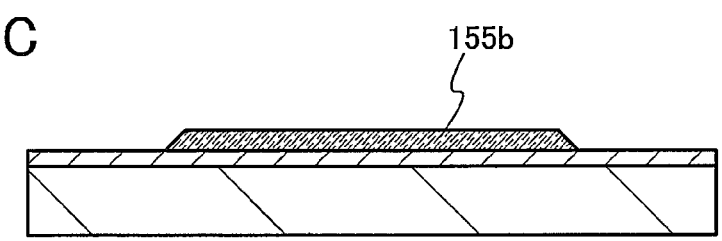

As a result, the oxide semiconductor film 155b having conductivity can be formed as illustrated in FIG. 3C.

<Method 3 for Manufacturing the Oxide Semiconductor Film 155b Having Conductivity>

A method for manufacturing the oxide semiconductor film 155b having conductivity, which is different from the methods illustrated in FIGS. 2A to 2C and FIGS. 3A to 3C, will be described with reference to FIGS. 4A to 4C.

Figure 4A:
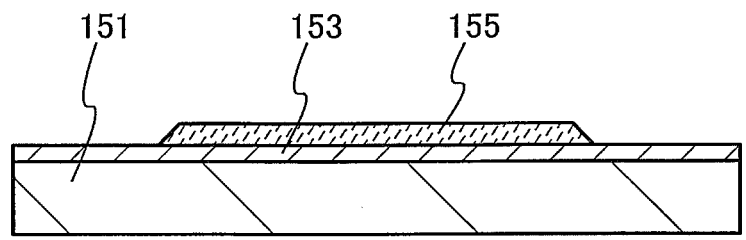
FIGS. 4A to 4C are cross-sectional views illustrating one mode of a method for manufacturing the semiconductor device of the present invention.

As illustrated in FIG. 4A, the insulating film 153 is formed over the substrate 151 and the oxide semiconductor film 155 is formed over the insulating film 153.

Figure 4B:
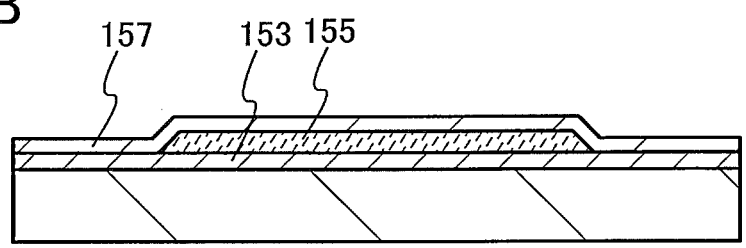
Figure 4C:
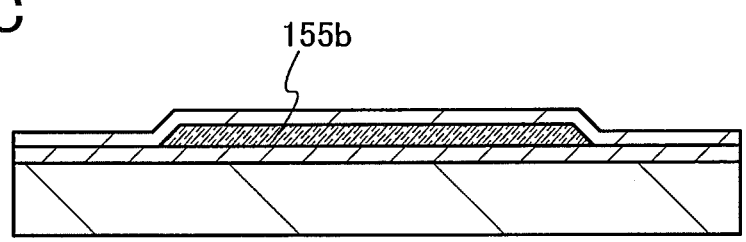

Then, as illustrated in FIG. 4B, the insulating film 157 containing hydrogen is formed over the insulating film 153 and the oxide semiconductor film 155. The insulating film 157 is formed by a sputtering method, a plasma CVD method, or the like. The insulating film 157 may be formed while heated. Alternatively, heat treatment may be performed after the insulating film 157 is formed.

When the insulating film 157 is formed by a sputtering method, a plasma CVD method, or the like, the oxide semiconductor film 155 is damaged and defects are made therein. In addition, hydrogen contained in the insulating film 157 is transferred to the oxide semiconductor film 155. As a result, the oxide semiconductor film 155b having conductivity can be formed as illustrated in FIG. 4C. The oxide semiconductor film 155b having conductivity has a higher conductivity than the oxide semiconductor film 155 because of the effect of the defects and impurities, and therefore functions as an electrode or a wiring.

Modification Example 1

The oxide semiconductor film 155b having conductivity shown in this embodiment has resistivity higher than that of a conductive film formed using a metal film. Hence, the oxide semiconductor film 155b having conductivity is preferably in contact with a conductive film formed using a metal film as a lead wiring. Such a structure will be described with reference to FIGS. 5A to 5C.

Figure 5A:
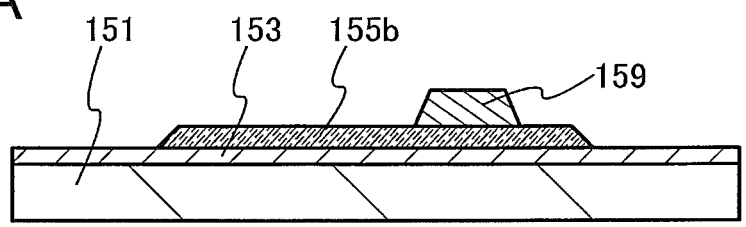
FIGS. 5A to 5C are cross-sectional views illustrating modes of the semiconductor device of the present invention.

FIG. 5A is a cross-sectional view of an oxide semiconductor film having conductivity and a conductive film in contact with the oxide semiconductor film.

In FIG. 5A, the insulating film 153 is formed over the substrate 151, and the oxide semiconductor film 155b having conductivity is formed over the insulating film 153. A conductive film 159 is formed over the oxide semiconductor film 155b having conductivity.

Figure 5B:
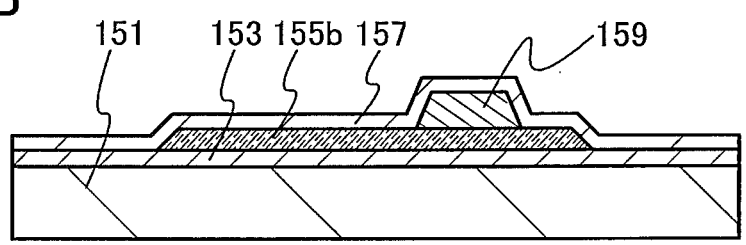

As illustrated in FIG. 5B, the insulating film 157 may be formed over the insulating film 153, the oxide semiconductor film 155b having conductivity, and the conductive film 159.

Figure 5C:
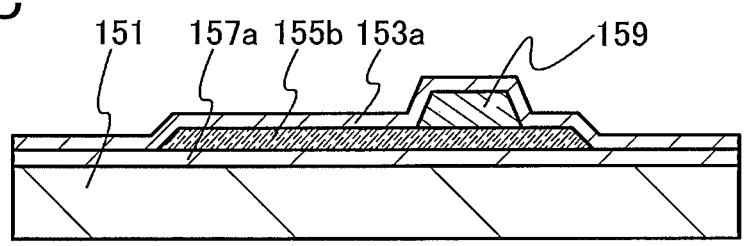

As illustrated in FIG. 5C, the oxide semiconductor film 155b having conductivity may be formed over the insulating film 157a. In that case, the insulating film 153a can be formed over the oxide semiconductor film 155b having conductivity and the conductive film 159.

The conductive film 159 is formed to have a single-layer structure or a stacked-layer structure including any of metals such as aluminum, titanium, chromium, nickel, copper, yttrium, zirconium, molybdenum, iron, cobalt, silver, tantalum, and tungsten and an alloy containing any of these metals as its main component. Examples of the structure include a single-layer structure of an aluminum film containing silicon, a single-layer structure of a copper film containing manganese, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a two-layer structure in which a copper film is stacked over a copper film containing manganese, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and a three-layer structure in which a copper film containing manganese, a copper film, and a copper film containing manganese are stacked in this order. Note that a transparent conductive material containing indium oxide, tin oxide, or zinc oxide may be used.

Modification Example 2

Here, a modification example of the oxide semiconductor film having conductivity and the conductive film will be described with reference to FIG. 6.

Figure 6:
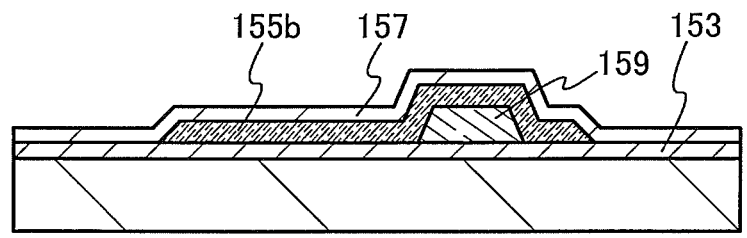
FIG. 6 is a cross-sectional view illustrating one mode of the semiconductor device of the present invention.

As shown in FIG. 6, the conductive film 159 may be provided between the insulating film 153 and the oxide semiconductor film 155b having conductivity.

Note that the conductive film 159 can have any of the structures of the conductive film 159 shown in Modification example 1 of this embodiment.

The structures, methods, and the like shown in this embodiment can be used in appropriate combination with any of the structures, methods, and the like shown in the other embodiments.

(Embodiment 2)

In this embodiment, a resistor including the conductive oxide semiconductor film shown in Embodiment 1 will be described with reference to FIGS. 7A to 7C, FIGS. 8A and 8B, FIGS. 9A and 9B, and FIG. 10.

Figure 7A:
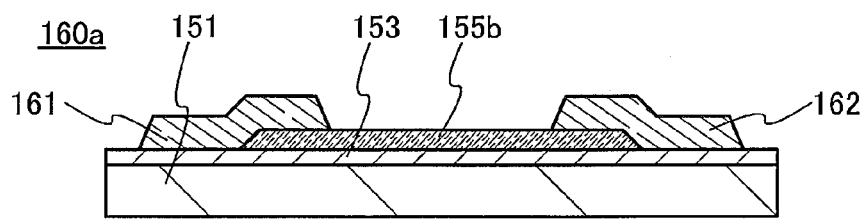
FIGS. 7A to 7C are cross-sectional views illustrating modes of the semiconductor device of the present invention.
Figure 7B:
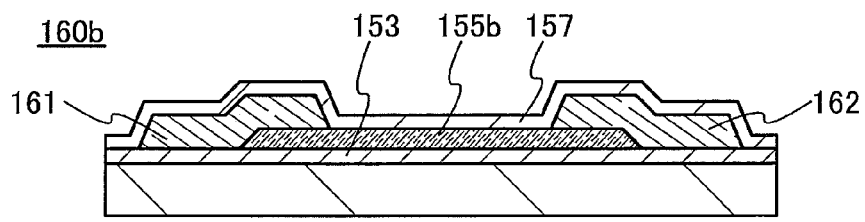
Figure 7C:
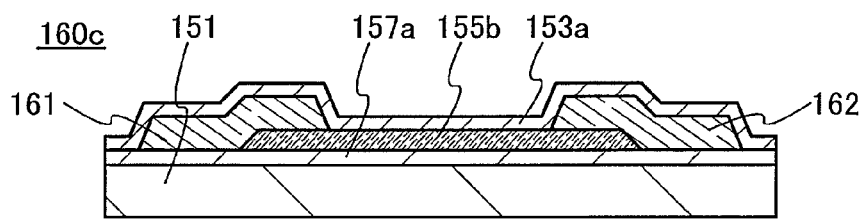

FIGS. 7A to 7C are cross-sectional views of a resistor included in a semiconductor device.

A resistor 160a illustrated in FIG. 7A includes the oxide semiconductor film 155b having conductivity, and a pair of conductive films 161 and 162 which are in contact with the oxide semiconductor film 155b having conductivity. The oxide semiconductor film 155b having conductivity and the pair of conductive films 161 and 162 are provided over the insulating film 153 formed over the substrate 151.

The pair of conductive films 161 and 162 may be a single layer or two or more stacked layers. The pair of conductive films 161 and 162 can be formed using a structure, materials, and a method similar to those of the conductive film 159 shown in Embodiment 1.

As in a resistor 160b illustrated in FIG. 7B, the insulating film 157 containing hydrogen may be formed over the insulating film 153, the oxide semiconductor film 155b having conductivity, and the pair of conductive films 161 and 162.

As in a resistor 160c illustrated in FIG. 7C, the oxide semiconductor film 155b having conductivity, and the pair of conductive films 161 and 162 may be formed over the insulating film 157a containing hydrogen. In that case, the insulating film 153a can be provided over the oxide semiconductor film 155b having conductivity and the pair of conductive films 161 and 162.

The oxide semiconductor film 155b having conductivity has resistivity higher than that of the pair of conductive films 161 and 162. Accordingly, a function as a resistor is achieved when the oxide semiconductor film 155b having conductivity is provided between the pair of conductive films 161 and 162.

The oxide semiconductor film 155b having conductivity includes defects and impurities. The effect of the defects and impurities increases the conductivity of the oxide semiconductor film 155b having conductivity. In addition, the oxide semiconductor film 155b having conductivity transmits light. As a result, a light-transmitting resistor is obtained.

<Circuit Diagram of Protection Circuit>

Here, a protection circuit using the resistor shown in this embodiment will be described with reference to FIGS. 8A and 8B. Although a display device is used as a semiconductor device in the following description, the protection circuit can also be employed in other semiconductor devices.

Figure 8A:
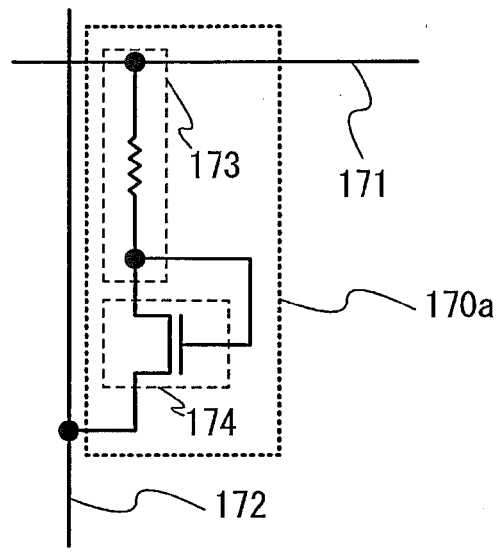
FIGS. 8A and 8B are circuit diagrams illustrating modes of the semiconductor device of the present invention.

FIG. 8A illustrates a specific example of a protection circuit 170a included in the semiconductor device.

The protection circuit 170a illustrated in FIG. 8A includes a resistor 173 and a diode-connected transistor 174 between a wiring 171 and a wiring 172.

The resistor 173 is connected in series to the transistor 174, thereby controlling the value of current flowing through the transistor 174 or functioning as a protective resistor of the transistor 174 itself.

The wiring 171 is, for example, a scan line, a data line, or a wiring led from a terminal portion to a driver circuit portion, which are included in the display device. The wiring 172 is, for example, a wiring that is supplied with a potential (VDD, VSS, or GND) of a power source line for supplying power to a gate driver or a source driver. Alternatively, the wiring 172 is a wiring that is supplied with a common potential (common line).

For example, the wiring 172 is preferably connected to the power source line for supplying power, particularly a low potential power to a scan line driver circuit. This is because a gate signal line has a low potential in most periods, and thus, when the wiring 172 also has a low potential, current leaked from the gate signal line to the wiring 172 can be reduced in normal operation.

Although the resistor 173 is connected in series to the diode-connected transistor in FIG. 8A, one embodiment of the present invention is not to limited to this example, and the resistor 173 can be connected in parallel to the diode-connected transistor.

Figure 8B:
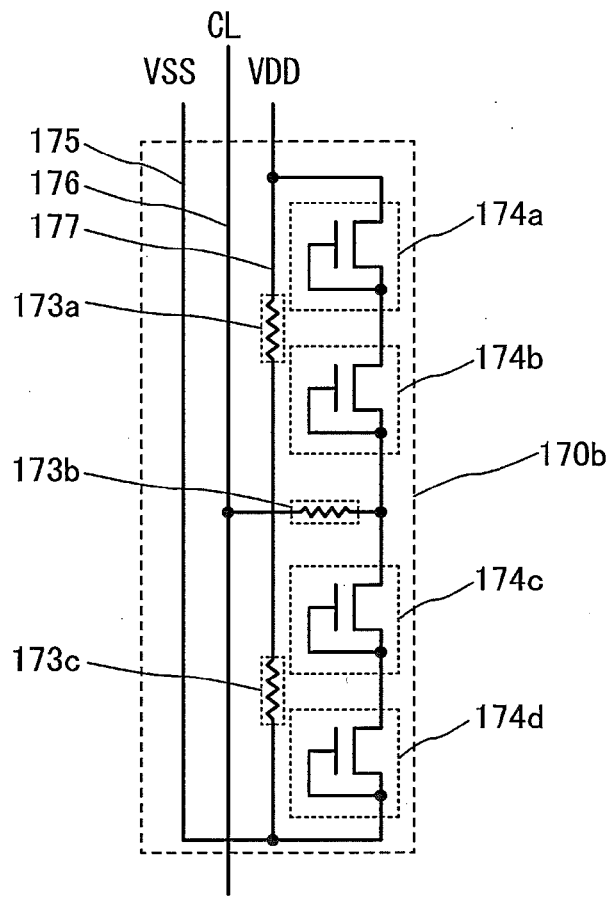

FIG. 8B illustrates a protection circuit including a plurality of transistors and a plurality of resistors.

A protection circuit 170b illustrated in FIG. 8B includes transistors 174a, 174b, 174c, and 174d and resistors 173a, 173b, and 173c. The protection circuit 170b is provided between wirings 175, 176, and 177 which are connected to at least one of a scan line driver circuit, a signal line driver circuit, and a pixel portion included in the display device. A first terminal of the transistor 174a, which serves as a source electrode, is connected to a second terminal thereof serving as a gate electrode, and a third terminal of the transistor 174a, which serves as a drain electrode, is connected to the wiring 177. A first terminal of the transistor 174b, which serves as a source electrode, is connected to a second terminal thereof serving as a gate electrode, and a third terminal of the transistor 174b, which serves as a drain electrode, is connected to the first terminal of the transistor 174a. A first terminal of the transistor 174c, which serves as a source electrode, is connected to a second terminal thereof serving as a gate electrode, and a third terminal of the transistor 174c, which serves as a drain electrode, is connected to the first terminal of the transistor 174b. A first terminal of the transistor 174d, which serves as a source electrode, and a second terminal thereof serving as a gate electrode are connected to the wirings 177 and 175. A third terminal of the transistor 174d, which serves as a drain electrode, is connected to the first terminal of the transistor 174c. The wiring 177 is provided with the resistors 173a and 173c. The resistor 173b is provided between the wiring 176, the first terminal of the transistor 174b, and the third terminal of the transistor 174c.

The wiring 175 can be used, for example, as a power source line supplied with a low power source potential VSS. The wiring 176 can be used as, for example, a common line. The wiring 177 can be used as, for example, a power source line supplied with a high power source potential VDD.

Figure 9A:
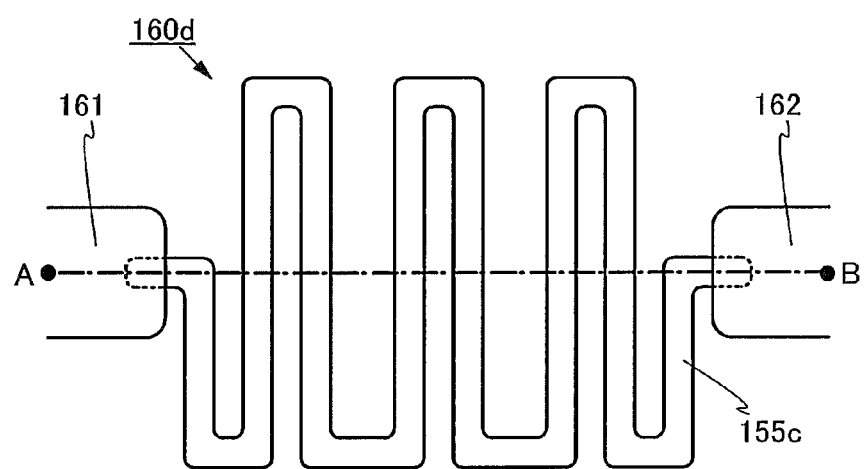
FIGS. 9A and 9B are a top view and a cross-sectional view, respectively, illustrating one mode of the semiconductor device of the present invention.
Figure 9B:
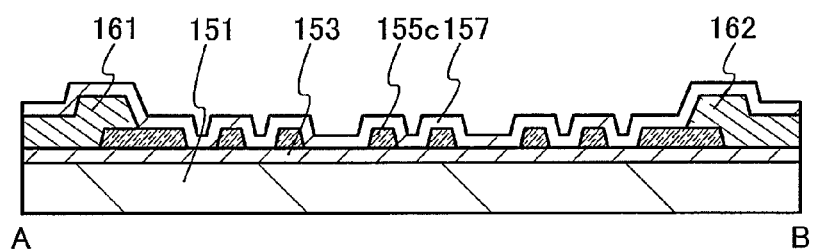

The resistor of this embodiment can be used as the resistors illustrated in FIGS. 8A and 8B. The resistance value of the resistor can be changed by adjusting the shape, specifically the length or the width of the oxide semiconductor film having conductivity included in the resistor. FIGS. 9A and 9B illustrate an example of a resistor 160d. FIG. 9A is a top view of the resistor 160d, and FIG. 9B is a cross-sectional view along dashed-dotted line A-B in FIG. 9A. In the resistor 160d illustrated in FIGS. 9A and 9B, the oxide semiconductor film 155c having conductivity has a zigzag top surface, so that the resistance value of the resistor can be controlled.

As described above, the protection circuit 170b includes the plurality of diode-connected transistors and the plurality of resistors. In other words, in the protection circuit 170b, diode-connected transistors and resistors can be combined in parallel.

With the protection circuit, the semiconductor device can have an enhanced resistance to overcurrent due to electrostatic discharge (ESD). Thus, a semiconductor device with improved reliability can be provided.

Because the resistor is used in the protection circuit and the resistance value of the resistor can be changed as appropriate, the diode-connected transistor or the like used in the protection circuit can also be protected.

The structures shown in this embodiment can be used in appropriate combination with any of the structures shown in the other embodiments.

Modification Example 1

Here, a modification example of the resistor will be described with reference to FIG. 10.

Figure 10:
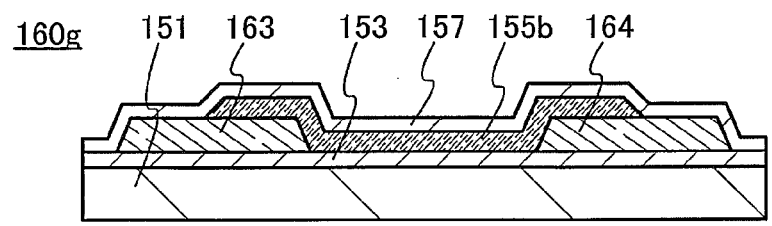
FIG. 10 is a cross-sectional view illustrating one mode of the semiconductor device of the present invention.

A resistor 160g illustrated in FIG. 10 includes a pair of conductive films 163 and 164 between the insulating film 153 and the oxide semiconductor film 155b having conductivity.

The pair of conductive films 163 and 164 can be formed using a structure and materials similar to those of the conductive film 159 shown in Embodiment 1.

The structures, methods, and the like shown in this embodiment can be used in appropriate combination with any of the structures, methods, and the like shown in the other embodiments.

(Embodiment 3)

In this embodiment, a capacitor including the conductive oxide semiconductor film shown in Embodiment 1 will be described with reference to FIGS. 11A and 11B and FIG. 12.

Figure 11A:
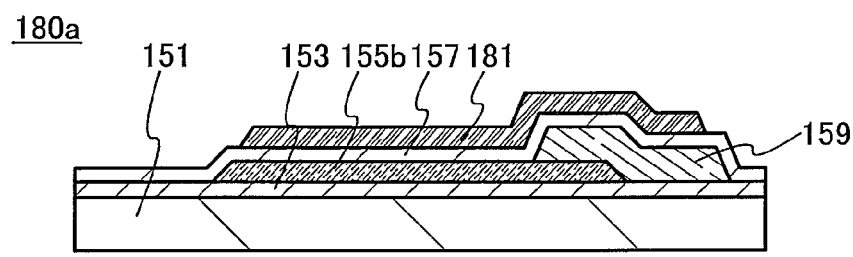
FIGS. 11A and 11B are cross-sectional views illustrating modes of the semiconductor device of the present invention.
Figure 11B:
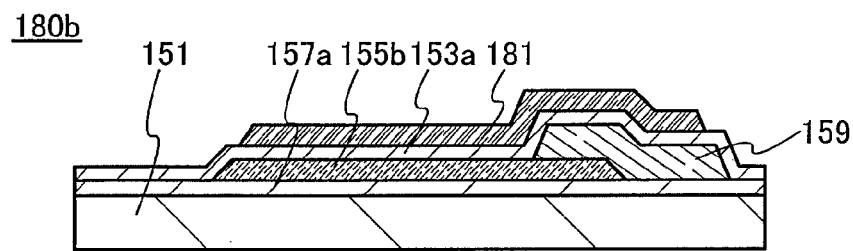

FIGS. 11A and 11B are cross-sectional views of a capacitor included in a semiconductor device.

A capacitor 180a illustrated in FIG. 11A includes the oxide semiconductor film 155b having conductivity, the insulating film 157 in contact with the oxide semiconductor film 155b having conductivity, and a conductive film 181 overlapping with the oxide semiconductor film 155b with the insulating film 157 placed therebetween. In addition, a conductive film serving as a lead wiring may be formed in contact with the oxide semiconductor film 155b having conductivity or the conductive film 181. Here, the conductive film 159 is provided in contact with the oxide semiconductor film 155b having conductivity. Note that the oxide semiconductor film 155b having conductivity, the insulating film 157, and the conductive film 159 are provided over the insulating film 153 formed over the substrate 151.

The conductive film 159 can be formed using a structure, materials, and a method similar to those of the conductive film 159 shown in Embodiment 1.

As in a capacitor 180b illustrated in FIG. 11B, the oxide semiconductor film 155b having conductivity and the conductive film 159 may be formed over the insulating film 157a. In that case, the insulating film 153a can be provided between the oxide semiconductor film 155b having conductivity and the conductive film 181.

The conductive film 181 is formed to have a single-layer structure or a stacked-layer structure including any of metals such as aluminum, titanium, chromium, nickel, copper, yttrium, zirconium, molybdenum, iron, cobalt, silver, tantalum, and tungsten and an alloy containing any of these metals as its main component. Examples of the structure include a single-layer structure of an aluminum film containing silicon, a single-layer structure of a copper film containing manganese, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a two-layer structure in which a copper film is stacked over a copper film containing manganese, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and a three-layer structure in which a copper film containing manganese, a copper film, and a copper film containing manganese are stacked in this order.

The conductive film 181 can be formed using a structure and materials similar to those of the conductive film 159.

A light-transmitting conductive film can be used as the conductive film 181. The light-transmitting conductive film can be formed using indium oxide including tungsten oxide, indium zinc oxide including tungsten oxide, indium oxide including titanium oxide, indium tin oxide including titanium oxide, indium tin oxide (ITO), indium zinc oxide, indium tin oxide to which silicon oxide is added, or the like.

The oxide semiconductor film 155b having conductivity includes defects and impurities. The effect of the defects and impurities increases the conductivity of the oxide semiconductor film 155b having conductivity. In addition, the oxide semiconductor film 155b having conductivity transmits light. By using the light-transmitting conductive film as the conductive film 181, a light-transmitting capacitor is obtained.

Modification Example 2

Figure 12:
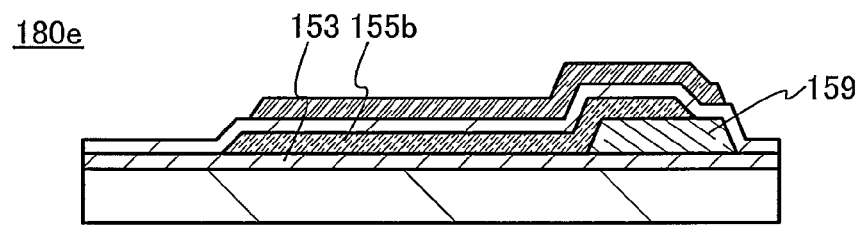
FIG. 12 is a cross-sectional view illustrating one mode of the semiconductor device of the present invention.

A capacitor 180e illustrated in FIG. 12 includes the conductive film 159 between the insulating film 153 and the oxide semiconductor film 155b having conductivity.

The structures, methods, and the like shown in this embodiment can be used in appropriate combination with any of the structures, methods, and the like shown in the other embodiments.

(Embodiment 4)

Described in this embodiment is the behavior of H and OH that are obtained when water (hereinafter referred to as $H_2O$) enters an oxide semiconductor film (hereinafter referred to as IGZO) and $H_2O$ is decomposed into H and OH.

<1. $H_2O$ in IGZO>

First, to measure the effect of $H_2O$ in IGZO, calculation was made of a model in which $H_2O$ was added to IGZO. The specific calculation is as follows.

Figure 13:
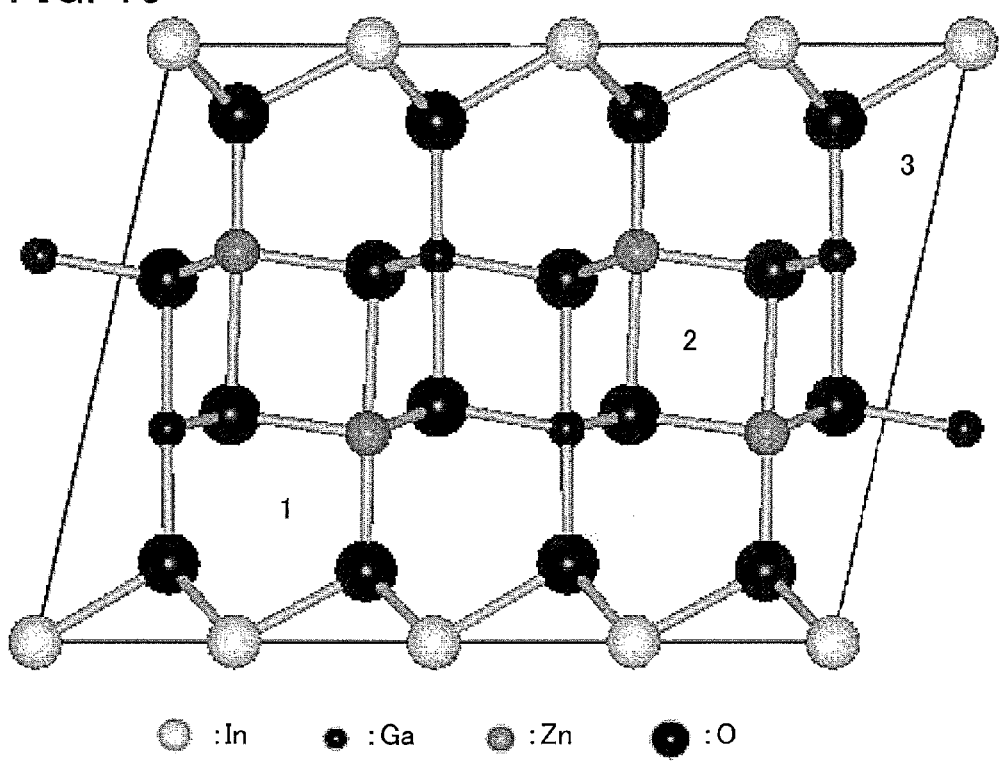
FIG. 13 shows a calculation model.

$H_2O$ molecules were placed in an InGaZnO$_4$ crystal model (112 atoms) and a structure optimization calculation was performed. FIG. 13 shows a calculation model where 1, 2, and 3 represent the initial places of $H_2O$.

Figure 14:
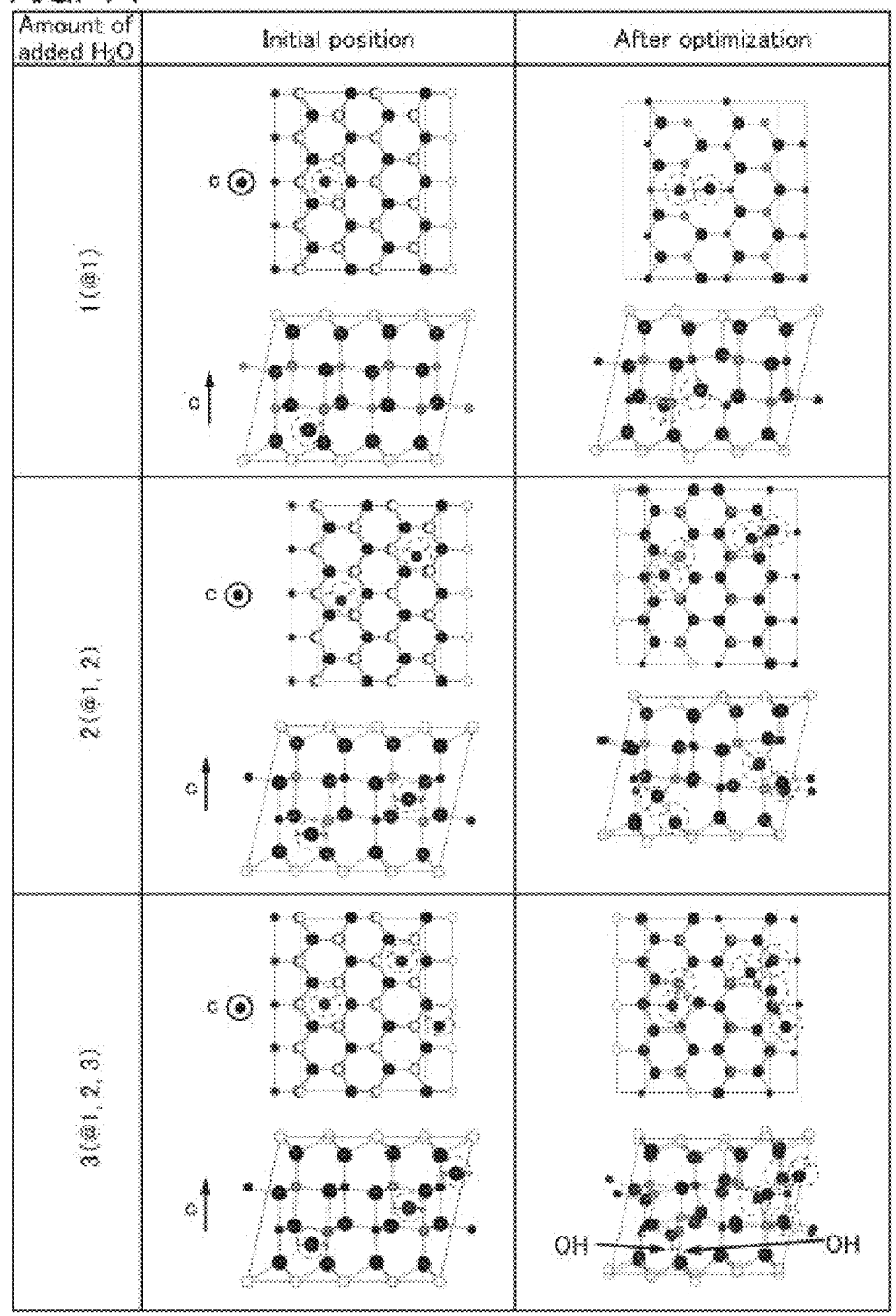
FIG. 14 shows the initial and optimized structures of the model in which $H_2O$ is added.

Table 1 shows the calculation conditions. FIG. 14 shows optimized structures of the model in which $H_2O$ was added.

TABLE 1

| | |
|---|---|
| Software | VASP |
| Model | InGaZnO$_4$ crystal (112 atoms) + $n$H$_2$O (n = 1 to 3) |
| Calculation | Structure optimization (including lattice constant) |
| Functional | GGA/PBE |
| Cut-off energy | 500 eV |
| K points | 2 × 2 × 3 |

In either model, $H_2O$ was decomposed into H and OH. This indicates that $H_2O$ molecules are hard to exist stably in IGZO and are decomposed into H and OH.

Next, H and OH in IGZO will be described.

<2. H in IGZO>

<2-(1). Diffusion of H>

Here, the mobility of hydrogen in an IGZO crystal was measured from the activation barrier along a hydrogen transfer path. Note that the two kinds of movement of hydrogen were assumed: hopping between oxygen atoms; and movement on one oxygen atom.

Figure 15:
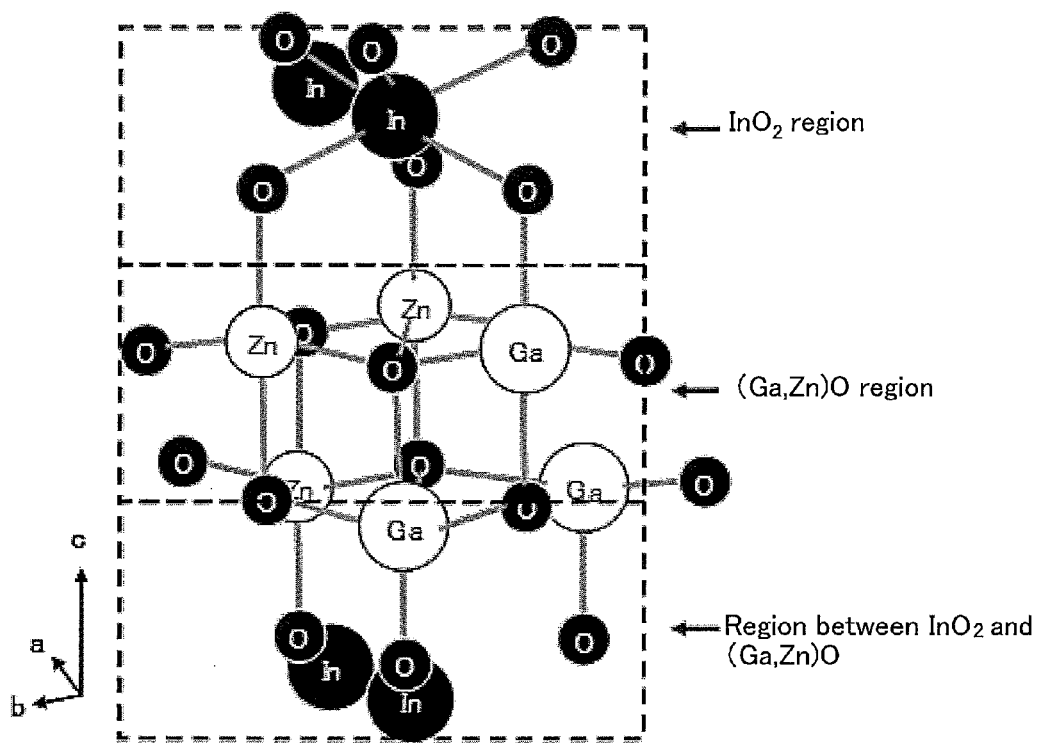
FIG. 15 is a schematic view showing different areas in a c-IGZO crystal.

FIG. 15 is a schematic view showing different areas in a single crystal IGZO (c-IGZO), in each of which the diffusion path of hydrogen was analyzed. The measurement was performed on the path in each of an $InO_2$ region, a (Ga, Zn)O region, and an $InO_2$-(Ga, Zn)O region (a-b plane direction), and the path crossing each region (c-axis direction).

The activation barrier was calculated by the first-principles electron state and molecular dynamics simulation using the Vienna ab initio simulation package (VASP). The nudged elastic band (NEB) method, which is to find a chemical reaction path, was also employed. The NEB method is a technique for determining the minimum energy path between given initial and final states.

<<Intermediate Region Between $InO_2$ Plane and (Ga, Zn)O Plane>>

Figure 16A:
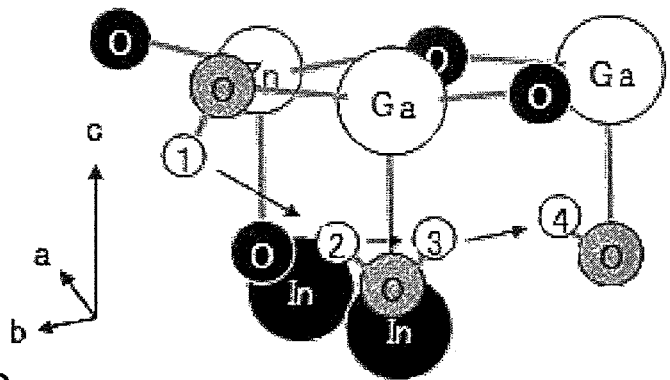
FIGS. 16A to 16D show hydrogen transfer paths in a region between an $InO_2$ plane and a (Ga, Zn)O plane, and activation barriers along the paths.
Figure 16B:
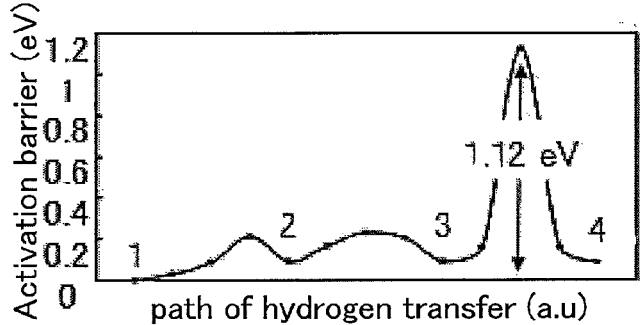
Figure 16C:
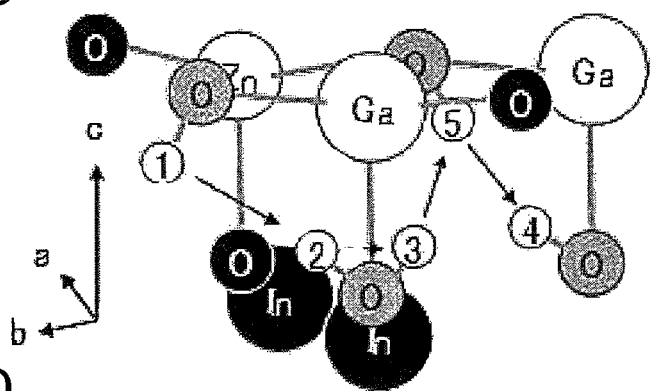

FIGS. 16A to 16D show hydrogen transfer paths in the region between the $InO_2$ plane and the (Ga, Zn)O plane, and activation barriers along the paths. Note that an energy of the most stable structure on the path was taken as the origin of energy. FIGS. 16A and 16C show the hydrogen transfer paths which are referred to as a path A and a path B, respectively. Note that numbers in FIGS. 16A to 16D represent the order of transfer of hydrogen. On the path A, hydrogen transfers from 3 to 4 directly, whereas on the path B, hydrogen transfers from 3 to 4 via 5.

Figure 16D:
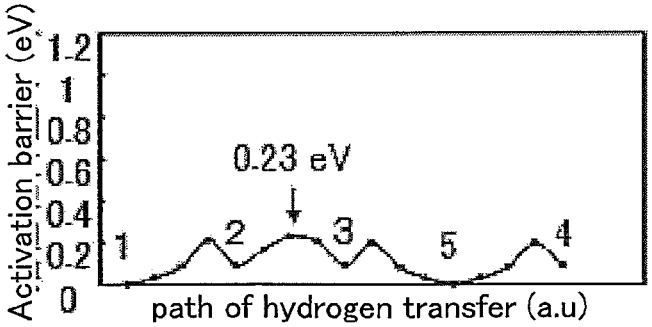

FIG. 16B shows the calculation results of the activation barrier along the path A where hydrogen transfers from 1 to 4, and FIG. 16D shows the calculation results of the activation barrier along the path B where hydrogen transfers from 1 to 4 via 5.

The activation barrier shown in FIG. 16D is lower than that shown in FIG. 16B. Therefore, when hydrogen transfers from 3 to 4, the path B with a lower activation barrier is probably taken. In other words, when hydrogen transfers in the region between the $InO_2$ plane and the (Ga, Zn)O plane, the path B with a lower activation barrier will be taken.

<<(Ga, Zn)O Region>>

Figure 17A:
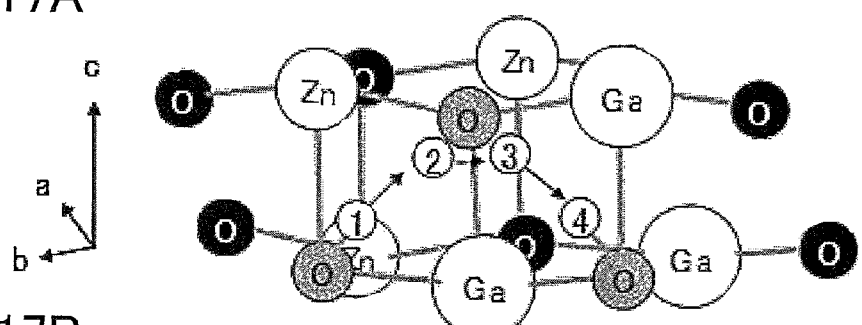
FIGS. 17A and 17B show a hydrogen transfer path in the (Ga, Zn)O region and the activation barrier along the path, respectively.
Figure 17B:
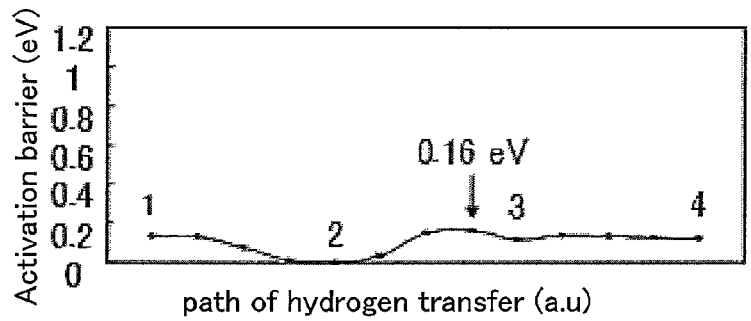

Next, a hydrogen transfer path in the (Ga, Zn)O region and the activation barrier along the path are shown in FIGS. 17A and 17B. Note that an energy of the most stable structure on the path was taken as the origin of energy. FIG. 17A shows the hydrogen transfer path in the (Ga, Zn)O region. The numbers in FIG. 17A represent the order of transfer of hydrogen. FIG. 17B shows the calculation results of the activation barrier along the path where hydrogen transfers from 1 to 4 in FIG. 17A.

FIG. 17B shows that the hydrogen path in the (Ga, Zn)O region has a low activation barrier of approximately 0.16 eV. Given only the height of the barrier, hydrogen will be more likely to transfer in the (Ga, Zn)O region than in the region between the $InO_2$ plane and the (Ga, Zn)O plane.

<<$InO_2$ Region>>

Figure 18A:
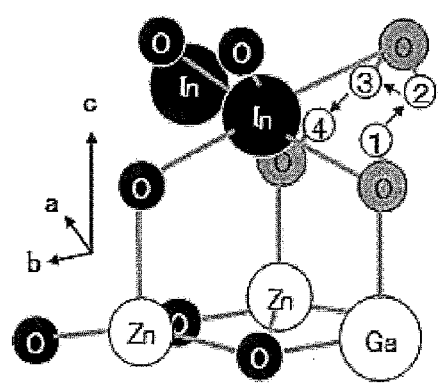
FIGS. 18A and 18B show a hydrogen transfer path in the $InO_2$ region and the activation barrier along the path, respectively.
Figure 18B:
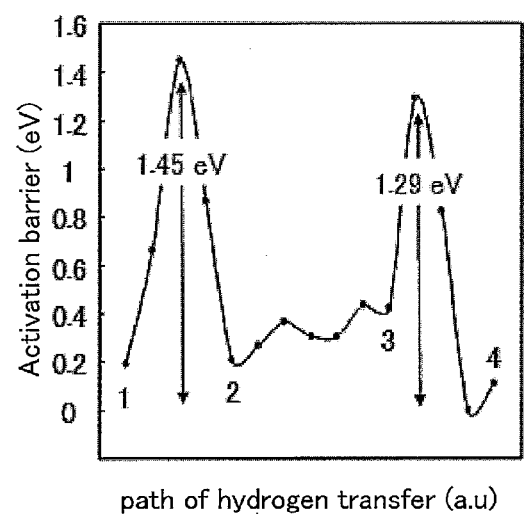

Next, a hydrogen transfer path in the $InO_2$ region and the activation barrier along the path are shown in FIGS. 18A and 18B. Note that an energy of the most stable structure on the path was taken as the origin of energy. FIG. 18A shows the hydrogen transfer path in the $InO_2$ region. The numbers in FIG. 18A represent the order of transfer of hydrogen. FIG. 18B shows the calculation results of the activation barrier along the path where hydrogen transfers from 1 to 4.

FIGS. 18A and 18B show that the activation barrier of the path in the $InO_2$ region is much higher than that in the other regions. Accordingly, hydrogen will be less likely to transfer in the $InO_2$ region than in the other regions.

FIGS. 19A and 19B show a hydrogen transfer path in the c-axis direction and the activation barrier along the path. Note that an energy of the most stable structure on the path was taken as the origin of energy. FIG. 19A shows the hydrogen transfer path in the c-axis direction. The numbers in FIG. 19A represent the order of transfer of hydrogen. FIG. 19B shows the calculation results of the activation barrier along the path where hydrogen transfers from 1 to 8.

FIGS. 19A and 19B show that a high activation barrier exists on the way in and out of the (Ga, Zn)O region. This is probably because the hydrogen transfer path blocks M (metal)-O bond. A high activation barrier is found to exist also when hydrogen diffuses in the $InO_2$ region. Hence, hydrogen will be less likely to transfer continuously in the c-axis direction. Note that a cause of the high activation barrier might be a large radius of an In ion.

From the activation barriers obtained by calculation and the following Formula 1, reaction frequency (F) was calculated.

$$\Gamma = \nu \exp\left(-\frac{E_a}{k_B T}\right) \quad \text{[Formula 1]}$$

In the formula, $E_a$ represents the maximum activation barrier along the path; $k_B$, the Boltzmann constant; T, the absolute temperature; and $\nu$, the frequency factor.

Lastly, Table 2 shows the movement frequency that is estimated from the maximum barrier height of each path.

TABLE 2

| Path | | Maximum barrier height (eV) | 450° C. | 27° C. |
|---|---|---|---|---|
| Region between $InO_2$ plane and (Ga, Zn)O plane (a-b plane direction) | A | 1.12 | 1.6E+05 | 1.0E−06 |
| Region between $InO_2$ plane and (Ga, Zn)O plane (a-b plane direction) | B | 0.23 | 2.5E+11 | 1.4E+09 |
| (Ga, Zn)O region (a-b plane direction) | | 0.16 | 7.7E+11 | 2.1E+10 |
| $InO_2$ region (c-axis direction) | | 1.45 | 8.0E+02 | 4.6E−12 |
| Path into (out of) (Ga, Zn)O region (c-axis direction) | | 0.9 | 5.4E+06 | 7.8E−03 |

At temperatures of 27° C. and 450° C., the movement frequency was the highest in the region between the $InO_2$ plane and the (Ga, Zn)O plane and in the (Ga, Zn)O region. In contrast, the movement frequency was likely to be low in the $InO_2$ region (c-axis direction) because of the high activation barrier. This indicates that hydrogen preferentially diffuses along the a-b plane in a complete crystal system. In heat treatment at 450° C., however, hydrogen was found to diffuse in the IGZO film sufficiently.

<2-(2). Site in which an Oxygen Vacancy $V_O$ is Easily Formed>

The strength of bonding between a metal and oxygen differs depending on the kind or valence of the metal; therefore, the ease of formation of an oxygen vacancy $V_O$ in IGZO is probably determined by the kind, number, distance, or the like of metals bonded to oxygen. The ease of formation of an oxygen vacancy in an $InGaZnO_4$ crystal model was calculated.

Figure 20:
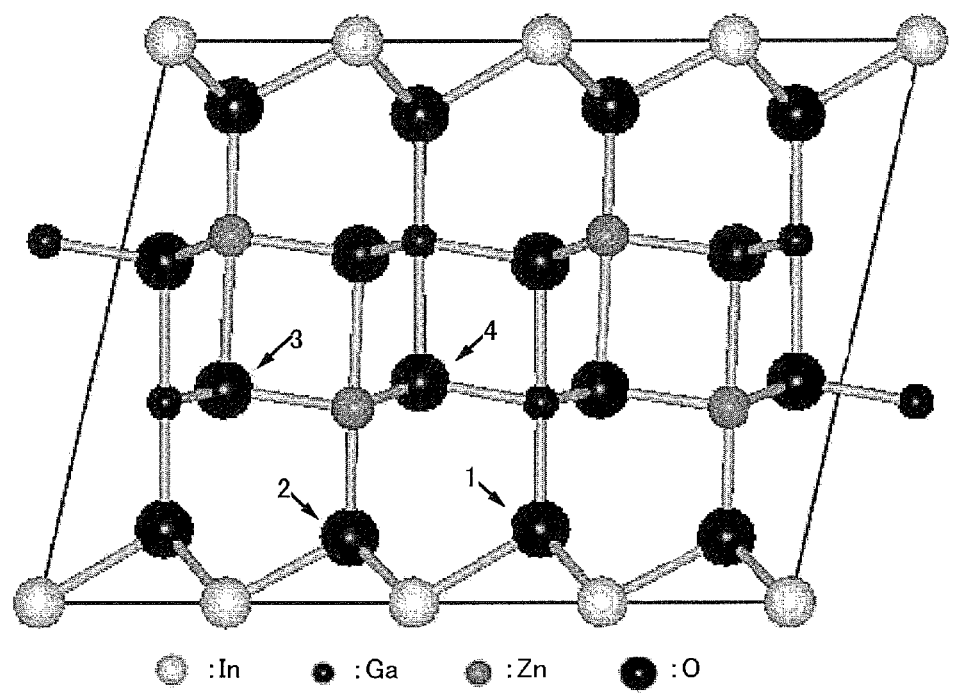
FIG. 20 shows a calculation model.

The model used for calculation is an $InGaZnO_4$ crystal model (112 atoms) shown in FIG. 20. In a (Ga, Zn)O region, Ga and Zn were placed so as to be energetically stable. In that case, there are four kinds of oxygen sites (1 to 4 in FIG. 20) depending on the kind and number of metals bonded to oxygen. Table 3 shows the four oxygen sites.

TABLE 3

| Oxygen site | | Bonding partner |
|---|---|---|
| $InO_2$ layer | 1 | In × 3, Ga × 1 |
| | 2 | In × 3, Zn × 1 |
| (Ga, Zn)O layer | 3 | Ga × 2, Zn × 2 |
| | 4 | Ga × 2, Zn × 2 |

An oxygen atom was extracted from each oxygen site in the above model, whereby oxygen vacancy models were obtained. Then, the total energy of each model after structure optimization was compared. Table 4 shows the calculation conditions.

TABLE 4

| Software | VASP |
|---|---|
| Functional | GGA/PBE |
| Pseudopotential | PAW |
| Cut-off energy | 500 eV |
| K points | 2 × 2 × 3 |

Figure 21:
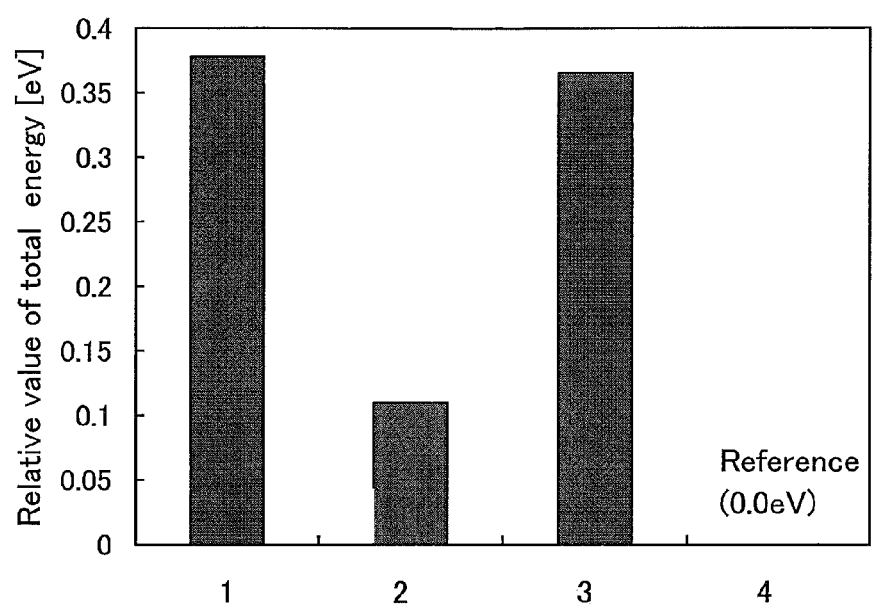
FIG. 21 shows relative values of total energies in an oxygen vacancy model.

The total energy of each optimized structure was compared. FIG. 21 shows relative values of the total energies with the total energy of the oxygen vacancy model of the oxygen site 4 as a reference (0.0 eV). FIG. 21 indicates that an oxygen vacancy is most easily formed in the oxygen site 4, and relatively easily formed in the oxygen site 2. In contrast, an oxygen vacancy is less likely to be formed in the oxygen sites 1 and 3 than in the oxygen sites 2 and 4.

<2-(3). Ease of Formation and Stability of $H_O$>

The calculation results described in <2-(1). Diffusion of H> showed that H diffused in IGZO particularly when heat treatment was performed. Here, calculation was made on whether H easily enters an oxygen vacancy $V_O$ if existing. A state in which H is in an oxygen vacancy $V_O$ is referred to as $H_O$ (also referred to as $V_OH$).

Figure 22:
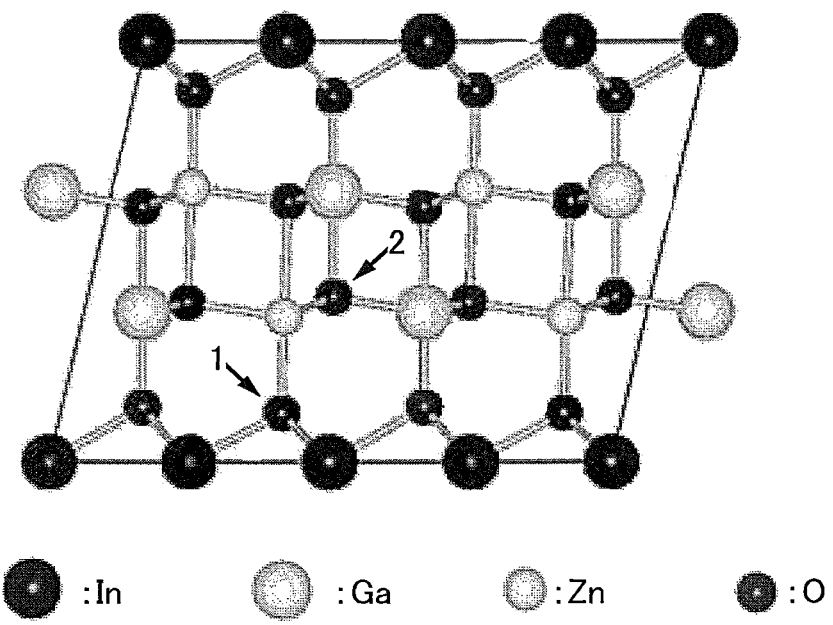
FIG. 22 shows a calculation model.

An $InGaZnO_4$ crystal model shown in FIG. 22 was used for calculation. The activation barrier ($E_a$) along the reaction path where H in $H_O$ is released from $V_O$ and bonded to oxygen was calculated by the NEB method. Table 5 shows the calculation results.

TABLE 5

| Software | VASP |
|---|---|
| Calculation | NEB method |
| Functional | GGA/PBE |
| Pseudopotential | PAW |
| Cut-off energy | 500 eV |
| K points | 2 × 2 × 3 |

The calculation results described in <2-(2). Site in which an oxygen vacancy $V_O$ is easily formed> shows that there are two oxygen sites in which an oxygen vacancy $V_O$ is easily formed. First, calculation was made on one of the oxygen sites in which an oxygen vacancy $V_O$ is easily formed: an oxygen site (1 in FIG. 22) that was bonded to three In atoms and one Zn atom.

Figure 24:
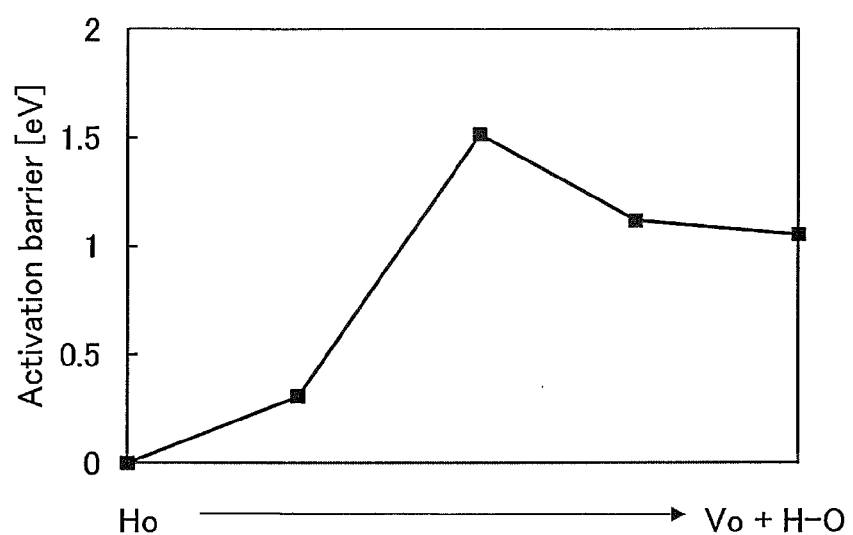
FIG. 24 shows an activation barrier.

FIG. 23A shows a model in the initial state and FIG. 23B shows a model in the final state. FIG. 24 shows the calculated activation barrier ($E_a$) in the initial state and the final state. Note that here, the initial state refers to a state in which H exists in an oxygen vacancy $V_O$ ($H_O$), and the final state refers to a structure including an oxygen vacancy $V_O$ and a state in which H is bonded to oxygen bonded to one Ga atom and two Zn atoms (H—O, also referred to as $V_O$+bonded-H).

From the calculation results, bonding of H in an oxygen vacancy $V_O$ to another oxygen atom needs an energy of approximately 1.52 eV, while entry of H bonded to O into an oxygen vacancy $V_O$ needs an energy of approximately 0.46 eV.

Reaction frequency (Γ) was calculated with use of the activation barriers ($E_a$) obtained by the calculation and the above Formula 1. In Formula 1, $k_B$ represents the Boltzmann constant and T represents the absolute temperature.

The reaction frequency at 350° C. was calculated on the assumption that the frequency factor $v=10^{13}$ [1/sec]. The frequency of H transfer from the model shown in FIG. 23A to the model shown in FIG. 23B was $5.52×10^0$ [1/sec], whereas the frequency of H transfer from the model shown in FIG. 23B to the model shown in FIG. 23A was $1.82×10^9$ [1/sec]. This suggests that H diffusing in IGZO is likely to form $H_O$ if an oxygen vacancy $V_O$ exists in the neighborhood, and H is unlikely to be released from the oxygen vacancy $V_O$ once $H_O$ is formed.

Next, on the basis of the calculation results described in <2-(2). Site in which an oxygen vacancy $V_O$ is easily formed>, calculation was made on the other of the oxygen sites in which an oxygen vacancy $V_O$ is easily formed: an oxygen site (2 in FIG. 22) that was bonded to one Ga atom and two Zn atoms.

Figure 26:
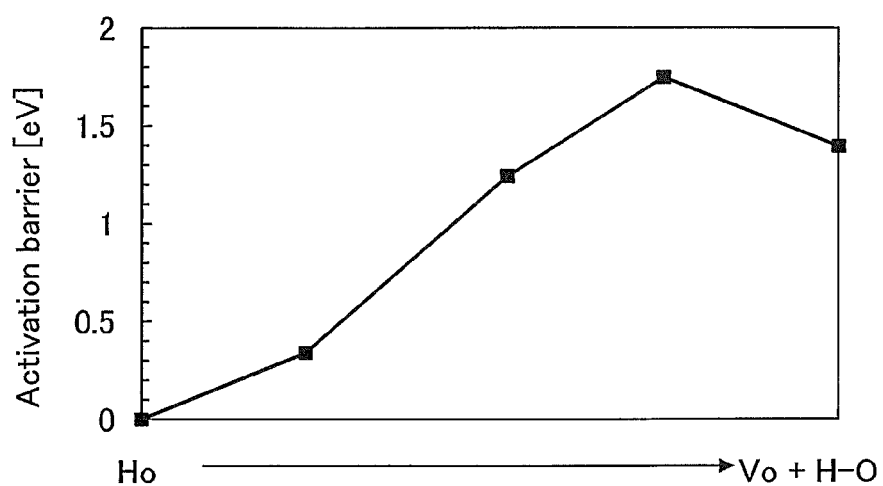
FIG. 26 shows an activation barrier.

FIG. 25A shows a model in the initial state and FIG. 25B shows a model in the final state. FIG. 26 shows the calculated activation barrier ($E_a$) in the initial state and the final state. Note that here, the initial state refers to a state in which H exists in an oxygen vacancy $V_O$ ($H_O$), and the final state refers to a structure including an oxygen vacancy $V_O$ and a state in which H is bonded to oxygen bonded to one Ga atom and two Zn atoms (H—O).

From the calculation results, bonding of H in an oxygen vacancy $V_O$ to another oxygen atom needs an energy of approximately 1.75 eV, while entry of H bonded to O in an oxygen vacancy $V_O$ needs an energy of approximately 0.35 eV.

Reaction frequency (Γ) was calculated with use of the activation barriers ($E_a$) obtained by the calculation and the above Formula 1.

The reaction frequency at 350° C. was calculated on the assumption that the frequency factor $v=10^{13}$ [1/sec]. The frequency of H transfer from the model shown in FIG. 25A to the model shown in FIG. 25B was $7.53×10^{-2}$ [1/sec], whereas the frequency of H transfer from the model shown in FIG. 25B to the model shown in FIG. 25A was $1.44×10^{10}$ [1/sec]. This suggests that H is unlikely to be released from the oxygen vacancy $V_O$ once $H_O$ is formed.

From the above results, it was found that H in IGZO easily diffused in heat treatment and if an oxygen vacancy $V_O$ existed, H was likely to enter the oxygen vacancy $V_O$ to be $H_O$.

<2-(4). Transition Level of $H_O$>

The calculation by the NEB method, which was described in <2-(3). Ease of formation and stability of $H_O$>, indicates that in the case where an oxygen vacancy $V_O$ and H exist in IGZO, the oxygen vacancy $V_O$ and H easily form $H_O$ and $H_O$ is stable. To determine whether $H_O$ is related to a carrier trap, the transition level of $H_O$ was calculated.

The model used for calculation is the InGaZnO$_4$ crystal model (112 atoms) shown in FIG. 22. The oxygen site in which an oxygen vacancy $V_O$ is easily formed is the oxygen site 1 in FIG. 22, which is bonded to three In atoms and one Zn atom, or the oxygen site 2 in FIG. 22, which is bonded to one Ga atom and two Zn atoms. Thus, $H_O$ models of the oxygen sites 1 and 2 were made to calculate the transition levels. Table 6 shows the calculation conditions.

TABLE 6

| Software | VASP |
| --- | --- |
| Model | InGaZnO$_4$ crystal (112 atoms) |
| Functional | HSE06 |
| Fraction of exact exchange | 0.25 |
| Pseudopotential | GGA-PBE |
| Cut-off energy | 800 eV |
| K points | 1 × 1 × 1 |

The fraction of the exact exchange was adjusted to have a band gap close to the experimental value. As a result, the band gap of the InGaZnO$_4$ crystal model without defects was 3.08 eV that is close to the experimental value, 3.15 eV.

The transition level ($\epsilon(q/q')$) of a model having defect D can be calculated by the following Formula 2. Note that $\Delta E(D^q)$ represents the formation energy of defect D at charge q, which is calculated by Formula 3.

$$\varepsilon(q/q') = \frac{\Delta E(D^q) - \Delta E(D^{q'})}{q' - q} \quad \text{[Formula 2]}$$

$$\Delta E(D^q) = E_{tot}(D^q) - E_{tot}(\text{bulk}) + \sum_i \Delta n_i \mu_i (\varepsilon_{VBM} + \Delta V_q + E_F) \quad \text{[Formula 3]}$$

In Formulae 2 and 3, $E_{tot}(D^q)$ represents the total energy of the model having defect D at the charge q in, $E_{tot}(\text{bulk})$ represents the total energy in a model without defects (complete crystal), $\Delta n_i$ represents a change in the number of atoms i contributing to defects, $\mu_i$ represents the chemical potential of atom i, $\epsilon_{VBM}$ represents the energy of the valence band maximum in the model without defects, $\Delta V_q$ represents the correction term relating to the electrostatic potential, and $E_F$ represents the Fermi energy.

Figure 27:
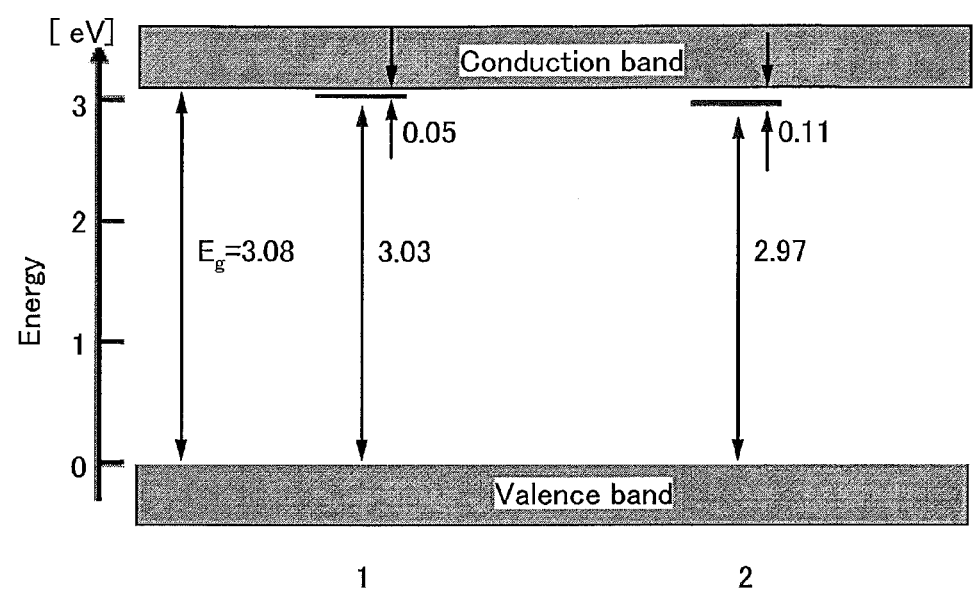
FIG. 27 shows the transition levels of $H_O$.

FIG. 27 shows the transition levels of $H_O$ obtained from the above formulae. The numbers in FIG. 27 represent the depth from the conduction band minimum. In FIG. 27, the transition level of $H_O$ in the oxygen site 1 is at 0.05 eV from the conduction band minimum, and the transition level of $H_O$ in the oxygen site 2 is at 0.11 eV from the conduction band minimum. Therefore, these $H_O$ would be related to electron traps, that is, $H_O$ was found to behave as a donor. It was also found that IGZO including $H_O$ had conductivity.

<2-(5). Release of $H_2O$ from Surface>

Next, calculation was made on the steps in which H in IGZO is released from the surface of IGZO as $H_2O$.

Figure 28:
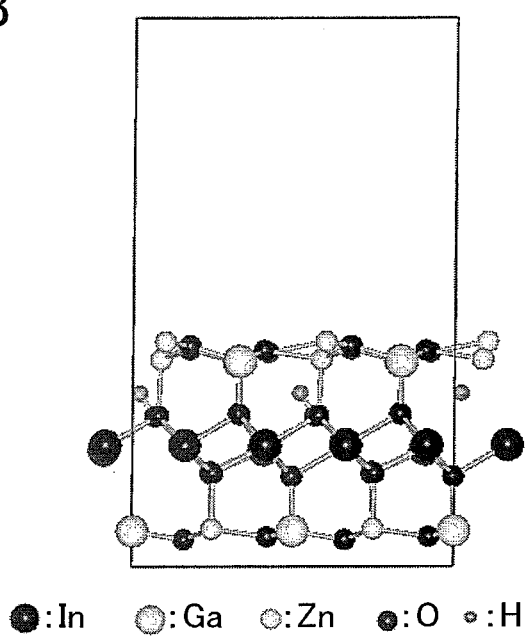
FIG. 28 shows a calculation model.

The surface of an InGaZnO$_4$ crystal model was assumed to be a cleavage surface. In other words, the model used was an InGaZnO$_4$ crystal (112 atoms) whose outermost surface was the (Ga, Zn)O plane. FIG. 28 shows the calculation model and Table 7 shows the calculation conditions.

TABLE 7

| Software | VASP |
| --- | --- |
| Functional | GGA/PBE |
| Pseudopotential | PAW |
| Cut-off energy | 500 eV |
| K points | 2 × 2 × 1 |

The $H_2O$ release steps were calculated as follows on the assumption that the initial structure of the reaction path was an InGaZnO$_4$ plane model in which two hydrogen atoms were bonded to O in an InO$_2$ layer.

Steps (1) to (2): A first H atom is bonded to the inner side of an O atom on the surface.

Steps (2) to (3): The first H atom moves outside the O atom on the surface.

Steps (3) to (4): A second H approaches.

Steps (4) to (5): The second H is bonded to the inner side of OH on the surface.

Steps (5) to (6): The second H moves outside the O atom on the surface.

Steps (6) to (7): $H_2O$ is released.

Figure 29:
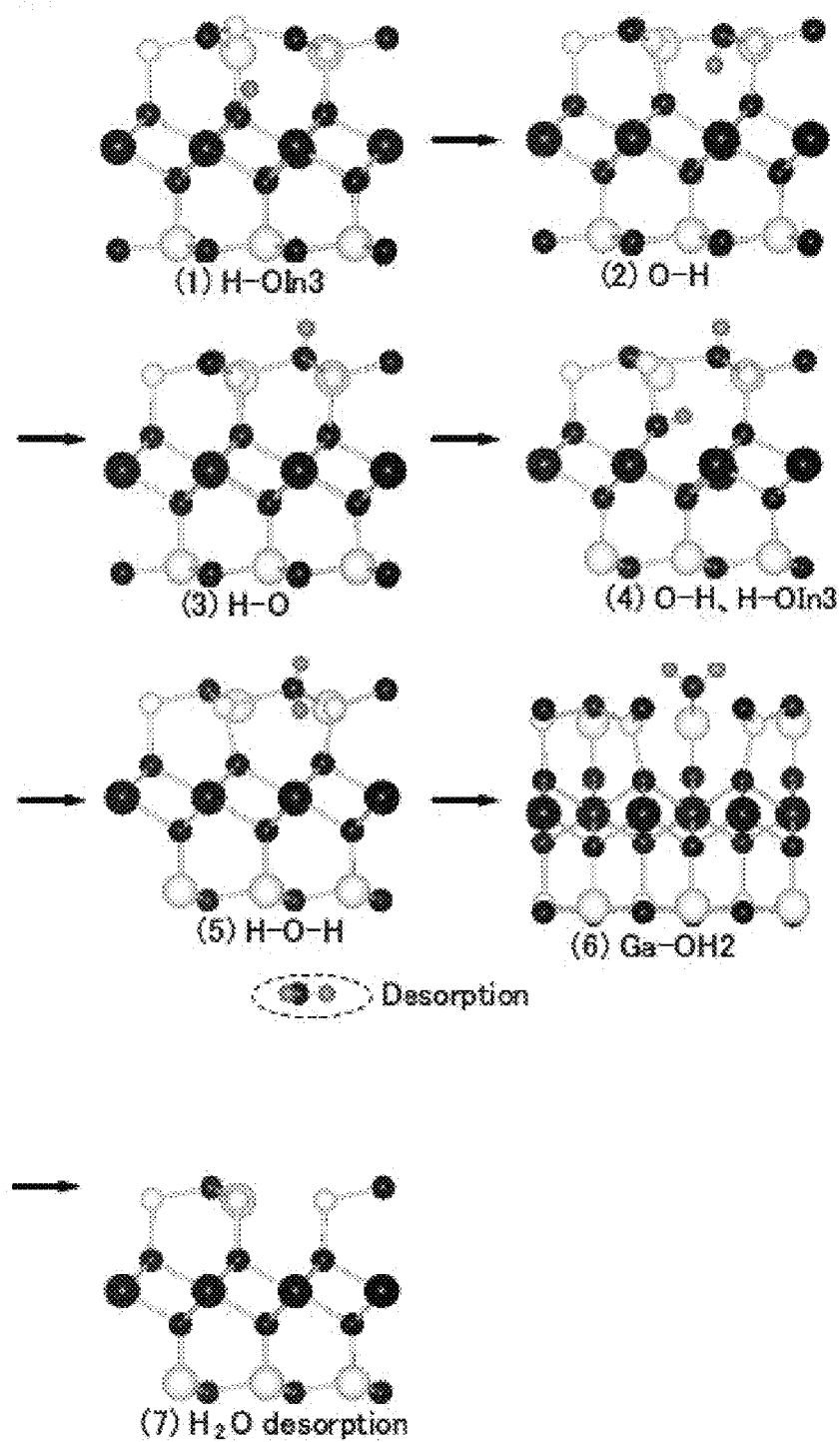
FIG. 29 shows structures of a model in reaction paths.
Figure 30:
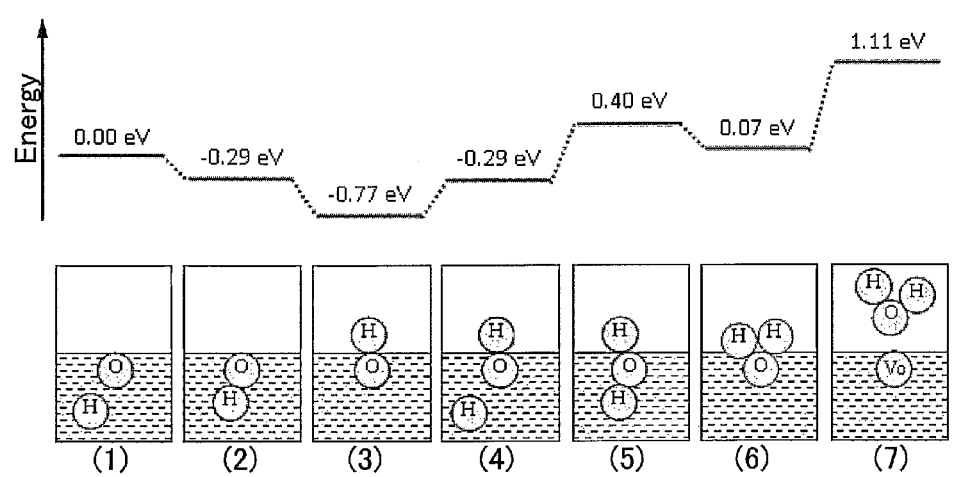
FIG. 30 shows energy changes in the reaction paths.

FIG. 29 shows the structures of the model in the reaction paths of the above steps. FIG. 30 shows energy changes with the energy of the initial structure as a reference (0.00 eV). Note that the upper side of FIG. 30 shows the energy changes in the steps of (1) to (7) in FIG. 29, and the lower side of FIG. 30 shows schematic diagrams of reaction of O and H atoms in IGZO and on the surface of IGZO in the steps of (1) to (7).

The calculation results showed that the highest energy, 1.04 eV, was obtained in the reaction path (steps of (6) to (7)) in which $H_2O$ is released from the state where two H atoms are bonded to an O atom on the surface and an oxygen vacancy $V_O$ is formed. Thus, the reaction frequency ($\Gamma$) of the steps of (6) to (7) was calculated by Formula 1.

The reaction frequency at 350° C. was calculated on the assumption that the frequency factor $v=10^{13}$ [1/sec], then, a reaction frequency $\Gamma$ of 3.66×10$^4$ [1/sec] was obtained. This suggests that H could be released as $H_2O$ to form an oxygen vacancy $V_O$ in an actual process.

(Embodiment 5)

In this embodiment, a display device which is one embodiment of the present invention will be described with reference to drawings. In this embodiment, a display device including a capacitor provided with the oxide semiconductor film that has conductivity and is shown in Embodiment 1 will be described with reference to FIGS. 31A to 31C, FIG. 32, and FIG. 33.

Figure 31A:
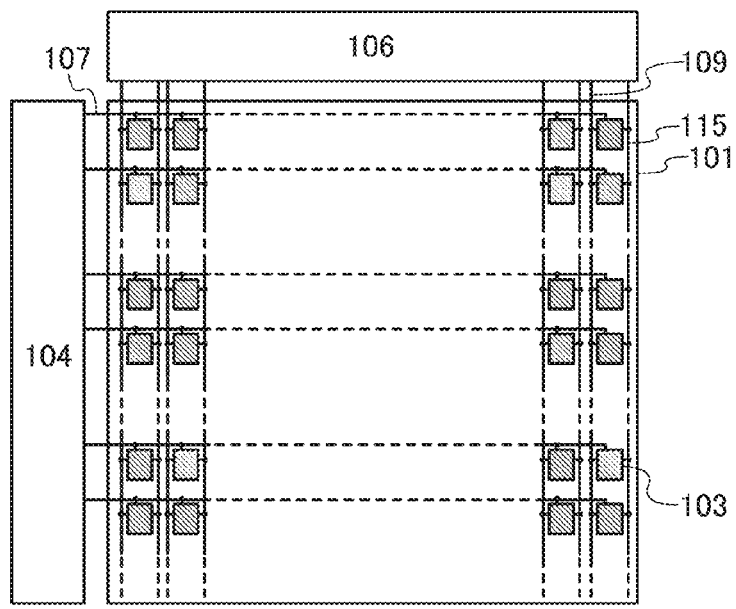
FIG. 31A is a block diagram illustrating one mode of a display device.

FIG. 31A illustrates an example of a display device. The display device in FIG. 31A includes a pixel portion 101, a scan line driver circuit 104, a signal line driver circuit 106, m scan lines 107 that are arranged in parallel or substantially in parallel and whose potentials are controlled by the scan line driver circuit 104, and n signal lines 109 that are arranged in parallel or substantially in parallel and whose potentials are controlled by the signal line driver circuit 106. Furthermore, the pixel portion 101 includes a plurality of pixels 103 arranged in a matrix. Capacitor lines 115 arranged in parallel or substantially in parallel may further be provided along the signal lines 109. Note that the capacitor lines 115 may be arranged in parallel or substantially in parallel along the scan lines 107. The scan line driver circuit 104 and the signal line driver circuit 106 are collectively referred to as a driver circuit portion in some cases.

Note that the display device includes a driver circuit for driving a plurality of pixels, and the like. The display device may also be referred to as a liquid crystal module including a control circuit, a power supply circuit, a signal generation circuit, a backlight module, and the like provided over another substrate.

Each of the scan lines 107 is electrically connected to the n pixels 103 in the corresponding row among the pixels 103 arranged in m rows and n columns in the pixel portion 101. Each of the signal lines 109 is electrically connected to the m pixels 103 in the corresponding column among the pixels 103 arranged in m rows and n columns. Note that m and n are each an integer of 1 or more. Each of the capacitor lines 115 is electrically connected to the m pixels 103 in the corresponding column among the pixels 103 arranged in m rows and n columns. Note that in the case where the capacitor lines 115 are arranged in parallel or substantially in parallel along the scan lines 107, each of the capacitor lines 115 is electrically connected to the n pixels 103 in the corresponding row among the pixels 103 arranged in m rows and n columns.

In the case where FFS driving is used for a liquid crystal display device, the capacitor line is not provided and a common line or a common electrode serves as a capacitor line.

Note that here, a pixel refers to a region surrounded by scan lines and signal lines and exhibiting one color. Therefore, in the case of a color display device having color elements of R (red), G (green), and B (blue), a minimum unit of an image is composed of three pixels of an R pixel, a G pixel, and a B pixel. Note that color reproducibility can be improved by adding a yellow pixel, a cyan pixel, a magenta pixel, or the like to the R, G, and B pixels. Moreover, the power consumption of the display device can be reduced by adding a W (white) pixel to the R, G, and B pixels. In the case of a liquid crystal display device, the brightness of the liquid crystal display device can be improved by adding a W pixel to each of the R pixel, the G pixel, and the B pixel. As a result, the brightness of a backlight can be reduced, which leads to lower power consumption of the liquid crystal display device.

Figure 31B:
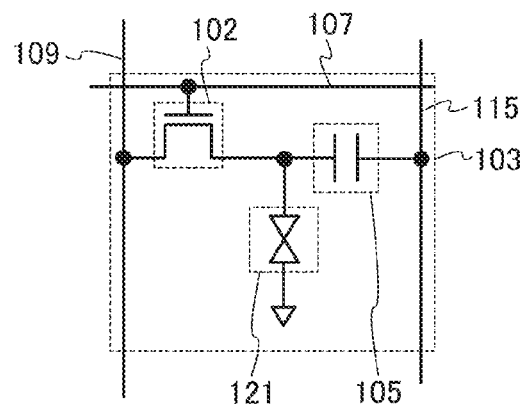
FIGS. 31B and 31C are circuit diagrams thereof.
Figure 31C:
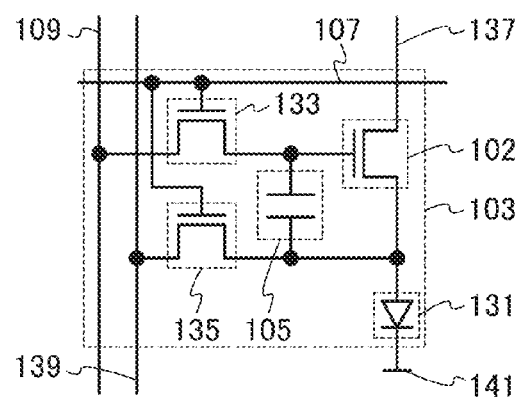

FIGS. 31B and 31C illustrate examples of a circuit configuration that can be used for the pixels 103 in the display device illustrated in FIG. 31A.

The pixel 103 in FIG. 31B includes a liquid crystal element 121, a transistor 102, and a capacitor 105.

The potential of one of a pair of electrodes of the liquid crystal element 121 is set as appropriate according to the specifications of the pixel 103. The alignment state of the liquid crystal element 121 depends on written data. A common potential may be supplied to one of the pair of electrodes of the liquid crystal element 121 included in each of the pixels 103. Furthermore, the potential supplied to the one of the pair of electrodes of the liquid crystal element 121 in the pixel 103 in one row may be different from the potential supplied to the one of the pair of electrodes of the liquid crystal element 121 in the pixel 103 in another row.

The liquid crystal element 121 is an element that controls transmission or non-transmission of light utilizing an optical modulation action of liquid crystal. Note that the optical modulation action of the liquid crystal is controlled by an electric field applied to the liquid crystal (including a horizontal electric field, a vertical electric field, and a diagonal electric field). Examples of the liquid crystal element 121 are a nematic liquid crystal, a cholesteric liquid crystal, a smectic liquid crystal, a thermotropic liquid crystal, a lyotropic liquid crystal, a ferroelectric liquid crystal, and an anti-ferroelectric liquid crystal.

The display device including the liquid crystal element 121 can be driven by any of the following modes: a TN mode, a VA mode, an ASM (axially symmetric aligned micro-cell) mode, an OCB (optically compensated birefringence) mode, an MVA mode, a PVA (patterned vertical alignment) mode, an IPS mode, an FFS mode, a TBA (transverse bend alignment) mode, and the like. Note that one embodiment of the present invention is not limited to the above, and various liquid crystal elements and driving methods can be used.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 103 illustrated in FIG. 31B, one of a source electrode and a drain electrode of the transistor 102 is electrically connected to the signal line 109, and the other is electrically connected to the other of the pair of electrodes of the liquid crystal element 121. A gate electrode of the transistor 102 is electrically connected to the scan line 107. The transistor 102 has a function of controlling whether to write a data signal by being turned on or off.

In the pixel 103 illustrated in FIG. 31B, one of a pair of electrodes of the capacitor 105 is electrically connected to the capacitor line 115 to which a potential is supplied, and the other is electrically connected to the other of the pair of electrodes of the liquid crystal element 121. The potential of the capacitor line 115 is set in accordance with the specifications of the pixel 103 as appropriate. The capacitor 105 serves as a storage capacitor for storing written data.

The pixel 103 illustrated in FIG. 31C includes a transistor 133 for switching a display element, the transistor 102 for controlling driving of a pixel, a transistor 135, the capacitor 105, and a light-emitting element 131.

One of a source electrode and a drain electrode of the transistor 133 is electrically connected to the signal line 109 to which a data signal is supplied. A gate electrode of the transistor 133 is electrically connected to the scan line 107 to which a gate signal is supplied.

The transistor 133 has a function of controlling whether to write data of a data signal by being turned on or off.

One of a source electrode and a drain electrode of the transistor 102 is electrically connected to a wiring 137 serving as an anode line. The other of the source and drain electrodes of the transistor 102 is electrically connected to one of electrodes of the light-emitting element 131. A gate electrode of the transistor 102 is electrically connected to the other of the source and drain electrodes of the transistor 133 and one of electrodes of the capacitor 105.

The transistor 102 has a function of controlling current flowing in the light-emitting element 131 by being turned on or off.

One of a source electrode and a drain electrode of the transistor 135 is connected to a wiring 139 to which a data reference potential is supplied. The other of the source and drain electrodes of the transistor 135 is electrically connected to the one electrode of the light-emitting element 131 and the other electrode of the capacitor 105. A gate electrode of the transistor 135 is electrically connected to a scan line 107 to which a gate signal is supplied.

The transistor 135 has a function of controlling current flowing through the light-emitting element 131. For example, in the case where the internal resistance of the light-emitting element 131 is increased by degradation or the like, by monitoring current flowing through the wiring 139 that is connected to the one of the source and drain electrodes of the transistor 135, current flowing through the light-emitting element 131 can be corrected. A potential that is supplied to the wiring 139 can be, for example, 0 V.

The one electrode of the capacitor 105 is electrically connected to the other of the source and drain electrodes of the transistor 133 and a gate electrode of the transistor 102. The other electrode of the capacitor 105 is electrically connected to the other of the source and drain electrodes of the transistor 135 and the one electrode of the light-emitting element 131.

In the configuration of the pixel 103 in FIG. 31C, the capacitor 105 serves as a storage capacitor for storing written data.

The one of the pair of electrodes of the light-emitting element 131 is electrically connected to the other of the source and drain electrodes of the transistor 135, the other electrode of the capacitor 105, and the other of the source and drain electrodes of the transistor 102. The other of the pair of electrodes of the light-emitting element 131 is electrically connected to a wiring 141 serving as a cathode.

As the light-emitting element 131, an organic electroluminescent element (also referred to as an organic EL element) or the like can be used. Note that the light-emitting element 131 is not limited to the organic EL element, and may be an inorganic EL element including an inorganic material.

A high power source potential VDD is supplied to one of the wirings 137 and 141, and a low power source potential VSS is supplied to the other. In the configuration illustrated in FIG. 31C, a high power source potential VDD is supplied to the wiring 137 and a low power source potential VSS is supplied to the wiring 141.

Note that although FIGS. 31B and 31C each illustrate an example in which the liquid crystal element 121 or the light-emitting element 131 is used as a display element, one embodiment of the present invention is not limited thereto. Any of a variety of display elements can be used. Examples of display elements include elements including a display medium whose contrast, luminance, reflectance, transmittance, or the like is changed by electromagnetic action, such as an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), or a display element using a micro electro mechanical system (MEMS), a digital micromirror device (DMD), a digital micro shutter (DMS), an interferometric modulator display (IMOD), a MEMS shutter display element, an optical-interference-type MEMS display element, an electrowetting element, a piezoelectric ceramic display, and a carbon nanotube. Examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device using electronic ink or electrophoretic elements include electronic paper. In a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as SRAM can be provided under the reflective electrodes, leading to lower power consumption.

Figure 32:
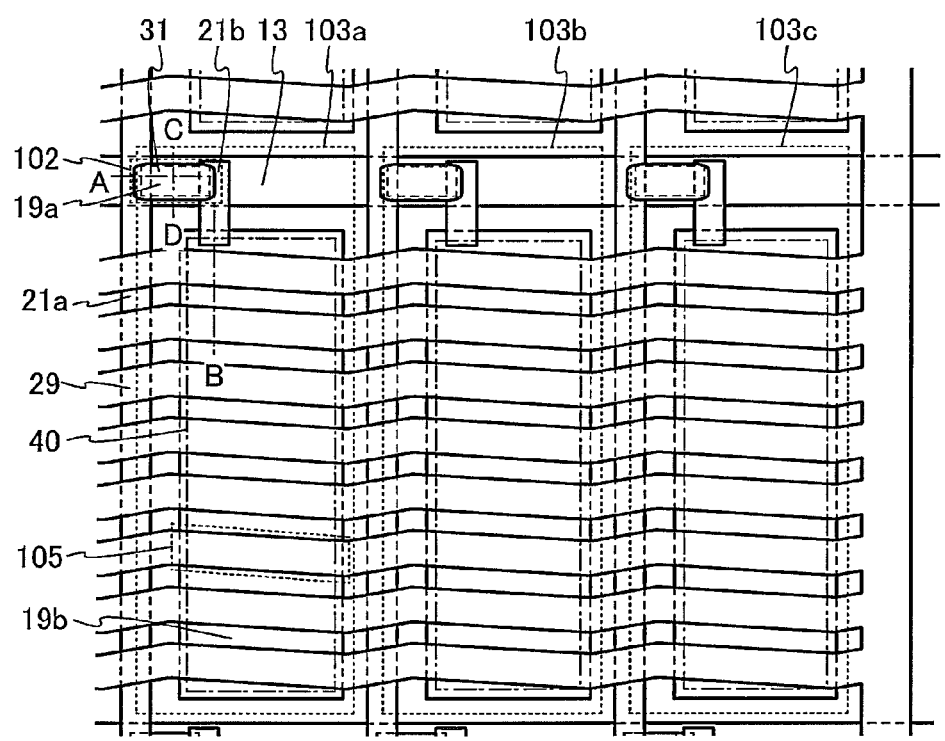
FIG. 32 is a top view illustrating one mode of the display device.

Next, a specific structure of an element substrate included in the display device is described. Here, a specific example of a liquid crystal display device including a liquid crystal element in the pixel 103 is described. FIG. 32 is a top view of the pixel 103 illustrated in FIG. 31B.

Here, a liquid crystal display device driven in an FFS mode is used as the display device, and FIG. 32 is a top view of a plurality of pixels 103a, 103b, and 103c included in the liquid crystal display device.

In FIG. 32, a conductive film 13 functioning as a scan line extends in a direction substantially perpendicularly to a conductive film functioning as a signal line (in the lateral direction in the drawing). A conductive film 21a functioning as a signal line extends in a direction substantially perpendicularly to the conductive film functioning as a scan line (in the longitudinal direction in the drawing). Note that the conductive film 13 functioning as a scan line is electrically connected to the scan line driver circuit 104 (see FIGS. 31A to 31C), and the conductive film 21a functioning as a signal line is electrically connected to the signal line driver circuit 106 (see FIGS. 31A to 31C).

The transistor 102 is provided in a region where the conductive film functioning as a scan line and the conductive film functioning as a signal line intersect with each other. The transistor 102 includes the conductive film 13 functioning as a gate electrode; a gate insulating film (not illustrated in FIG. 32); an oxide semiconductor film 19a over the gate insulating film, where a channel region is formed; and the conductive film 21a and a conductive film 21b functioning as a pair of electrodes. The conductive film 13 also functions as a scan line, and a region of the conductive film 13 that overlaps with the oxide semiconductor film 19a functions as the gate electrode of the transistor 102. In addition, the conductive film 21a also functions as a signal line, and a region of the conductive film 21a that overlaps with the oxide semiconductor film 19a functions as the source electrode or the drain electrode of the transistor 102. Furthermore, in FIG. 32, an end portion of the conductive film functioning as a scan line is positioned on an outer side of an end portion of the oxide semiconductor film 19a. Thus, the conductive film functioning as a scan line functions as a light-blocking film for blocking light from a light source such as a backlight. For this reason, the oxide semiconductor film 19a included in the transistor is not irradiated with light, so that a variation in the electrical characteristics of the transistor can be suppressed.

In addition, the transistor 102 includes the organic insulating film 31 overlapping with the oxide semiconductor film 19a. The organic insulating film 31 overlaps with the oxide semiconductor film 19a (in particular, a region of the oxide semiconductor film 19a that is between the conductive films 21a and 21b) with an inorganic insulating film (not illustrated in FIG. 32) provided therebetween.

Water from the outside does not diffuse to the liquid crystal display device through the organic insulating film 31 because the organic insulating film 31 is isolated in each transistor 10; therefore, a variation in the electrical characteristics of the transistors provided in the liquid crystal display device can be reduced.

The conductive film 21b is electrically connected to an oxide semiconductor film 19b having conductivity. A common electrode 29 is provided over the oxide semiconductor film 19b having conductivity with an insulating film provided therebetween. An opening 40 indicated by a dashed-dotted line is provided in the insulating film over the oxide semiconductor film 19b having conductivity. The oxide semiconductor film 19b having conductivity is in contact with a nitride insulating film (not illustrated in FIG. 32) in the opening 40.

The common electrode 29 includes stripe regions extending in a direction intersecting with the conductive film 21a functioning as a signal line. The stripe regions are connected to a region extending in a direction parallel or substantially parallel to the conductive film 21a functioning as a signal line. Accordingly, the stripe regions of the common electrode 29 are at the same potential in pixels.

The capacitor 105 is formed in a region where the oxide semiconductor film 19b having conductivity and the common electrode 29 overlap with each other. The oxide semiconductor film 19b having conductivity and the common electrode 29 each transmit light. That is, the capacitor 105 transmits light.

As illustrated in FIG. 32, an FFS mode liquid crystal display device is provided with the common electrode including the stripe regions extending in a direction intersecting with the conductive film functioning as a signal line. Thus, the display device can have excellent contrast.

Owing to the light-transmitting property of the capacitor 105, the capacitor 105 can be formed large (in a large area) in the pixel 103. Thus, the display device can have a high capacitance as well as an aperture ratio increased to typically 50% or more, preferably 60% or more. For example, in a high-resolution display device such as a liquid crystal display device, the area of a pixel decreases and accordingly the area of a capacitor also decreases. For this reason, the amount of charge accumulated in the capacitor is reduced in the high-resolution display device. However, since the capacitor 105 of this embodiment has a light-transmitting property, when the capacitor 105 is provided in a pixel, sufficient capacitance can be obtained in the pixel and the aperture ratio can be improved. Typically, the capacitor 105 can be favorably used for a high-resolution display device with a pixel density of 200 pixels per inch (ppi) or more, 300 ppi or more, or furthermore, 500 ppi or more.

In a liquid crystal display device, an increase in the capacitance of a capacitor increases the period during which the alignment of liquid crystal molecules of a liquid crystal element can be kept constant in the state where an electric field is applied. When the period can be made longer in a display device which displays a still image, the number of times of rewriting image data can be reduced, leading to a reduction in power consumption. Furthermore, according to the structure of this embodiment, the aperture ratio can be improved even in a high-resolution display device, which makes it possible to use light from a light source such as a backlight efficiently, so that power consumption of the display device can be reduced.

Figure 33:
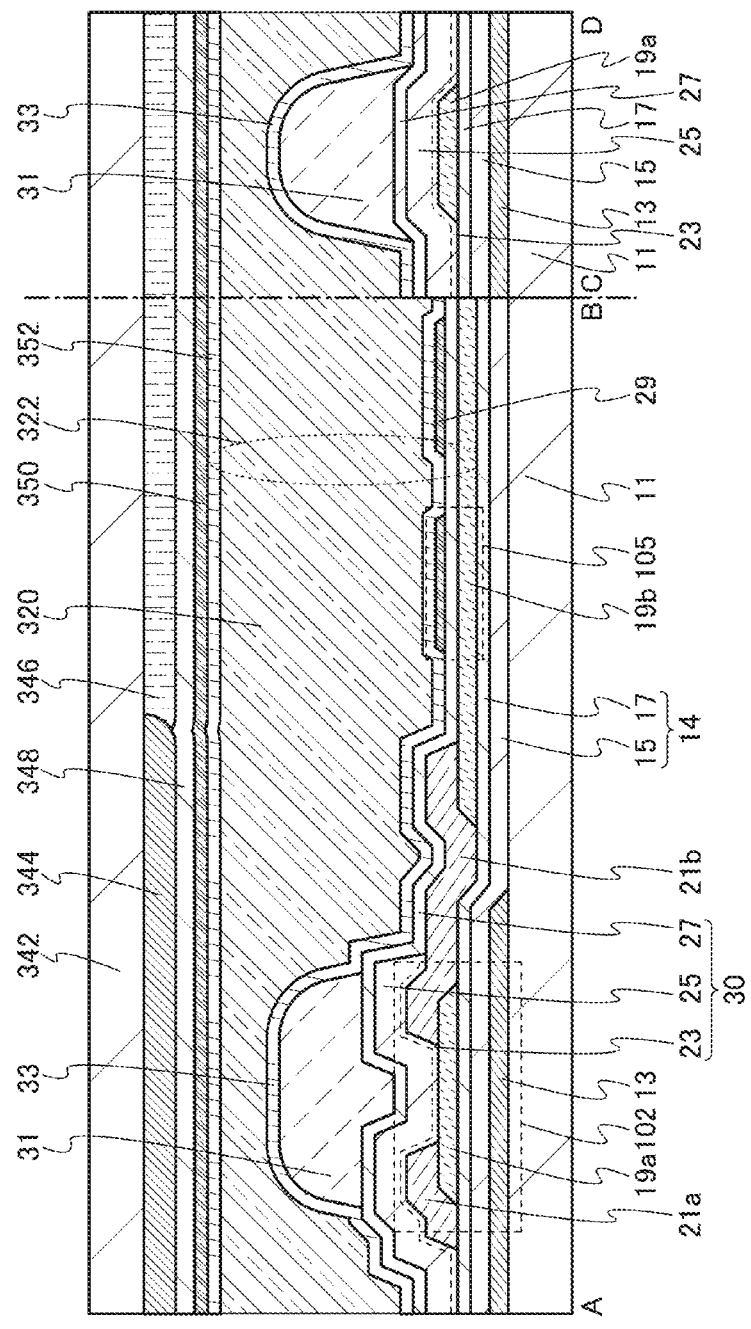
FIG. 33 is a cross-sectional view illustrating one mode of the display device.

FIG. 33 is a cross-sectional view taken along dashed-dotted lines A-B and C-D in FIG. 32. The transistor 102 illustrated in FIG. 33 is a channel-etched transistor. Note that the transistor 102 in the channel length direction and the capacitor 105 are illustrated in the cross-sectional view taken along dashed-dotted line A-B, and the transistor 102 in the channel width direction is illustrated in the cross-sectional view taken along dashed-dotted line C-D.

The liquid crystal display device described in this embodiment includes a pair of substrates (a first substrate 11 and a second substrate 342), an element layer in contact with the first substrate 11, an element layer in contact with the second substrate 342, and a liquid crystal layer 320 provided between the element layers. Note that the element layer is a collective term for layers interposed between the substrate and the liquid crystal layer. Furthermore, the substrate and the element layer are collectively referred to as an element substrate in some cases. A liquid crystal element 322 is provided between a pair of substrates (the first substrate 11 and the second substrate 342).

The liquid crystal element 322 includes the oxide semiconductor film 19b having conductivity over the first substrate 11, the common electrode 29, a nitride insulating film 27, a film controlling alignment (hereinafter referred to as an alignment film 33), and the liquid crystal layer 320. The oxide semiconductor film 19b having conductivity functions as one electrode (also referred to as a pixel electrode) of the liquid crystal element 322, and the common electrode 29 functions as the other electrode of the liquid crystal element 322.

First, the element layer formed over the first substrate 11 is described. The transistor 102 in FIG. 33 has a single-gate structure and includes the conductive film 13 functioning as a gate electrode over the first substrate 11. In addition, the transistor 102 includes a nitride insulating film 15 formed over the first substrate 11 and the conductive film 13 functioning as a gate electrode, an oxide insulating film 17 formed over the nitride insulating film 15, the oxide semiconductor film 19a overlapping with the conductive film 13 functioning as a gate electrode with the nitride insulating film 15 and the oxide insulating film 17 provided therebetween, and the conductive films 21a and 21b functioning as a source electrode and a drain electrode which are in contact with the oxide semiconductor film 19a. The nitride insulating film 15 and the oxide insulating film 17 function as the gate insulating film 14. Moreover, an oxide insulating film 23 is formed over the oxide insulating film 17, the oxide semiconductor film 19a, and the conductive films 21a and 21b functioning as a source electrode and a drain electrode, and an oxide insulating film 25 is formed over the oxide insulating film 23. The nitride insulating film 27 is formed over the nitride insulating film 15, the oxide insulating film 23, the oxide insulating film 25, and the conductive film 21b. The oxide insulating film 23, the oxide insulating film 25, and the nitride insulating film 27 function as the inorganic insulating film 30. The oxide semiconductor film 19b having conductivity is formed over the oxide insulating film 17. The oxide semiconductor film 19b having conductivity is connected to one of the conductive films 21a and 21b functioning as a source electrode and a drain electrode, here, connected to the conductive film 21b. The common electrode 29 is formed over the nitride insulating film 27. In addition, the organic insulating film 31 overlapping with the oxide semiconductor film 19a of the transistor 102 with the inorganic insulating film 30 provided therebetween is included.

A structure of the display device will be described below in detail.

As the substrate 11, the substrate 151 described in Embodiment 1 can be used as appropriate.

The conductive film 13 functioning as a gate electrode can be formed using a metal element selected from aluminum, chromium, copper, tantalum, titanium, molybdenum, and tungsten; an alloy containing any of these metal elements as a component; an alloy containing any of these metal elements in combination; or the like. Furthermore, one or more metal elements selected from manganese and zirconium may be used. The conductive film 13 functioning as a gate electrode may have a single-layer structure or a stacked-layer structure of two or more layers. Examples of the structure include a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a two-layer structure in which a copper film is stacked over a molybdenum film, and a three-layer structure in which a titanium film, an aluminum film, and a titanium film are stacked in this order. Alternatively, an alloy film or a nitride film which contains aluminum and one or more elements selected from titanium, tantalum, tungsten, molybdenum, chromium, neodymium, and scandium may be used.

The conductive film 13 serving as a gate electrode can be formed using the structure and materials for the conductive film 159 in Embodiment 1 as appropriate. Alternatively, the conductive film 13 serving as a gate electrode can be formed using the light-transmitting conductive film shown in the description of the conductive film 181 in Embodiment 3. Alternatively, the conductive film 13 serving as a gate electrode can have a stacked-layer structure of the light-transmitting conductive film and the metal element. Alternatively, the conductive film 13 serving as a gate electrode may be formed using the oxide semiconductor film 155b having conductivity shown in Embodiment 1.

The nitride insulating film 15 can be a nitride insulating film that is hardly permeated by oxygen. Alternatively, a nitride insulating film which is hardly permeated by oxygen, hydrogen, and water can be used. Examples of the nitride insulating film that is hardly permeated by oxygen and the nitride insulating film that is hardly permeated by oxygen, hydrogen, and water include a silicon nitride film, a silicon nitride oxide film, an aluminum nitride film, and an aluminum nitride oxide film. Instead of the nitride insulating film that is hardly permeated by oxygen and the nitride insulating film that is hardly permeated by oxygen, hydrogen, and water, an oxide insulating film such as an aluminum oxide film, an aluminum oxynitride film, a gallium oxide film, a gallium oxynitride film, an yttrium oxide film, an yttrium oxynitride film, a hafnium oxide film, or a hafnium oxynitride film can be used.

The thickness of the nitride insulating film 15 is preferably greater than or equal to 5 nm and less than or equal to 100 nm, more preferably greater than or equal to 20 nm and less than or equal to 80 nm.

The oxide insulating film 17 may be formed to have a single-layer structure or a stacked-layer structure including, for example, one or more of a silicon oxide film, a silicon oxynitride film, a silicon nitride oxide film, a silicon nitride film, an aluminum oxide film, a hafnium oxide film, a gallium oxide film, a Ga—Zn-based metal oxide film, and a silicon nitride film.

The oxide insulating film 17 may also be formed using a material having a high relative dielectric constant such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that the gate leakage current of the transistor can be reduced.

The thickness of the oxide insulating film 17 is preferably greater than or equal to 5 nm and less than or equal to 400 nm, more preferably greater than or equal to 10 nm and less than or equal to 300 nm, and still more preferably greater than or equal to 50 nm and less than or equal to 250 nm.

The oxide semiconductor film 19a and the oxide semiconductor film 19b having conductivity are formed at the same time and therefore are formed using a metal oxide film such as an In—Ga oxide film, an In—Zn oxide film, or an In-M-Zn oxide film (M represents Al, Ga, Y, Zr, Sn, La, Ce, or Nd) similarly to the oxide semiconductor film 155b having conductivity shown in Embodiment 1. Thus, the oxide semiconductor film 19a and the oxide semiconductor film 19b having conductivity include the same metal element.

However, the amount of defects and impurities in the oxide semiconductor film 19b having conductivity is larger than that in the oxide semiconductor film 19a. Accordingly, the oxide semiconductor film 19a and the oxide semiconductor film 19b having conductivity have different electrical characteristics. Specifically, the oxide semiconductor film 19a has semiconductor characteristics and the oxide semiconductor film 19b has conductivity.

The thickness of each of the oxide semiconductor film 19a and the oxide semiconductor film 19b having conductivity is greater than or equal to 3 nm and less than or equal to 200 nm, preferably greater than or equal to 3 nm and less than or equal to 100 nm, and more preferably greater than or equal to 3 nm and less than or equal to 50 nm.

Part of the oxide semiconductor film 19a serves as the channel region of the transistor; thus, the energy gap of the oxide semiconductor film 19a is 2 eV or more, preferably 2.5 eV or more, and more preferably 3 eV or more. The off-state current of the transistor 102 can be reduced by using such an oxide semiconductor having a large energy gap.

An oxide semiconductor film with a low carrier density is used as the oxide semiconductor film 19a. For example, an oxide semiconductor film whose carrier density is $1\times10^{17}/cm^3$ or lower, preferably $1\times10^{15}$ $cm^3$ or lower, more preferably $1\times10^{13}/cm^3$ or lower, still more preferably $1\times10^{11}/cm^3$ or lower, and yet further preferably lower than $1\times10^{10}/cm^3$, and is $1\times10^{-9}/cm^3$ or higher is used as the oxide semiconductor film 19a.

Note that, without limitation to the compositions described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, the carrier density, the impurity concentration, the defect density, the atomic ratio of a metal element to oxygen, the interatomic distance, the density, and the like of the oxide semiconductor film 19a are preferably set to be appropriate.

Note that when an oxide semiconductor film having a low impurity concentration and a low density of defect states is used as the oxide semiconductor film 19a, a transistor with more excellent electrical characteristics can be manufactured. Here, the state in which impurity concentration is low and density of defect states is low (the amount of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Furthermore, the highly purified intrinsic or substantially highly purified intrinsic oxide semiconductor film has an extremely low off-state current, even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Hence, the transistor whose channel region is formed in the oxide semiconductor film has a small variation in electrical characteristics and high reliability. Examples of the impurities include hydrogen, nitrogen, alkali metal, and alkaline earth metal.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on.

Accordingly, hydrogen as well as the oxygen vacancies is preferably reduced as much as possible in the oxide semiconductor film 19a. Specifically, in the oxide semiconductor film 19a, the hydrogen concentration which is measured by secondary ion mass spectrometry (SIMS) is set to be lower than or equal to $5\times10^{19}$ atoms/cm³, preferably lower than or equal to $1\times10^{19}$ atoms/cm³, more preferably lower than or equal to $5\times10^{18}$ atoms/cm³, still more preferably lower than or equal to $1\times10^{18}$ atoms/cm³, yet still more preferably lower than or equal to $5\times10^{17}$ atoms/cm³, and yet still furthermore preferably lower than or equal to $1\times10^{16}$ atoms/cm³.

When silicon or carbon which is an element belonging to Group 14 is contained in the oxide semiconductor film 19a, oxygen vacancies are increased, and the oxide semiconductor film 19a becomes an n-type film. Thus, the concentration of silicon or carbon (measured by SIMS) in the oxide semiconductor film 19a is set to be lower than or equal to $2\times10^{18}$ atoms/cm³, preferably lower than or equal to $2\times10^{17}$ atoms/cm³.

The concentration of alkali metal or alkaline earth metal in the oxide semiconductor film 19a, which is measured by SIMS, is set to be lower than or equal to $1\times10^{18}$ atoms/cm³, preferably lower than or equal to $2\times10^{16}$ atoms/cm³. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 19a.

Furthermore, when containing nitrogen, the oxide semiconductor film 19a easily has n-type conductivity by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the nitrogen concentration which is measured by SIMS is preferably set to be, for example, lower than or equal to $5\times10^{18}$ atoms/cm³.

The oxide semiconductor film 19b having conductivity is formed when defects, e.g., oxygen vacancies, and impurities are included in an oxide semiconductor film formed at the same time as the oxide semiconductor film 19a. Thus, the oxide semiconductor film 19b having conductivity serves as an electrode, e.g., a pixel electrode in this embodiment.

The oxide semiconductor film 19a and the oxide semiconductor film 19b having conductivity are both formed over the oxide insulating film 17, but differ in impurity concentration. Specifically, the oxide semiconductor film 19b having conductivity has a higher impurity concentration than the oxide semiconductor film 19a. For example, the hydrogen concentration in the oxide semiconductor film 19a is lower than or equal to $5\times10^{19}$ atoms/cm³, preferably lower than or equal to $1\times10^{19}$ atoms/cm³, more preferably lower than or equal to $5\times10^{18}$ atoms/cm³, still more preferably lower than or equal to $1\times10^{18}$ atoms/cm³, yet more preferably lower than or equal to $5\times10^{17}$ atoms/cm³, and yet furthermore preferably lower than or equal to $1\times10^{16}$ atoms/cm³. In contrast, the hydrogen concentration in the oxide semiconductor film 19b having conductivity is higher than or equal to $8\times10^{19}$ atoms/cm³, preferably higher than or equal to $1\times10^{20}$ atoms/cm³, and more preferably higher than or equal to $5\times10^{20}$ atoms/cm³. The hydrogen concentration in the oxide semiconductor film 19b having conductivity is greater than or equal to 2 times, preferably greater than or equal to 10 times that in the oxide semiconductor film 19a.

The oxide semiconductor film 19b having conductivity has lower resistivity than the oxide semiconductor film 19a. The resistivity of the oxide semiconductor film 19b having conductivity is preferably higher than or equal to $1\times10^{-8}$ times and lower than $1\times10^{-1}$ times the resistivity of the oxide semiconductor film 19a. The resistivity of the oxide semiconductor film 19b having conductivity is typically higher than or equal to $1\times10^{-3}$ Ωcm and lower than $1\times10^{4}$ Ωcm, preferably higher than or equal to $1\times10^{-3}$ Ωcm and lower than $1\times10^{-1}$ Ωcm.

The oxide semiconductor film 19a and the oxide semiconductor film 19b having conductivity can each have a crystal structure similar to that of the oxide semiconductor film 155b having conductivity shown in Embodiment 1, as appropriate.

The conductive films 21a and 21b serving as a source electrode and a drain electrode can be formed using the structure and materials for the conductive film 159 in Embodiment 1 as appropriate.

As the oxide insulating film 23 or the oxide insulating film 25, an oxide insulating film which contains more oxygen than that in the stoichiometric composition is preferably used. Here, as the oxide insulating film 23, an oxide insulating film which permeates oxygen is formed, and as the oxide insulating film 25, an oxide insulating film which contains more oxygen than that in the stoichiometric composition is formed.

The oxide insulating film 23 is an oxide insulating film through which oxygen is permeated. Thus, oxygen released from the oxide insulating film 25 provided over the oxide insulating film 23 can be moved to the oxide semiconductor film 19a through the oxide insulating film 23. Moreover, the oxide insulating film 23 also serves as a film that relieves damage to the oxide semiconductor film 19a at the time of forming the oxide insulating film 25 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23.

Furthermore, the oxide insulating film 23 is preferably an oxide insulating film containing nitrogen and having a small number of defects.

Typical examples of the oxide insulating film containing nitrogen and having a small number of defects include a silicon oxynitride film and an aluminum oxynitride film.

In an ESR spectrum at 100 K or lower of the oxide insulating film with a small number of defects, a first signal that appears at a g-factor of 2.037 to 2.039, a second signal that appears at a g-factor of 2.001 to 2.003, and a third signal that appears at a g-factor of 1.964 to 1.966 are observed. The split width of the first and second signals and the split width of the second and third signals that are obtained by ESR measurement using an X-band are each approximately 5 mT. The sum of the spin densities of the first signal that appears at a g-factor of 2.037 to 2.039, the second signal that appears at a g-factor of 2.001 to 2.003, and the third signal that appears at a g-factor of 1.964 to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of 2.037 to 2.039, the second signal that appears at a g-factor of 2.001 to 2.003, and the third signal that appears at a g-factor of 1.964 to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of 2.037 to 2.039, the second signal that appears at a g-factor of 2.001 to 2.003, and the third signal that appears at a g-factor of 1.964 to 1.966 is, the lower the content of nitrogen oxide in the oxide insulating film is.

When the oxide insulating film 23 contains a small amount of nitrogen oxide as described above, the carrier trap at the interface between the oxide insulating film 23 and the oxide semiconductor film can be reduced. Thus, the amount of change in the threshold voltage of the transistor included in the semiconductor device can be reduced, which leads to a reduced change in the electrical characteristics of the transistor.

The oxide insulating film 23 preferably has a nitrogen concentration measured by secondary ion mass spectrometry (SIMS) of $6\times10^{20}$ atoms/cm$^3$ or lower. In that case, nitrogen oxide is unlikely to be generated in the oxide insulating film 23, so that the carrier trap at the interface between the oxide insulating film 23 and the oxide semiconductor film 19a can be reduced. Furthermore, the amount of change in the threshold voltage of the transistor included in the semiconductor device can be reduced, which leads to a reduced change in the electrical characteristics of the transistor.

Note that when nitride oxide and ammonia are contained in the oxide insulating film 23, the nitride oxide and ammonia react with each other in heat treatment in the manufacturing process; accordingly, the nitride oxide is released as a nitrogen gas. Thus, the nitrogen concentration and the amount of nitrogen oxide in the oxide insulating film 23 can be reduced. Moreover, the carrier trap at the interface between the oxide insulating film 23 and the oxide semiconductor film 19a can be reduced. Furthermore, the amount of change in the threshold voltage of the transistor included in the semiconductor device can be reduced, which leads to a reduced change in the electrical characteristics of the transistor.

Note that in the oxide insulating film 23, all oxygen entering the oxide insulating film 23 from the outside does not move to the outside of the oxide insulating film 23 and some oxygen remains in the oxide insulating film 23. Furthermore, movement of oxygen occurs in the oxide insulating film 23 in some cases in such a manner that oxygen enters the oxide insulating film 23 and oxygen contained in the oxide insulating film 23 is moved to the outside of the oxide insulating film 23.

When the oxide insulating film through which oxygen passes is formed as the oxide insulating film 23, oxygen released from the oxide insulating film 25 provided over the oxide insulating film 23 can be moved to the oxide semiconductor film 19a through the oxide insulating film 23.

The oxide insulating film 25 is formed in contact with the oxide insulating film 23. The oxide insulating film 25 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film which contains oxygen at a higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the surface temperature of the oxide insulating film 25 in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness of 30 nm to 500 nm, preferably 50 nm to 400 nm can be used as the oxide insulating film 25.

It is preferable that the amount of defects in the oxide insulating film 25 be small and typically, the spin density of a signal that appears at g=2.001 be lower than $1.5\times10^{18}$ spins/cm$^3$, more preferably lower than or equal to $1\times10^{18}$ spins/cm$^3$ by ESR measurement. Note that the oxide insulating film 25 is provided more apart from the oxide semiconductor film 19a than the oxide insulating film 23 is; thus, the oxide insulating film 25 may have higher defect density than the oxide insulating film 23.

Like the nitride insulating film 15, the nitride insulating film 27 can be a nitride insulating film which is hardly permeated by oxygen. Furthermore, a nitride insulating film which is hardly permeated by oxygen, hydrogen, and water can be used.

The nitride insulating film 27 is formed using a silicon nitride film, a silicon nitride oxide film, an aluminum nitride film, an aluminum nitride oxide film, or the like with a thickness of 50 nm to 300 nm, preferably 100 nm to 200 nm.

In the case where the oxide insulating film which contains oxygen at a higher proportion than the stoichiometric composition is included in the oxide insulating film 23 or the oxide insulating film 25, part of oxygen contained in the oxide insulating film 23 or the oxide insulating film 25 can be moved to the oxide semiconductor film 19a, so that the amount of oxygen vacancies contained in the oxide semiconductor film 19a can be reduced.

The threshold voltage of a transistor using an oxide semiconductor film with oxygen vacancies easily shifts in the negative direction, and such a transistor tends to be normally on. This is because charges are generated owing to oxygen vacancies in the oxide semiconductor film and the resistance is thus reduced. The transistor having normally-on characteristics causes various problems in that malfunction is likely to be caused when in operation and that power consumption is increased when not in operation, for example. Furthermore, there is a problem in that the amount of change in the electrical characteristics, typically the threshold voltage, of the transistor is increased by change over time or due to a stress test.

However, in the transistor 102 in this embodiment, the oxide insulating film 23 or the oxide insulating film 25 provided over the oxide semiconductor film 19a contains oxygen at a higher proportion than the stoichiometric composition. Furthermore, the oxide semiconductor film 19a, the oxide insulating film 23, and the oxide insulating film 25 are surrounded by the nitride insulating film 15 and the oxide insulating film 17. As a result, oxygen contained in the oxide insulating film 23 or the oxide insulating film 25 is moved to the oxide semiconductor film 19a efficiently, so that the amount of oxygen vacancies in the oxide semiconductor film 19a can be reduced. Accordingly, a transistor having normally-off characteristics is obtained. Furthermore, the amount of change in the electrical characteristics, typically the threshold voltage, of the transistor over time or due to a stress test can be reduced.

The common electrode 29 is formed using a light-transmitting film, preferably a light-transmitting conductive film. Examples of the light-transmitting conductive film include an indium oxide film containing tungsten oxide, an indium zinc oxide film containing tungsten oxide, an indium oxide film containing titanium oxide, an indium tin oxide film containing titanium oxide, an ITO film, an indium zinc oxide film, and an indium tin oxide film to which silicon oxide is added.

The common electrode 29 may be formed using the oxide semiconductor film 155b having conductivity shown in Embodiment 1.

The extending direction of the conductive film 21a functioning as a signal line and the extending direction of the common electrode 29 intersect with each other. Therefore, the electric field between the conductive film 21a functioning as a signal line and the common electrode 29 and the electric field between the oxide semiconductor film 19b having conductivity and the common electrode 29 have a large difference in direction. Accordingly, in the case where negative liquid crystal molecules are used, the alignment state of the liquid crystal molecules in the vicinity of the conductive film functioning as a signal line is less likely to be affected by the alignment state of the liquid crystal molecules in the vicinity of the pixel electrode which is generated by an electric field between the pixel electrodes provided in adjacent pixels and the common electrode. Thus, a change in the transmittance of the pixels is suppressed, so that flickers in an image can be reduced.

In the liquid crystal display device having a low refresh rate, alignment of liquid crystal molecules in the vicinity of the conductive film 21a functioning as a signal line is less likely to affect alignment state of liquid crystal molecules in the vicinity of the pixel electrode due to the electric field between the pixel electrodes in the adjacent pixels and the common electrode 29 even during the retention period. Thus, the transmittance of the pixels in the retention period can be held and flickers can be reduced.

The common electrode 29 includes the stripe regions extending in a direction intersecting with the conductive film 21a functioning as a signal line. Accordingly, in the vicinity of the oxide semiconductor film 19b having conductivity and the conductive film 21a, unintended alignment of liquid crystal molecules can be prevented and thus light leakage can be suppressed. As a result, a display device with excellent contrast can be manufactured.

Note that the shape of the common electrode 29 is not limited to that illustrated in FIG. 32, and may be stripe. In the case of a stripe shape, the extending direction may be parallel to the conductive film functioning as a signal line. The common electrode 29 may have a comb shape. Alternatively, the common electrode may be formed over the entire surface of the first substrate 11. Further alternatively, a light-transmitting conductive film different from the oxide semiconductor film 19b having conductivity may be formed over the common electrode 29 with an insulating film provided therebetween.

The thickness of the organic insulating film 31 is preferably greater than or equal to 500 nm and less than or equal to 10 μm. The thickness of the organic insulating film 31 in FIG. 33 is smaller than a gap between the inorganic insulating film 30 formed over the first substrate 11 and the element layer formed on the second substrate 342. Therefore, the liquid crystal layer 320 is provided between the organic insulating film 31 and the element layer formed on the second substrate 342. In other words, the liquid crystal layer 320 is provided between the alignment film 33 over the organic insulating film 31 and an alignment film 352 included in the element layer on the second substrate 342.

Note that although not illustrated, the alignment film 33 over the organic insulating film 31 and the alignment film 352 included in the element layer on the second substrate 342 may be in contact with each other. In this case, the organic insulating film 31 functions as a spacer; therefore, the cell gap of the liquid crystal display device can be maintained with the organic insulating film 31.

Although the alignment film 33 is provided over the organic insulating film in FIG. 33, one embodiment of the present invention is not limited thereto. Depending on circumstances or conditions, the organic insulating film 31 may be provided over the alignment film 33. In this case, a rubbing step may be performed, for example, after the formation of the organic insulating film 31 over the alignment film 33 instead of directly after the formation of the alignment film 33.

When a negative voltage is applied to the conductive film 13 functioning as a gate electrode, an electric field is generated. The electric field is not blocked with the oxide semiconductor film 19a and affects the inorganic insulating film 30; therefore, the surface of the inorganic insulating film 30 is weakly positively charged. Moreover, when a negative voltage is applied to the conductive film 13 functioning as a gate electrode, positively charged particles contained in the air are adsorbed on the surface of the inorganic insulating film 30 and weak positive electric charges are generated on the surface of the inorganic insulating film 30.

The surface of the inorganic insulating film 30 is positively charged, so that an electric field is generated and the electric field affects the interface between the oxide semiconductor film 19a and the inorganic insulating film 30. Thus, the interface between the oxide semiconductor film 19a and the inorganic insulating film 30 is in a state in which a positive bias is substantially applied and therefore the threshold voltage of the transistor shifts in the negative direction.

On the other hand, the transistor 102 shown in this embodiment includes the organic insulating film 31 over the inorganic insulating film 30. Since the thickness of the organic insulating film 31 is as large as 500 nm or more, the electric field generated by application of a negative voltage to the conductive film 13 functioning as a gate electrode does not affect the surface of the organic insulating film 31 and the surface of the organic insulating film 31 is unlikely to be positively charged. In addition, even when positively charged particles in the air are adsorbed on the surface of the organic insulating film 31, the electric field of the positively charged particles adsorbed on the surface of the organic insulating film 31 is less likely to affect the interface between the oxide semiconductor film 19a and the inorganic insulating film 30, because the organic insulating film 31 is thick (greater than or equal to 500 nm). Thus, the interface between the oxide semiconductor film 19a and the inorganic insulating film 30 is not in a state in which a positive bias is substantially applied and therefore the amount of change in the threshold voltage of the transistor is small.

Although water or the like diffuses easily in the organic insulating film 31, water from the outside does not diffuse to a semiconductor device through the organic insulating film 31 because the organic insulating film is isolated in each transistor 10. In addition, a nitride insulating film is included in the inorganic insulating film 30, whereby water diffused in the organic insulating film 31 can be prevented from diffusing to the oxide semiconductor film 19a.

The alignment film 33 is formed over the common electrode 29, the nitride insulating film 27, and the organic insulating film 31.

Next, a method for manufacturing the transistor 102 and the capacitor 105 in FIG. 33 will be described with reference to FIGS. 34A to 34D, FIGS. 35A to 35C, and FIGS. 36A to 36C.

Figure 34A:
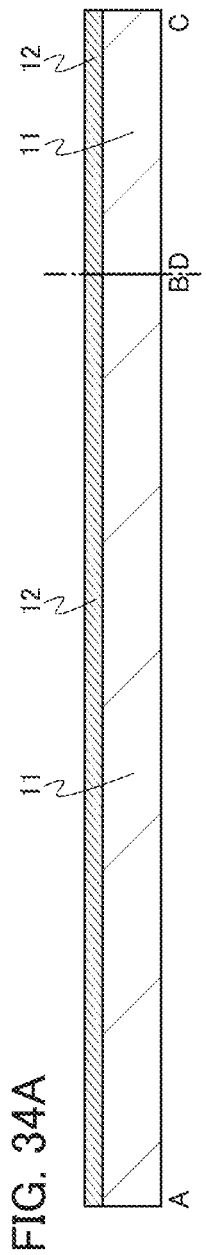
FIGS. 34A to 34D are cross-sectional views illustrating one mode of a method for manufacturing the display device.

As illustrated in FIG. 34A, a conductive film 12 to be the conductive film 13 is formed over the first substrate 11. The conductive film 12 is formed by a sputtering method, a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, or the like. When a metal organic chemical vapor deposition (MOCVD) method, a metal chemical deposition method, or an atomic layer deposition (ALD) method is employed, the conductive film is less damaged by plasma. Furthermore, in the case where the oxide semiconductor film 155b having conductivity shown in Embodiment 1 is used as the conductive film 12, the manufacturing method of the oxide semiconductor film 155b having conductivity can be used as appropriate.

Here, a glass substrate is used as the first substrate 11. Furthermore, as the conductive film 12, a 100-nm-thick tungsten film is formed by a sputtering method.

Figure 34B:
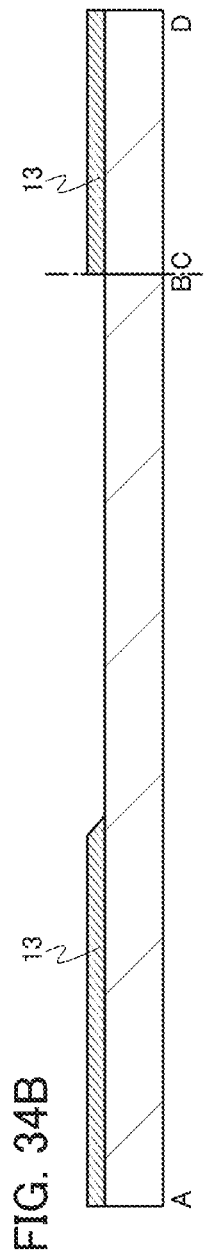

Next, a mask is formed over the conductive film 12 by a photolithography process using a first photomask. Then, as illustrated in FIG. 34B, part of the conductive film 12 is etched with the use of the mask to form the conductive film 13 functioning as a gate electrode. After that, the mask is removed.

Note that the conductive film 13 functioning as a gate electrode may be formed by an electrolytic plating method, a printing method, an ink-jet method, or the like instead of the above formation method.

Here, the tungsten film is etched by a dry etching method to form the conductive film 13 functioning as a gate electrode.

Figure 34C:
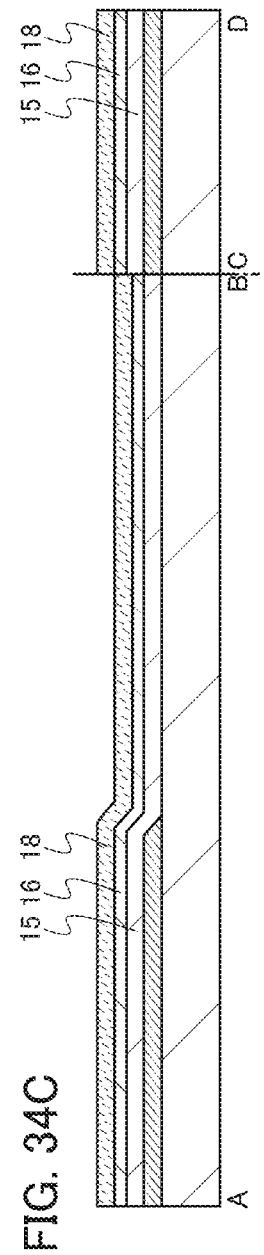

Next, as illustrated in FIG. 34C, over the conductive film 13 functioning as a gate electrode, the nitride insulating film 15 and an oxide insulating film 16 to be the oxide insulating film 17 later are formed. Then, over the oxide insulating film 16, an oxide semiconductor film 18 to be the oxide semiconductor film 19a and the oxide semiconductor film 19b having conductivity later is formed.

The nitride insulating film 15 and the oxide insulating film 16 are each formed by a sputtering method, a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, a coating method, a printing method, or the like. When a metal organic chemical vapor deposition (MOCVD) method, a metal chemical deposition method, or an atomic layer deposition (ALD) method is employed, the nitride insulating film 15 and the oxide insulating film 16 are less damaged by plasma. When an atomic layer deposition (ALD) method is employed, coverage of the nitride insulating film 15 and the oxide insulating film 16 can be increased.

Here, as the nitride insulating film 15, a 300-nm-thick silicon nitride film is formed by a plasma CVD method in which silane, nitrogen, and ammonia are used as a source gas.

In the case where a silicon oxide film, a silicon oxynitride film, or a silicon nitride oxide film is formed as the oxide insulating film 16, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case of forming a gallium oxide film as the oxide insulating film 16, a metal organic chemical vapor deposition (MOCVD) method can be employed.

Here, as the oxide insulating film 16, a 50-nm-thick silicon oxynitride film is formed by a plasma CVD method in which silane and dinitrogen monoxide are used as a source gas.

The oxide semiconductor film 18 can be formed by a method that is similar to that of the oxide semiconductor film 155 described in Embodiment 1 as appropriate.

Here, a 35-nm-thick In—Ga—Zn oxide film is formed as the oxide semiconductor film by a sputtering method using an In—Ga—Zn oxide target (In:Ga:Zn=1:1:1).

Figure 34D:
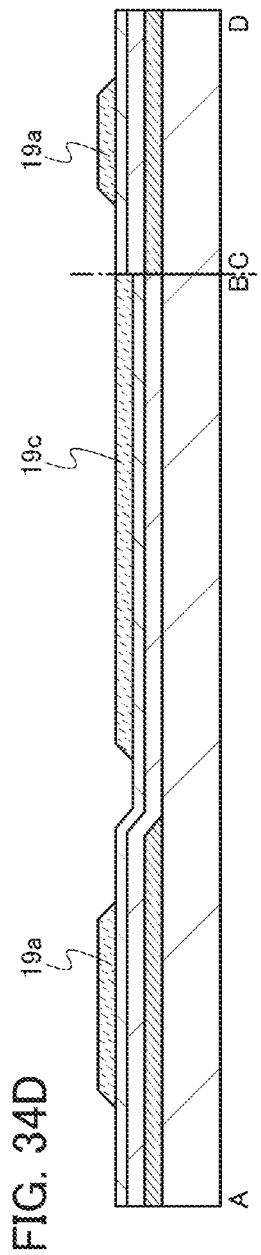

Then, after a mask is formed over the oxide semiconductor film 18 by a photolithography process using a second photomask, the oxide semiconductor film is partly etched using the mask. Thus, the oxide semiconductor film 19a and an oxide semiconductor film 19c which are isolated from each other as illustrated in FIG. 34D are formed. After that, the mask is removed.

Here, the oxide semiconductor films 19a and 19c are formed in such a manner that a mask is formed over the oxide semiconductor film 18 and part of the oxide semiconductor film 18 is etched by a wet etching method.

Figure 35A:
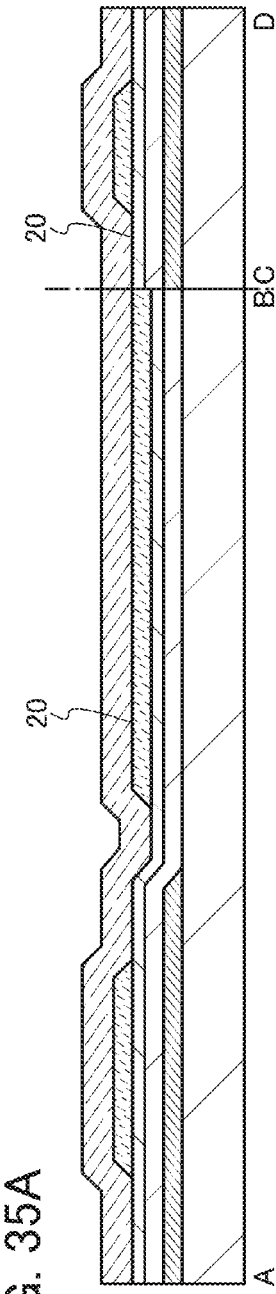
FIGS. 35A to 35C are cross-sectional views illustrating one mode of the method for manufacturing the display device.

Next, as illustrated in FIG. 35A, a conductive film 20 to be the conductive films 21a and 21b later is formed.

The conductive film 20 can be formed by a method similar to that of the conductive film 159 described in Embodiment 1 as appropriate.

Here, a 50-nm-thick Cu—Mn alloy film and a 300-nm-thick copper film are sequentially stacked by a sputtering method.

Figure 35B:
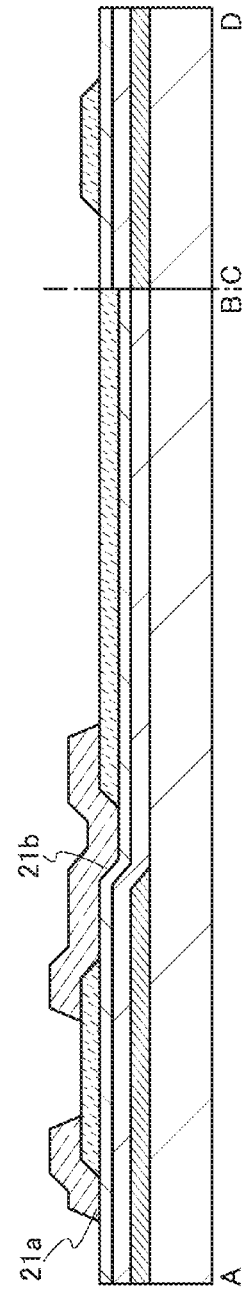

Next, a mask is formed over the conductive film 20 by a photolithography process using a third photomask. Then, the conductive film 20 is etched using the mask, so that the conductive films 21a and 21b serving as a source electrode and a drain electrode are formed as illustrated in FIG. 35B. After that, the mask is removed.

Here, a mask is formed over the copper film by a photolithography process. Then, the Cu—Mn film and the copper film are etched with the use of the mask, so that the conductive films 21a and 21b are formed. Note that by using a wet etching method, the Cu—Mn film and the copper film can be etched in one step so as to form the conductive films 21a and 21b.

Figure 35C:
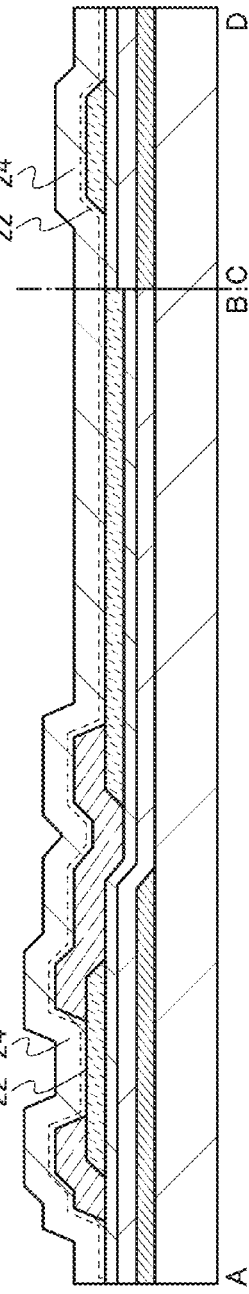

Next, as illustrated in FIG. 35C, an oxide insulating film 22 to be the oxide insulating film 23 later and an oxide insulating film 24 to be the oxide insulating film 25 later are formed over the oxide semiconductor films 19a and 19c and the conductive films 21a and 21b. The oxide insulating film 22 and the oxide insulating film 24 can each be formed by a method similar to those of the nitride insulating film 15 and the oxide insulating film 16 as appropriate.

Note that after the oxide insulating film 22 is formed, the oxide insulating film 24 is preferably formed in succession without exposure to the air. After the oxide insulating film 22 is formed, the oxide insulating film 24 is formed in succession by adjusting at least one of the flow rate of a source gas, pressure, a high-frequency power, and a substrate temperature without exposure to the air, reducing the impurity concentration attributed to the atmospheric component at the interface between the oxide insulating film 22 and the oxide insulating film 24. In addition, oxygen in the oxide insulating film 24 can be moved to the oxide semiconductor film 19a; accordingly, the amount of oxygen vacancies in the oxide semiconductor film 19a can be reduced.

As the oxide insulating film 22, an oxide insulating film containing nitrogen and having a small number of defects can be formed by a CVD method under the conditions where the ratio of an oxidizing gas to a deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

A deposition gas containing silicon and an oxidizing gas are preferably used as the source gas of the oxide insulating film 22. Typical examples of the deposition gas containing silicon include silane, disilane, trisilane, and silane fluoride. Examples of the oxidizing gas include oxygen, ozone, dinitrogen monoxide, and nitrogen dioxide.

With the use of the above conditions, an oxide insulating film which permeates oxygen can be formed as the oxide insulating film 22. Furthermore, by providing the oxide insulating film 22, damage to the oxide semiconductor film 19a can be reduced in the step of forming the oxide insulating film 24.

Here, as the oxide insulating film 22, a 50-nm-thick silicon oxynitride film is formed by a plasma CVD method in which silane with a flow rate of 50 sccm and dinitrogen monoxide with a flow rate of 2000 sccm are used as a source gas, the pressure in the treatment chamber is 20 Pa, the substrate temperature is 220° C., and a high-frequency power of 100 W is supplied to parallel-plate electrodes with the use of a 27.12 MHz high-frequency power source. Under the above conditions, a silicon oxynitride film containing nitrogen and having a small number of defects can be formed.

As the oxide insulating film 24, a silicon oxide film or a silicon oxynitride film is formed under the following conditions: the substrate placed in a treatment chamber of a plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. Examples of the oxidizing gas include oxygen, ozone, dinitrogen monoxide, and nitrogen dioxide.

As the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition. In contrast, in the film formed at a substrate temperature within the above temperature range, the bond between silicon and oxygen is weak, and accordingly, part of oxygen in the film is released by heat treatment in a later step. It is thus possible to form an oxide insulating film which contains oxygen at a higher proportion than the stoichiometric composition and from which part of oxygen is released by heating. Furthermore, since the oxide insulating film 22 is provided over the oxide semiconductor film 19a, in the step of forming the oxide insulating film 24, the oxide insulating film 22 serves as a protective film of the oxide semiconductor film 19a. Consequently, the oxide insulating film 24 can be formed using the high-frequency power having a high power density while damage to the oxide semiconductor film 19a is reduced.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C., and a high-frequency power of 1500 W is supplied to the parallel-plate electrodes with the use of a 27.12 MHz high-frequency power source. Note that the plasma CVD apparatus is a parallel-plate plasma CVD apparatus in which the electrode area is 6000 cm$^2$, and the power per unit area (power density) into which the supplied power is converted is 0.25 W/cm$^2$.

Furthermore, when the conductive films 21a and 21b functioning as a source electrode and a drain electrode are formed, the oxide semiconductor film 19a is damaged by the etching of the conductive film, so that oxygen vacancies are generated on the back channel side of the oxide semiconductor film 19a (the side of the oxide semiconductor film 19a which is opposite to the side facing the conductive film 13 functioning as a gate electrode). However, with the use of the oxide insulating film which contains oxygen at a higher proportion than the stoichiometric composition as the oxide insulating film 24, the oxygen vacancies generated on the back channel side can be repaired by heat treatment. By this, defects contained in the oxide semiconductor film 19a can be reduced, which improves the reliability of the transistor 102.

Then, a mask is formed over the oxide insulating film 24 by a photolithography process using a fourth photomask.

Next, as illustrated in FIG. 36A, part of the oxide insulating film 22 and part of the oxide insulating film 24 are etched with the use of the mask to form the oxide insulating film 23 and the oxide insulating film 25 having the opening 40. After that, the mask is removed.

In the process, the oxide insulating films 22 and 24 are preferably etched by a dry etching method. As a result, the oxide semiconductor film 19c is exposed to plasma in the etching treatment; thus, the amount of oxygen vacancies in the oxide semiconductor film 19c can be increased.

Next, heat treatment is performed. The heat treatment is performed typically at a temperature higher than or equal to 150° C. and lower than or equal to 400° C., preferably higher than or equal to 300° C. and lower than or equal to 400° C., and more preferably higher than or equal to 320° C. and lower than or equal to 370° C.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 25 can be moved to the oxide semiconductor film 19a, so that the amount of oxygen vacancies contained in the oxide semiconductor film 19a can be further reduced.

In the case where water, hydrogen, or the like enters the oxide insulating films 23 and 25 and the nitride insulating film 26 has a barrier property against water, hydrogen, or the like, when the nitride insulating film 26 is formed later and heat treatment is performed, water, hydrogen, or the like contained in the oxide insulating films 23 and 25 is moved to the oxide semiconductor film 19a, so that defects are generated in the oxide semiconductor film 19a. However, by the heating, water, hydrogen, or the like contained in the oxide insulating films 23 and 25 can be released; thus, variation in the electrical characteristics of the transistor 102 can be reduced, and a change in threshold voltage can be suppressed.

Note that when the oxide insulating film 24 is formed over the oxide insulating film 22 while being heated, oxygen can be moved to the oxide semiconductor film 19a to reduce the amount of oxygen vacancies in the oxide semiconductor film 19a; thus, the heat treatment is not necessarily performed.

The heat treatment may be performed after the formation of the oxide insulating films 22 and 24. However, the heat treatment is preferably performed after the formation of the oxide insulating films 23 and 25 because oxygen is not moved to the oxide semiconductor film 19c and oxygen is released from the oxide semiconductor film 19c because of exposure of the oxide semiconductor film 19c and then oxygen vacancies are generated, whereby a film having higher conductivity can be formed.

Here, the heat treatment is performed at 350° C. for one hour in a mixed atmosphere of nitrogen and oxygen.

Then, as illustrated in FIG. 36B, the nitride insulating film 26 is formed.

The nitride insulating film 26 can be formed by a method similar to those of the nitride insulating film 15 and the oxide insulating film 16 as appropriate. By forming the nitride insulating film 26 by a sputtering method, a CVD method, or the like, the oxide semiconductor film 19c is exposed to plasma, which increases the amount of oxygen vacancies in the oxide semiconductor film 19c.

The oxide semiconductor film 19c has improved conductivity, and becomes the oxide semiconductor film 19b having conductivity. When a silicon nitride film is formed by a plasma CVD method as the nitride insulating film 26, hydrogen contained in the silicon nitride film is diffused to the oxide semiconductor film 19c; thus, the conductivity of the oxide semiconductor film can be enhanced. As a manufacturing method of the oxide semiconductor film 19b having conductivity, the manufacturing method of the oxide semiconductor film 155b having conductivity shown in Embodiment 1 can be used.

In the case where a silicon nitride film is formed by a plasma CVD method as the nitride insulating film 26, the substrate placed in the treatment chamber of the plasma CVD apparatus that is vacuum-evacuated is preferably held at a temperature higher than or equal to 300° C. and lower than or equal to 400° C. more preferably higher than or equal to 320° C. and lower than or equal to 370° C., so that a dense silicon nitride film can be formed.

In the case where a silicon nitride film is formed, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen are few, can be formed. In contrast, when the amount of ammonia is larger than the amount of nitrogen in the source gas, cleavage of a deposition gas containing silicon and cleavage of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, more preferably greater than or equal to 10 and less than or equal to 50.

Here, in the treatment chamber of a plasma CVD apparatus, a 50-nm-thick silicon nitride film is formed as the nitride insulating film 26 by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C. and a high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 $cm^2$, and the power per unit area (power density) into which the supplied power is converted is $1.7 \times 10^{-1}$ W/$cm^2$.

Next, heat treatment may be performed. The heat treatment is performed typically at a temperature higher than or equal to 150° C. and lower than or equal to 400° C., preferably higher than or equal to 300° C. and lower than or equal to 400° C., and more preferably higher than or equal to 320° C. and lower than or equal to 370° C. As a result, the negative shift of the threshold voltage can be reduced. Moreover, the amount of change in the threshold voltage can be reduced.

Next, although not illustrated, a mask is formed by a photolithography process using a fifth photomask. Then, part of each of the nitride insulating film 15, the oxide insulating film 16, the oxide insulating film 23, the oxide insulating film 25, and the nitride insulating film 26 is etched using the mask to form the nitride insulating film 27 and an opening through which part of a connection terminal formed at the same time as the conductive film 13 is exposed. Alternatively, part of each of the oxide insulating film 23, the oxide insulating film 25, and the nitride insulating film 26 is etched to form the nitride insulating film 27 and an opening through which part of a connection terminal formed at the same time as the conductive films 21a and 21b is exposed.

Next, as illustrated in FIG. 36C, a conductive film 28 to be the common electrode 29 later is formed over the nitride insulating film 27.

The conductive film 28 is formed by a sputtering method, a CVD method, an evaporation method, or the like.

Furthermore, in the case where the oxide semiconductor film 155b having conductivity shown in Embodiment 1 is used as the conductive film 28, the manufacturing method of the oxide semiconductor film 155b having conductivity can be used as appropriate.

Then, a mask is formed over the conductive film 28 by a photolithography process using a sixth photomask. Next, as illustrated in FIG. 37A, part of the conductive film 28 is etched with the use of the mask to form the common electrode 29. Although not illustrated, the common electrode 29 is connected to the connection terminal formed at the same time as the conductive film 13 or the connection terminal formed at the same time as the conductive films 21a and 21b. After that, the mask is removed.

Next, as illustrated in FIG. 37B, the organic insulating film 31 is formed over the nitride insulating film 27. An organic insulating film can be formed by a coating method, a printing method, or the like as appropriate.

In the case where the organic insulating film is formed by a coating method, a photosensitive composition, with which the upper surfaces of the nitride insulating film 27 and the common electrode 29 are coated, is exposed to light and developed by photolithography process using a seventh photomask, and is then subjected to heat treatment. Note that in the case where the upper surfaces of the nitride insulating film 27 and the common electrode 29 are coated with a non-photosensitive composition, a resist, with which the upper surface of the non-photosensitive composition is coated, is processed by a photolithography process using the seventh photomask to form a mask, and then the non-photosensitive composition is etched using the mask, whereby the organic insulating film 31 can be formed.

Through the above process, the transistor 102 and the capacitor 105 can be manufactured.

The element substrate of the display device described in this embodiment includes an organic insulating film overlapping with a transistor with an inorganic insulating film provided therebetween. Therefore, the reliability of the transistor can be improved and a display device with display quality maintained can be manufactured.

The element substrate of the display device of this embodiment is provided with a common electrode whose upper surface has a zigzag shape and which includes stripe regions extending in a direction intersecting with the conductive film functioning as a signal line. Therefore, the display device can have excellent contrast. In addition, flickers can be reduced in a liquid crystal display device having a low refresh rate.

In the element substrate of the display device of this embodiment, the oxide semiconductor film having conductivity serving as the pixel electrode is formed at the same time as the oxide semiconductor film of the transistor, in which the channel region is formed; therefore, the transistor 102 and the capacitor 105 can be formed using six photomasks. The oxide semiconductor film having conductivity functions as one electrode of the capacitor. The common electrode functions as the other electrode of the capacitor. Thus, a step of forming another conductive film is not needed to form the capacitor, which reduces the number of steps of manufacturing the display device. The capacitor has a light-transmitting property. As a result, the area occupied by the capacitor can be increased and the aperture ratio in a pixel can be increased. Moreover, the power consumption of the display device can be reduced.

Next, the element layer formed on the second substrate 342 is described. A film having a colored property (hereinafter referred to as a coloring film 346) is formed on the second substrate 342. The coloring film 346 functions as a color filter. Furthermore, a light-blocking film 344 adjacent to the coloring film 346 is formed on the second substrate 342. The light-blocking film 344 functions as a black matrix. The coloring film 346 is not necessarily provided in the case where, for example, the liquid crystal display device is a monochrome display device.

The coloring film 346 is a coloring film that transmits light in a specific wavelength range. For example, a red (R) film that transmits light in a red wavelength range, a green (G) film that transmits light in a green wavelength range, and a blue (B) film that transmits light in a blue wavelength range can be used.

The light-blocking film 344 preferably has a function of blocking light in a specific wavelength range, and can be, for example, a metal film or an organic insulating film including a black pigment or the like.

An insulating film 348 is formed on the coloring film 346. The insulating film 348 functions as a planarization layer or suppresses diffusion of impurities in the coloring film 346 to the liquid crystal element side.

A conductive film 350 is formed on the insulating film 348. The conductive film 350 is formed using a light-transmitting conductive film. The potential of the conductive film 350 is preferably the same as that of the common electrode 29. In other words, a common potential is preferably applied to the conductive film 350.

When a voltage for driving the liquid crystal molecules is applied to the conductive film 21b, an electric field is generated between the conductive film 21b and the common electrode 29. Liquid crystal molecules between the conductive film 21b and the common electrode 29 align due to the effect of the electric field and thus a flicker is generated.

However, the conductive film 350 is provided to face the common electrode 29 through the liquid crystal layer 320 and the common electrode 29 and the conductive film 350 have the same potential, whereby it is possible to suppress an alignment change of liquid crystal molecules in a direction perpendicular to the substrate due to an electric field between the conductive film 21b and the common electrode 29. Accordingly, the alignment state of the liquid crystal molecules in the region is stabilized. Thus, flickers can be reduced.

Note that the alignment film 352 is formed on the conductive film 350.

In addition, the liquid crystal layer 320 is formed between the alignment films 33 and 352. The liquid crystal layer 320 is sealed between the first substrate 11 and the second substrate 342 with the use of a sealant (not illustrated). The sealant is preferably in contact with an inorganic material to prevent entry of moisture and the like from the outside.

A spacer may be provided between the alignment films 33 and 352 to maintain the thickness of the liquid crystal layer 320 (also referred to as a cell gap).

The structures, methods, and the like shown in this embodiment can be used in appropriate combination with any of the structures, methods, and the like shown in the other embodiments.

Modification Example 1

Figure 38:
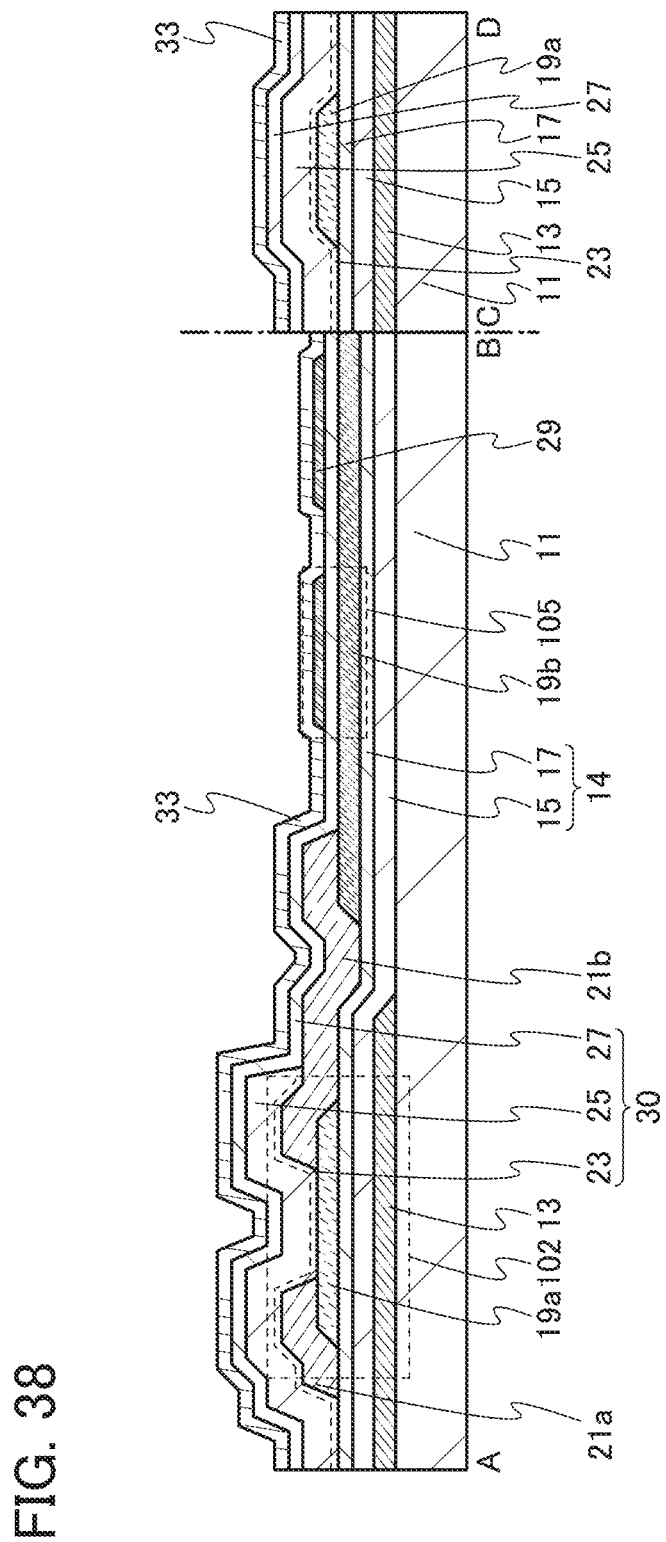
FIG. 38 is a cross-sectional view illustrating one mode of the display device.

FIG. 38 illustrates a modification example of the display device in FIG. 33.

In a display device in FIG. 38, an organic resin film is not formed over the inorganic insulating film 30, and the alignment film 33 is in contact with the inorganic insulating film 30. As a result, a photomask for forming the element layer over the substrate 11 can be omitted, which simplifies of the manufacturing process of the first substrate 11 provided with the element layer.

Modification Example 2

Figure 39:
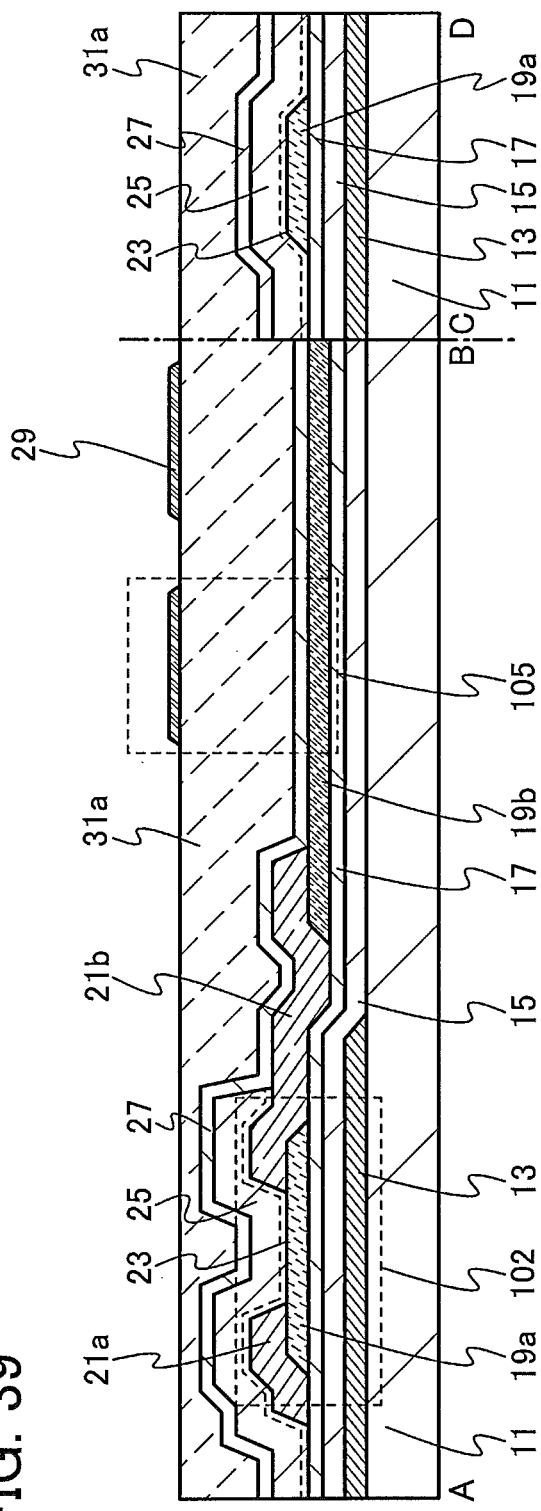
FIG. 39 is a cross-sectional view illustrating one mode of the display device.

FIG. 39 illustrates a modification example of the display device in FIG. 33.

In a display device in FIG. 39, a continuous organic resin film 31a that is not divided is formed over the nitride insulating film 27. Furthermore, the common electrode 29 is formed over the organic resin film 31a. The organic resin film 31a serves as a planarization film; thus, irregularity in alignment of liquid crystal molecules included in the liquid crystal layer can be reduced.

Modification Example 3

Figure 40:
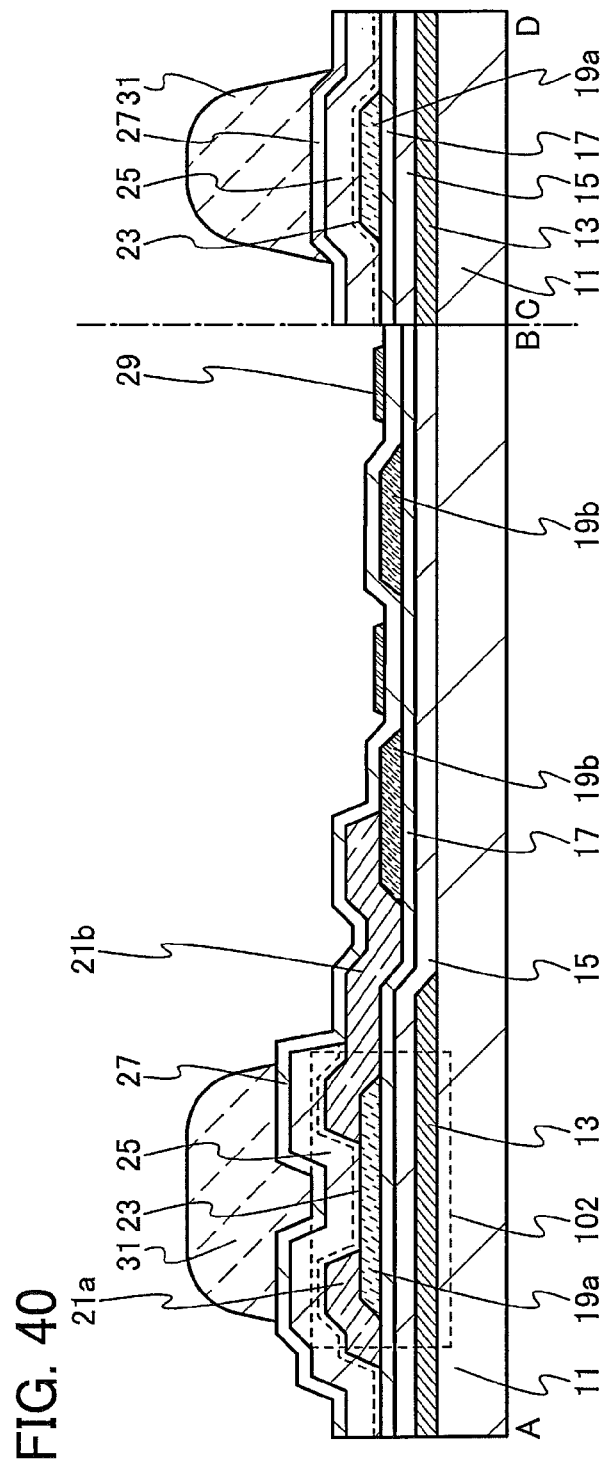
FIG. 40 is a cross-sectional view illustrating one mode of the display device.

FIG. 40 illustrates a modification example of the display device in FIG. 33.

The conductive oxide semiconductor film 19b in FIG. 40 which serves as a pixel electrode has a slit. Note that the oxide semiconductor film 19b having conductivity may have a comb-like shape.

Modification Example 4

Figure 41:
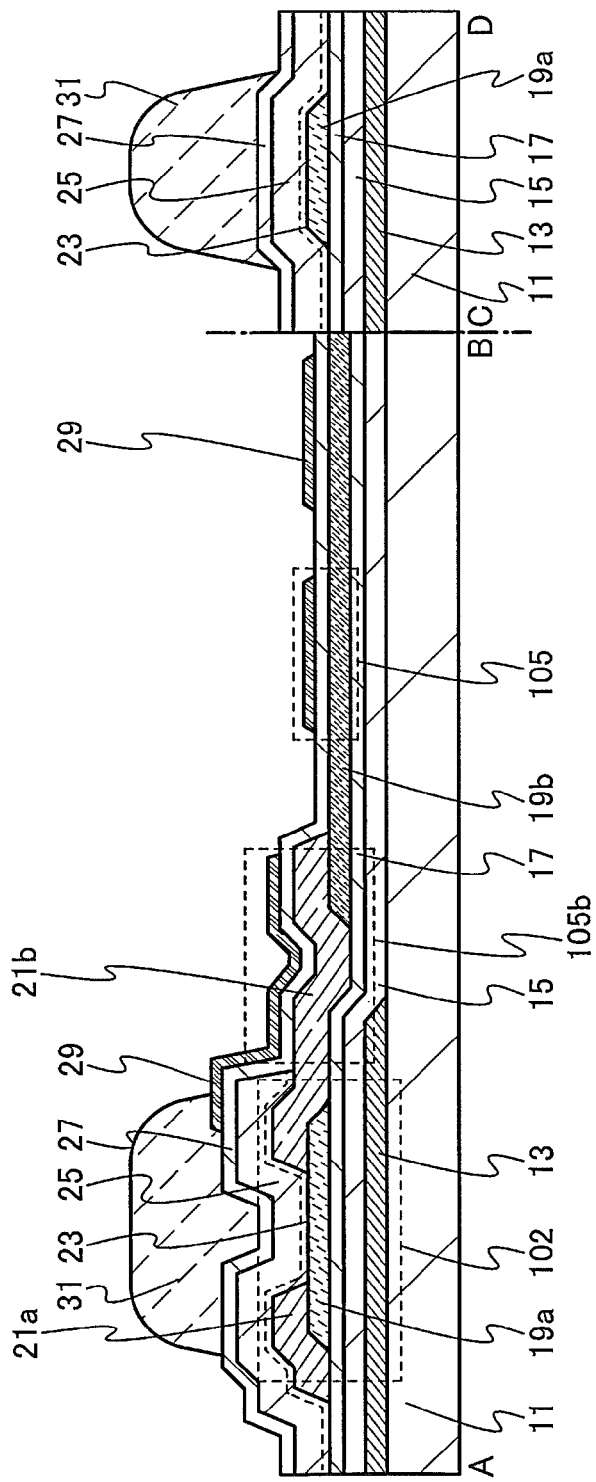
FIG. 41 is a cross-sectional view illustrating one mode of the display device.

FIG. 41 illustrates a modification example of the display device in FIG. 33.

The common electrode 29 in FIG. 41 overlaps with the conductive film 21b with the nitride insulating film 27 provided therebetween. The common electrode 29, the nitride insulating film 27, and the conductive film 21b constitute a capacitor 105b. Such a structure enables the capacitor 105b to function as a capacitor holding the potential of the pixel electrode, which increases the capacitance in the pixel.

Modification Example 5

Figure 42A:
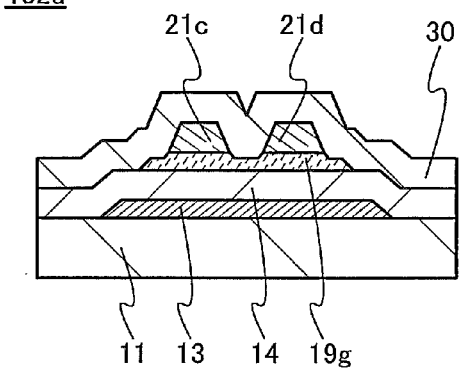
FIGS. 42A and 42B are cross-sectional views each illustrating one mode of a transistor.
Figure 42B:
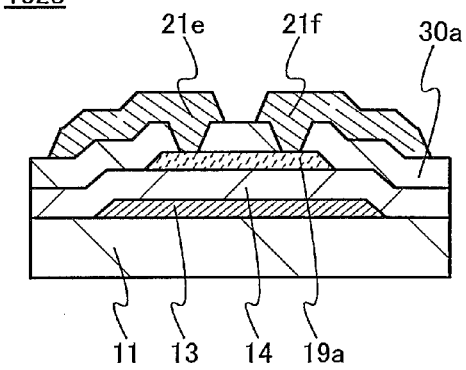

FIGS. 42A and 42B illustrate modification examples of the transistor 102 in FIG. 33.

A transistor 102d illustrated in FIG. 42A includes an oxide semiconductor film 19g and a pair of conductive films 21c and 21d, which are formed with a multi-tone photomask.

With the use of a multi-tone photomask, a resist mask having a plurality of thicknesses can be formed. After the oxide semiconductor film 19g is formed with the resist mask, the resist mask is exposed to oxygen plasma or the like and is partly removed; accordingly, a resist mask for forming a pair of conductive films is formed. Therefore, the number of photolithography steps in the process of forming the oxide semiconductor film 19g and the pair of conductive films 21c and 21d can be reduced.

Note that when seen from the above, the oxide semiconductor film 19g formed with a multi-tone photomask is partly exposed outside the pair of conductive films 21c and 21d.

A transistor 102e illustrated in FIG. 42B is a channel-protective transistor.

The transistor 102e illustrated in FIG. 42B includes the conductive film 13 functioning as a gate electrode provided over the first substrate 11, the gate insulating film 14 formed over the first substrate 11 and the conductive film 13, the oxide semiconductor film 19a overlapping with the conductive film 13 with the gate insulating film 14 provided therebetween, an inorganic insulating film 30a covering a channel region and side surfaces of the oxide semiconductor film 19a, and conductive films 21e and 21f functioning as a source electrode and a drain electrode in contact with the oxide semiconductor film 19a in an opening of the inorganic insulating film 30a.

In the channel-protective transistor, the oxide semiconductor film 19a is not damaged by etching for forming the conductive films 21e and 21f because the oxide semiconductor film 19a is covered with the inorganic insulating film 30a. Therefore, defects in the oxide semiconductor film 19a can be reduced.

The structures, methods, and the like shown in this embodiment can be used in appropriate combination with any of the structures, methods, and the like shown in the other embodiments.

(Embodiment 6)

In this embodiment, as an example of a display device, a liquid crystal display device driven in a vertical alignment (VA) mode will be described. First, a top view of a plurality of pixels 103 included in the liquid crystal display device is shown in FIG. 43.

Figure 43:
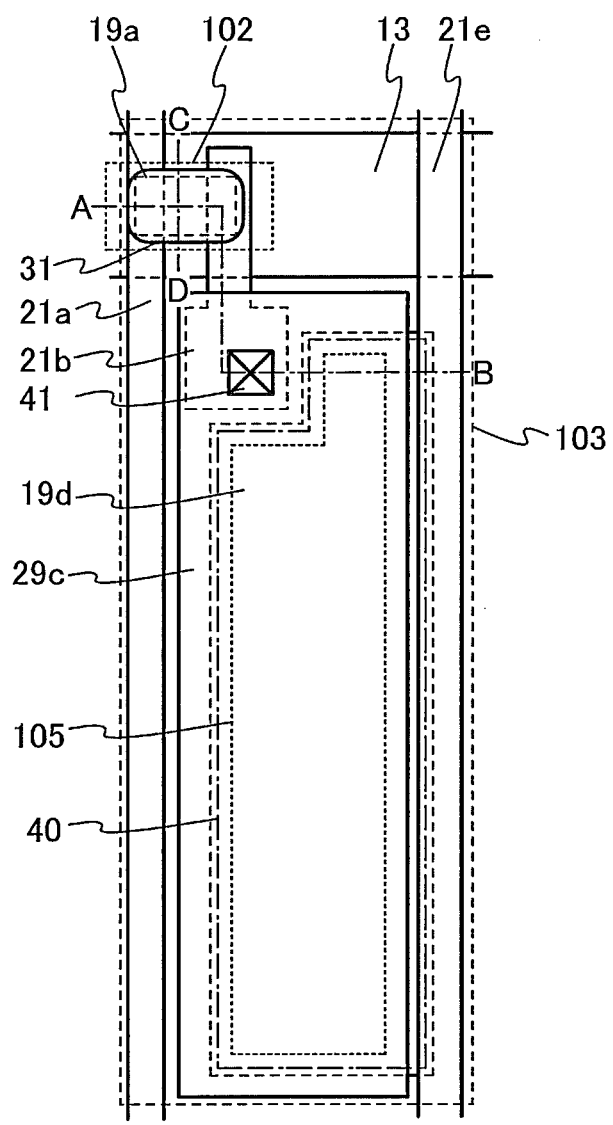
FIG. 43 is a top view illustrating one mode of the display device.

In FIG. 43, a conductive film 13 functioning as a scan line extends in a direction substantially perpendicularly to a conductive film functioning as a signal line (in the lateral direction in the drawing). The conductive film 21a functioning as a signal line extends in a direction substantially perpendicularly to the conductive film functioning as a scan line (in the longitudinal direction in the drawing). A conductive film 21e functioning as a capacitor line extends in a direction parallel to the signal line. Note that the conductive film 13 functioning as a scan line is electrically connected to the scan line driver circuit 104 (see FIG. 31A), and the conductive film 21a functioning as a signal line and the conductive film 21e functioning as a capacitor line is electrically connected to the signal line driver circuit 106 (see FIG. 31A).

The transistor 102 is provided in a region where the conductive film functioning as a scan line and the conductive film functioning as a signal line intersect with each other. The transistor 102 includes the conductive film 13 functioning as a gate electrode; a gate insulating film (not illustrated in FIG. 43); the oxide semiconductor film 19a over the gate insulating film, in which a channel region is formed; and the conductive films 21a and 21b functioning as a pair of electrodes. The conductive film 13 also functions as a scan line, and a region of the conductive film 13 that overlaps with the oxide semiconductor film 19a functions as the gate electrode of the transistor 102. In addition, the conductive film 21a also functions as a signal line, and a region of the conductive film 21a that overlaps with the oxide semiconductor film 19a functions as the source electrode or the drain electrode of the transistor 102. Furthermore, in the top view of FIG. 43, an end portion of the conductive film functioning as a scan line is positioned on an outer side of an end portion of the oxide semiconductor film 19a. Thus, the conductive film functioning as a scan line functions as a light-blocking film for blocking light from a light source such as a backlight. For this reason, the oxide semiconductor film 19a included in the transistor is not irradiated with light, so that a variation in the electrical characteristics of the transistor can be suppressed.

In addition, the transistor 102 includes the organic insulating film 31 overlapping with the oxide semiconductor film 19a as in Embodiment 5. The organic insulating film 31 overlaps with the oxide semiconductor film 19a (in particular, a region of the oxide semiconductor film 19a that is between the conductive films 21a and 21b) with an inorganic insulating film (not illustrated in FIG. 43) provided therebetween.

The conductive film 21b is electrically connected to a light-transmitting conductive film 29c that functions as a pixel electrode in an opening 41.

The capacitor 105 is connected to the conductive film 21e functioning as a capacitor line. The capacitor 105 includes an oxide semiconductor film 19d having conductivity formed over the gate insulating film, a dielectric film formed over the transistor 102, and the light-transmitting conductive film 29c functioning as a pixel electrode. The oxide semiconductor film 19d having conductivity formed over the gate insulating film has a light-transmitting property. That is, the capacitor 105 transmits light.

Since having the light-transmitting property, the capacitor 105 can be formed large (in a large area) in the pixel 103. Thus, a semiconductor device with high capacitance can be obtained while an aperture ratio is increased to typically 55% or more, preferably 60% or more. For example, in a high-resolution semiconductor device such as a liquid crystal display device, the area of a pixel decreases and accordingly the area of a capacitor decreases. As a result, the amount of charges accumulated in the capacitor is small in the high-resolution semiconductor device. However, since the capacitor 105 in this embodiment has a light-transmitting property, when the capacitor 105 is provided in a pixel, sufficient capacitance can be obtained in the pixel and the aperture ratio can be improved. Typically, the capacitor 105 can be favorably used for a high-resolution semiconductor device with a pixel density of 200 ppi or more, 300 ppi or more, or 500 ppi or more.

Furthermore, according to one embodiment of the present invention, the aperture ratio can be improved even in a high-resolution display device, which makes it possible to use light from a light source such as a backlight efficiently, so that power consumption of the display device can be reduced.

Next, FIG. 44 is a cross-sectional view taken along dashed-dotted lines A-B and C-D in FIG. 43. The transistor 102 illustrated in FIG. 43 is a channel-etched transistor. Note that the transistor 102 in the channel length direction, a connection portion between the transistor 102 and the light-transmitting conductive film 29c functioning as a pixel electrode, and the capacitor 105 are illustrated in the cross-sectional view taken along dashed-dotted line A-B, and the transistor 102 in the channel width direction is illustrated in the cross-sectional view taken along dashed-dotted line C-D.

Since the liquid crystal display device described in this embodiment is driven in a VA mode, the liquid crystal element 322 includes the light-transmitting conductive film 29c functioning as a pixel electrode included in the element layer of the first substrate 11, the conductive film 350 included in the element layer of the second substrate 342, and the liquid crystal layer 320.

In addition, the transistor 102 in FIG. 44 has a structure similar to that of the transistor 102 in Embodiment 5. The light-transmitting conductive film 29c functioning as a pixel electrode connected to one of the conductive films 21a and 21b functioning as a source electrode and a drain electrode (here, connected to the conductive film 21b) is formed over the nitride insulating film 27. In the opening 41 of the nitride insulating film 27, the conductive film 21b is connected to the light-transmitting conductive film 29c functioning as a pixel electrode.

The light-transmitting conductive film 29c functioning as a pixel electrode can be formed using as appropriate a material and a manufacturing method similar to those of the common electrode 29 in Embodiment 5.

The capacitor 105 in FIG. 44 includes the conductive oxide semiconductor film 19d formed over the oxide insulating film 17, the nitride insulating film 27, and the light-transmitting conductive film 29c functioning as a pixel electrode.

Over the transistor 102 in this embodiment, the oxide insulating films 23 and 25 which are isolated from each other are formed. The oxide insulating films 23 and 25 which are isolated from each other overlap with the oxide semiconductor film 19a.

In addition, the organic insulating film 31 overlapping with the oxide semiconductor film 19a is provided over the nitride insulating film 27. The organic insulating film 31 overlapping with the oxide semiconductor film 19a is provided over the transistor 102, whereby the surface of the oxide semiconductor film 19a can be made apart from the surface of the organic insulating film 31. Thus, the surface of the oxide semiconductor film 19a is not affected by the electric field of positively charged particles adsorbed on the surface of the organic insulating film 31 and therefore the reliability of the transistor 102 can be improved.

In the capacitor 105, the oxide semiconductor film 19d having conductivity is different from that in Embodiment 5 and is not connected to the conductive film 21b. In contrast, the oxide semiconductor film 19d having conductivity is in contact with a conductive film 21d. The conductive film 21d serves as a capacitor line. The oxide semiconductor film 19d having conductivity can be formed in a manner similar to that of the oxide semiconductor film 19b having conductivity in Embodiment 5. That is, the oxide semiconductor film 19d having conductivity is a metal oxide film containing the same metal element as the oxide semiconductor film 19a. Furthermore, the oxide semiconductor film 19d having conductivity can be formed by the same manufacturing method as that of the oxide semiconductor film 19b having conductivity in Embodiment 5.

Next, a method for manufacturing the transistor 102 and the capacitor 105 in FIG. 44 will be described with reference to FIGS. 45A to 45C and FIGS. 46A to 46C.

A conductive film is formed over the first substrate 11 and then etched using a mask formed through the first photolithography process in Embodiment 5, whereby the conductive film 13 functioning as a gate electrode is formed over the first substrate 11 (see FIG. 45A).

Next, the nitride insulating film 15 and the oxide insulating film 16 are formed over the first substrate 11 and the conductive film 13 functioning as a gate electrode. Next, an oxide semiconductor film is formed over the oxide insulating film 16 and then etched using a mask formed through the second photolithography process in Embodiment 5, whereby the oxide semiconductor films 19a and 19c are formed (see FIG. 45B).

Next, a conductive film is formed over the oxide insulating film 16 and the oxide semiconductor films 19a and 19c and then etched using a mask formed through the third photolithography process in Embodiment 5, whereby the conductive films 21a, 21b, and 21d are formed (see FIG. 45C). At this time, the conductive film 21b is formed so as not to be in contact with the oxide semiconductor film 19c. The conductive film 21d is formed so as to be in contact with the oxide semiconductor film 19c.

Next, an oxide insulating film is formed over the oxide insulating film 16, the oxide semiconductor films 19a and 19c, and the conductive films 21a, 21b, and 21d and then etched using a mask formed through the fourth photolithography process in Embodiment 5, whereby the oxide insulating films 23 and 25 having the opening 40 are formed (see FIG. 46A).

Next, a nitride insulating film is formed over the oxide insulating film 17, the oxide semiconductor films 19a and 19c, the conductive films 21a, 21b, and 21d, and the oxide insulating films 23 and 25 and then etched using a mask formed through the fifth photolithography process in Embodiment 5, whereby the nitride insulating film 27 having the opening 41 through which part of the conductive film 21b is exposed is formed (see FIG. 46B).

Through the above steps, the oxide semiconductor film 19c becomes the oxide semiconductor film 19d having conductivity. When a silicon nitride film is formed later by a plasma CVD method as the nitride insulating film 27, hydrogen contained in the silicon nitride film is diffused to the oxide semiconductor film 19c; thus, the oxide semiconductor film 19d having conductivity can be obtained.

Next, a conductive film is formed over the conductive film 21b and the nitride insulating film 27 and then etched using a mask formed through the sixth photolithography process in Embodiment 5, whereby the conductive film 29c connected to the conductive film 21b is formed (see FIG. 46C).

From the above, as for a semiconductor device including an oxide semiconductor film, a semiconductor device with improved electrical characteristics can be obtained.

On an element substrate of the semiconductor device described in this embodiment, one electrode of the capacitor is formed at the same time as the oxide semiconductor film of the transistor. In addition, the light-transmitting conductive film functioning as a pixel electrode is used as the other electrode of the capacitor. Thus, a step of forming another conductive film is not needed to form the capacitor, which reduces the number of manufacturing steps. Furthermore, since the pair of electrodes have a light-transmitting property, the capacitor transmits light. As a result, the area occupied by the capacitor can be increased while the aperture ratio in a pixel can be increased.

Modification Example 1

In this embodiment, a display device that can be manufactured with a small number of masks as compared with that of the semiconductor device described in Embodiment 5 will be described with reference to FIG. 47.

Figure 47:
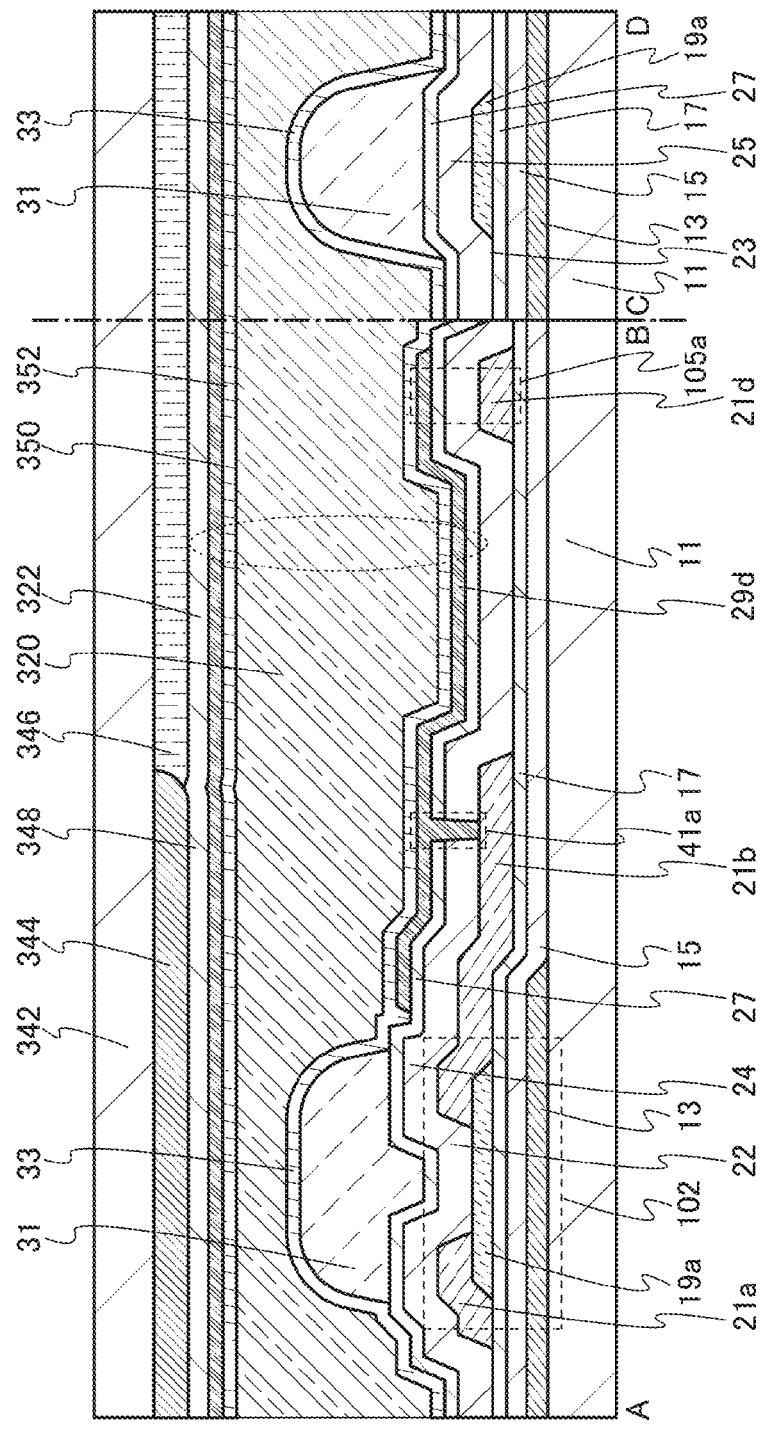
FIG. 47 is a cross-sectional view illustrating one mode of the display device.

In the display device illustrated in FIG. 47, the number of masks can be reduced by not etching the oxide insulating film 22 and the oxide insulating film 24 formed over the transistor 102. In addition, the nitride insulating film 27 is formed over the oxide insulating film 24, and an opening 41a through which part of the conductive film 21b is exposed is formed in the oxide insulating films 22 and 24 and the nitride insulating film 27. A light-transmitting conductive film 29d functioning as a pixel electrode, which is connected to the conductive film 21b in the opening 41a, is formed over the nitride insulating film 27.

The conductive film 21d is formed over the oxide insulating film 17. Since the conductive film 21d is formed at the same time as the conductive films 21a and 21b, an additional photomask is not needed to form the conductive film 21d. The conductive film 21d functions as a capacitor line. That is, a capacitor 105a includes the conductive film 21d, the oxide insulating film 22, the oxide insulating film 24, the nitride insulating film 27, and the light-transmitting conductive film 29d functioning as a pixel electrode.

The structures, methods, and the like shown in this embodiment can be used in appropriate combination with any of the structures, methods, and the like shown in the other embodiments.

(Embodiment 7)

In this embodiment, a display device which is different from the display devices in Embodiment 5 and a manufacturing method thereof will be described with reference to FIG. 48. This embodiment is different from Embodiment 5 in that the transistor has a structure in which an oxide semiconductor film is provided between different gate electrodes, that is, a dual-gate structure. Note that the structures similar to those in Embodiment 5 will not be described repeatedly.

A specific structure of an element layer formed over the first substrate 11 included in the display device is described. The transistor provided in the display device of this embodiment is different from that in Embodiment 5 in that a conductive film 29b functioning as a gate electrode is provided so as to overlap with part of or the whole of each of the conductive film 13 functioning as a gate electrode, the oxide semiconductor film 19a, the conductive films 21a and 21b, and the oxide insulating film 25. The conductive film 29b functioning as a gate electrode is connected to the conductive film 13 functioning as a gate electrode in the opening 41a and an opening 41b.

Figure 48:
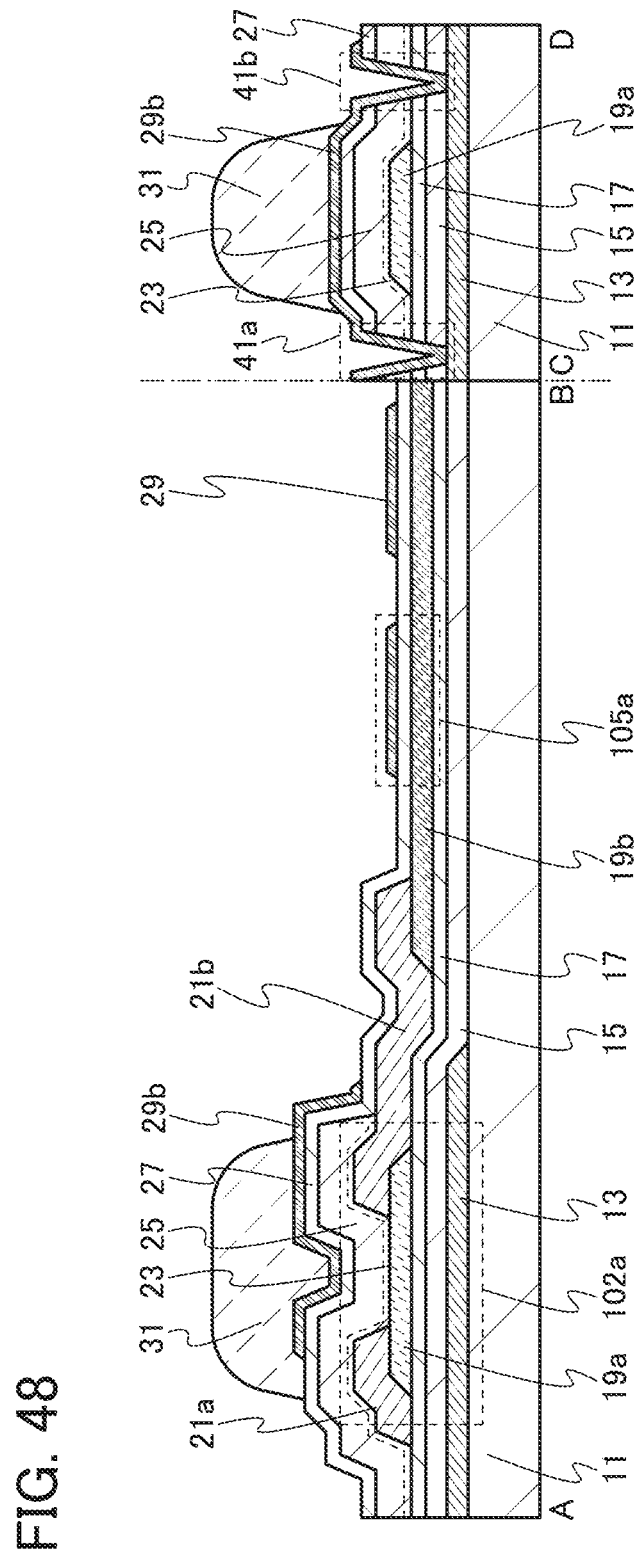
FIG. 48 is a cross-sectional view illustrating one mode of the display device.

A transistor 102a illustrated in FIG. 48 is a channel-etched transistor. Note that a cross-sectional view along line A-B illustrates the transistor 102a in the channel length direction and the capacitor 105a, and a cross-sectional view along line C-D illustrates the transistor 102a in the channel width direction and a connection portion between the conductive film 13 functioning as a gate electrode and the conductive film 29b functioning as a gate electrode.

The transistor 102a in FIG. 48 has a dual-gate structure and includes the conductive film 13 functioning as a gate electrode over the first substrate 11. In addition, the transistor 102a includes the nitride insulating film 15 formed over the first substrate 11 and the conductive film 13 functioning as a gate electrode, the oxide insulating film 17 formed over the nitride insulating film 15, the oxide semiconductor film 19a overlapping with the conductive film 13 functioning as a gate electrode with the nitride insulating film 15 and the oxide insulating film 17 provided therebetween, and the conductive films 21a and 21b functioning as a source electrode and a drain electrode which are in contact with the oxide semiconductor film 19a. Moreover, the oxide insulating film 23 is formed over the oxide insulating film 17, the oxide semiconductor film 19a, and the conductive films 21a and 21b functioning as a source electrode and a drain electrode, and the oxide insulating film 25 is formed over the oxide insulating film 23. The nitride insulating film 27 is formed over the nitride insulating film 15, the oxide insulating film 23, the oxide insulating film 25, and the conductive film 21b. The oxide semiconductor film 19b having conductivity is formed over the oxide insulating film 17. The oxide semiconductor film 19b having conductivity is connected to one of the conductive films 21a and 21b functioning as a source electrode and a drain electrode, here, connected to the conductive film 21b. The common electrode 29 and the conductive film 29b functioning as a gate electrode are formed over the nitride insulating film 27.

As illustrated in the cross-sectional view along line C-D, the conductive film 29b functioning as a gate electrode is connected to the conductive film 13 functioning as a gate electrode in the openings 41a and 41b provided in the nitride insulating film 15, the oxide insulating film 17, the oxide insulating films 23 and 25, and the nitride insulating film 27. That is, the conductive film 13 functioning as a gate electrode and the conductive film 29b functioning as a gate electrode have the same potential.

Thus, by applying voltage at the same potential to each gate electrode of the transistor 102a, variation in the initial characteristics can be reduced, and degradation of the transistor 102a after the –GBT stress test and a change in the rising voltage of on-state current at different drain voltages can be suppressed. In addition, a region where carriers flow in the oxide semiconductor film 19a becomes larger in the film thickness direction, so that the amount of carrier movement is increased. As a result, the on-state current of the transistor 102a is increased, and the field-effect mobility is increased to, typically, greater than or equal to 20 $cm^2/V·s$.

Over the transistor 102a in this embodiment, the oxide insulating films 23 and 25 are formed. The oxide insulating films 23 and 25 overlap with the oxide semiconductor film 19a. In the cross-sectional view in the channel width direction, end portions of the oxide insulating films 23 and 25 are positioned on an outer side of an end portion of the oxide semiconductor film 19a. Furthermore, in the channel width direction in FIG. 48, the conductive film 29b functioning as a gate electrode is positioned at end portions of the oxide insulating films 23 and 25.

An end portion of the oxide semiconductor film that is processed by etching or the like is damaged by the processing to include defects and is also contaminated with impurities or the like. Thus, the end portion of the oxide semiconductor film is easily activated by application of a stress such as an electric field, thereby easily becoming n-type (having a low resistance). Therefore, the end portion of the oxide semiconductor film 19a overlapping with the conductive film 13 functioning as a gate electrode easily becomes n-type. When the end portion which becomes n-type is provided between the conductive films 21a and 21b functioning as a source electrode and a drain electrode, the n-type region functions as a carrier path, producing a parasitic channel. However, as illustrated in the cross-sectional view along line C-D, when the conductive film 29b functioning as a gate electrode faces a side surface of the oxide semiconductor film 19a with the oxide insulating films 23 and 25 provided therebetween in the channel width direction, generation of a parasitic channel on the side surface of the oxide semiconductor film 19a or in a region including the side surface and the vicinity of the side surface is suppressed because of the electric field of the conductive film 29b functioning as a gate electrode. As a result, the transistor has excellent electrical characteristics such as a sharp increase in the drain current at the threshold voltage.

On an element substrate of the display device described in this embodiment, the conductive oxide semiconductor film functioning as the pixel electrode is formed at the same time as the oxide semiconductor film of the transistor. The oxide semiconductor film having conductivity also functions as one of electrodes of the capacitor. The common electrode also functions as the other electrode of the capacitor. Thus, a step of forming another conductive film is not needed to form the capacitor, which reduces the number of manufacturing steps. Moreover, since the capacitor has a light-transmitting property, the area occupied by the capacitor can be increased while the aperture ratio in a pixel can be increased.

Details of the transistor 102a will be described below. Note that the components with the same reference numerals as those in Embodiment 5 will not be described repeatedly.

The conductive film 29b functioning as a gate electrode can be formed using a material similar to that of the common electrode 29 in Embodiment 5.

Next, a method for manufacturing the transistor 102a and the capacitor 105a in FIG. 48 will be described with reference to FIGS. 34A to 34D, FIGS. 35A to 35C, FIGS. 36A to 36C, and FIGS. 49A to 49C.

As in Embodiment 5, through the steps illustrated in FIGS. 34A to 34D. FIGS. 35A to 35C, and FIG. 36A, the conductive film 13 functioning as a gate electrode, the nitride insulating film 15, the oxide insulating film 16, the oxide semiconductor film 19a, the oxide semiconductor film 19b having conductivity, the conductive films 21a and 21b functioning as a source electrode and a drain electrode, the oxide insulating film 22, the oxide insulating film 24, and the nitride insulating film 26 are formed over the first substrate 11. In these steps, photolithography processes using the first photomask to the fourth photomask are performed.

Figure 49:
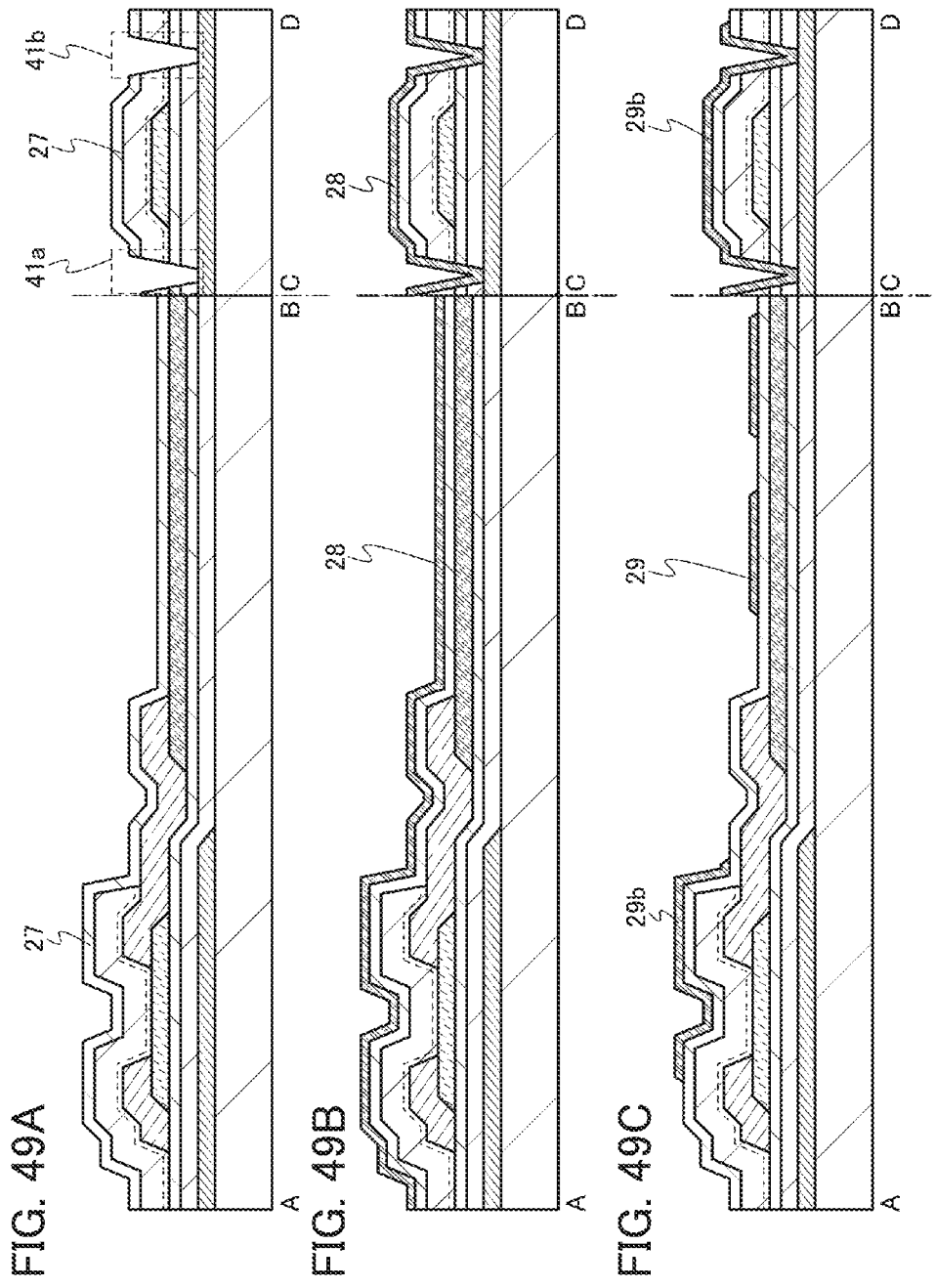
FIGS. 49A to 49C are cross-sectional views illustrating one mode of the method for manufacturing the display device.

Next, a mask is formed over the nitride insulating film 26 through a photolithography process using a fifth photomask, and then part of the nitride insulating film 26 is etched using the mask; thus, the nitride insulating film 27 having the openings 41a and 41b is formed as illustrated in FIG. 49A.

Next, as illustrated in FIG. 49B, the conductive film 28 to be the common electrode 29 and the conductive film 29b functioning as a gate electrode is formed over the conductive film 13 functioning as a gate electrode and over the nitride insulating film 27.

Then, a mask is formed over the conductive film 28 by a photolithography process using a sixth photomask. Next, as illustrated in FIG. 49C, part of the conductive film 28 is etched with the use of the mask to form the common electrode 29 and the conductive film 29b functioning as a gate electrode. After that, the mask is removed.

Through the above process, the capacitor 105a can be manufactured while the transistor 102a is manufactured.

In the channel width direction of the transistor described in this embodiment, the conductive film 29b functioning as a gate electrode faces a side surface of the oxide semiconductor film 19a with the oxide insulating films 23 and 25 provided therebetween. Therefore, generation of a parasitic channel on the side surface of the oxide semiconductor film 19a or in a region including the side surface and the vicinity of the side surface is suppressed because of the electric field of the conductive film 29b functioning as a gate electrode. As a result, the transistor has excellent electrical characteristics such as a sharp increase in the drain current at the threshold voltage.

The element substrate of the display device in this embodiment is provided with a common electrode including a stripe region extending in a direction intersecting with a signal line. Hence, the display device can have excellent contrast.

On an element substrate of the display device described in this embodiment, the oxide semiconductor film having conductivity functioning as the pixel electrode is formed at the same time as the oxide semiconductor film of the transistor. The oxide semiconductor film having conductivity functions as the one electrode of the capacitor. The common electrode also functions as the other electrode of the capacitor. Thus, a step of forming another conductive film is not needed to form the capacitor, which reduces the number of manufacturing steps. Moreover, since the capacitor has a light-transmitting property, the area occupied by the capacitor can be increased while the aperture ratio in a pixel can be increased.

The structures, methods, and the like shown in this embodiment can be used in appropriate combination with any of the structures, methods, and the like shown in the other embodiments.

(Embodiment 8)

In this embodiment, a display device including a transistor in which the number of defects in an oxide semiconductor film can be further reduced as compared with the above embodiments will be described with reference to drawings. The transistor described in this embodiment is different from the transistors in Embodiments 5 to 7 in that a multilayer film including a plurality of oxide semiconductor films is provided. Here, details will be described using the transistor in Embodiment 5.

Figure 50:
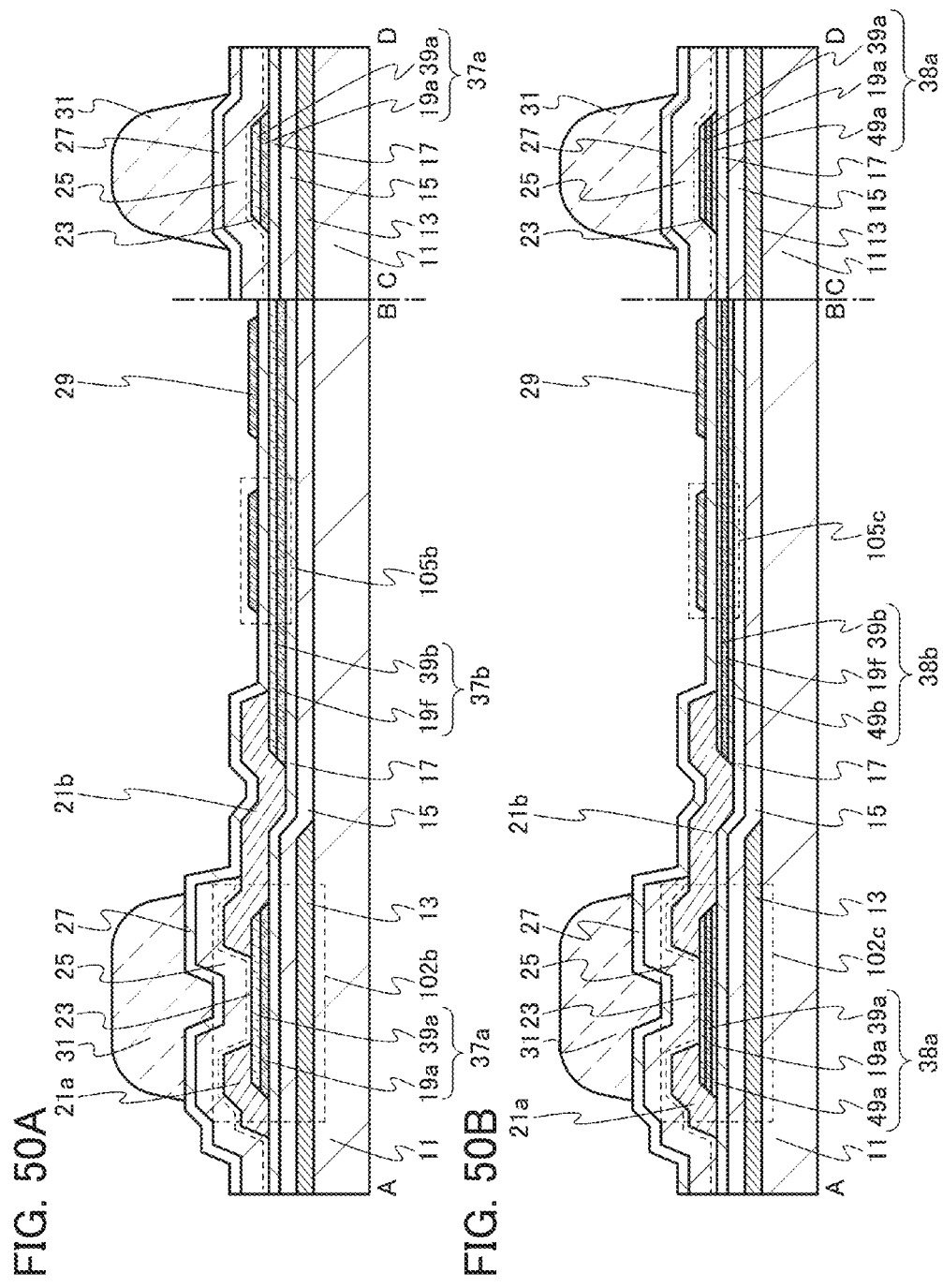
FIGS. 50A and 50B are cross-sectional views each illustrating one mode of the display device.

FIGS. 50A and 50B each show a cross-sectional view of an element substrate included in a display device. FIGS. 50A and 50B are cross-sectional views taken along dashed-dotted lines A-B and C-D in FIG. 32.

A transistor 102*b* in FIG. 50A includes a multilayer film 37*a* overlapping with the conductive film 13 functioning as a gate electrode with the nitride insulating film 15 and the oxide insulating film 17 provided therebetween, and the conductive films 21*a* and 21*b* functioning as a source electrode and a drain electrode in contact with the multilayer film 37*a*. The oxide insulating film 23, the oxide insulating film 25, and the nitride insulating film 27 are formed over the nitride insulating film 15, the oxide insulating film 17, the multilayer film 37*a*, and the conductive films 21*a* and 21*b* functioning as a source electrode and a drain electrode.

The capacitor 105*b* in FIG. 50A includes a multilayer film 37*b* over the oxide insulating film 17, the nitride insulating film 27 in contact with the multilayer film 37*b*, and the common electrode 29 in contact with the nitride insulating film 27. The multilayer film 37*b* functions as a pixel electrode.

In the transistor 102*b* described in this embodiment, the multilayer film 37*a* includes the oxide semiconductor film 19*a* and an oxide semiconductor film 39*a*. That is, the multilayer film 37*a* has a two-layer structure. In addition, part of the oxide semiconductor film 19*a* functions as a channel region. Moreover, the oxide insulating film 23 is formed in contact with the multilayer film 37*a*, and the oxide insulating film 25 is formed in contact with the oxide insulating film 23. That is, the oxide semiconductor film 39*a* is provided between the oxide semiconductor film 19*a* and the oxide insulating film 23.

The oxide semiconductor film 39*a* is an oxide film containing one or more elements that constitute the oxide semiconductor film 19*a*. Thus, interface scattering is unlikely to occur at the interface between the oxide semiconductor films 19*a* and 39*a*. Thus, the transistor can have a high field-effect mobility because the movement of carriers is not hindered at the interface.

The oxide semiconductor film 39*a* is typically an In—Ga oxide film, an In—Zn oxide film, or an In-M-Zn oxide film (M represents Al, Ga, Y, Zr, Sn, La, Ce, or Nd). The energy at the conduction band bottom of the oxide semiconductor film 39*a* is closer to a vacuum level than that of the oxide semiconductor film 19*a* is, and typically, the difference between the energy at the conduction band bottom of the oxide semiconductor film 39*a* and the energy at the conduction band bottom of the oxide semiconductor film 19*a* is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 39*a* and the electron affinity of the oxide semiconductor film 19*a* is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 39*a* preferably contains In because carrier mobility (electron mobility) can be increased.

When the oxide semiconductor film 39*a* contains a larger amount of Al, Ga, Y, Zr, Sn, La, Ce, or Nd in an atomic ratio than the amount of In in an atomic ratio, any of the following effects may be obtained: (1) the energy gap of the oxide semiconductor film 39*a* is widened; (2) the electron affinity of the oxide semiconductor films film 39*a* is reduced; (3) scattering of impurities from the outside is reduced; (4) an insulating property increases as compared to the oxide semiconductor film 19*a*; and (5) oxygen vacancies are less likely to be generated because Ga, Y, Zr, Sn, La, Ce, or Nd is a metal element strongly bonded to oxygen.

In the case where the oxide semiconductor film 39*a* is an In-M-Zn oxide film, the proportions of In and M when the summation of In and M is assumed to be 100 atomic % are preferably as follows: the atomic percentage of In is less than 50 atomic % and the atomic percentage of M is greater than 50 atomic %; more preferably, the atomic percentage of In is less than 25 atomic % and the atomic percentage of M is greater than 75 atomic %.

Furthermore, in the case where each of the oxide semiconductor films 19*a* and 39*a* is an In-M-Zn oxide film (M represents Al, Ga, Y, Zr, Sn, La, Ce, or Nd), the proportion of M atoms (M represents Al, Ga, Y, Zr, Sn, La, Ce, or Nd) in the oxide semiconductor film 39*a* is higher than that in the oxide semiconductor film 19*a*. As a typical example, the proportion of M in the oxide semiconductor film 39*a* is 1.5 times or more, preferably twice or more, and more preferably three times or more as high as that in the oxide semiconductor film 19*a*.

Furthermore, in the case where each of the oxide semiconductor film 19*a* and the oxide semiconductor film 39*a* is an In-M-Zn oxide film (M represents Al, Ga, Y, Zr, Sn, La, Ce, or Nd), when In:M:Zn=$x_1$:$y_1$:$z_1$ [atomic ratio] is satisfied in the oxide semiconductor film 39*a* and In:M:Zn=$x_2$:$y_2$:$z_2$ [atomic ratio] is satisfied in the oxide semiconductor film 19*a*, $y_1/x_1$ is higher than $y_2/x_2$. Preferably, $y_1/x_1$ is 1.5 times or more as high as $y_2/x_2$. More preferably, $y_1/x_1$ is twice or more as high as $y_2/x_2$. Still further preferably, $y_1/x_1$ is three times or more as high as $y_2/x_2$.

In the case where the oxide semiconductor film 19*a* is an In-M-Zn oxide film (M is Al, Ga, Y, Zr, Sn, La, Ce, or Nd) and a target having the atomic ratio of metal elements of In:M:Zn=$x_1$:$y_1$:$z_1$ is used for forming the oxide semiconductor film 19a, $x_1/y_1$ is preferably greater than or equal to ⅓ and less than or equal to 6, more preferably greater than or equal to 1 and less than or equal to 6, and $z_1/y_1$ is preferably greater than or equal to ⅓ and less than or equal to 6, more preferably greater than or equal to 1 and less than or equal to 6. Note that when $z_1/y_1$ is greater than or equal to 1 and less than or equal to 6, a CAAC-OS film is easily formed as the oxide semiconductor film 19a. Typical examples of the atomic ratio of the metal elements of the target are In:M:Zn=1:1:1, In:M:Zn=1:1:1.2, and In:M:Zn=3:1:2.

In the case where the oxide semiconductor film 39a is an In-M-Zn oxide film (M is Al, Ga, Y, Zr, Sn, La, Ce, or Nd) and a target having the atomic ratio of metal elements of In:M:Zn=$x_2$:$y_2$:$z_2$ is used for forming the oxide semiconductor film 39a, $x_2/y_2$ is preferably less than $x_1/y_1$, and $z_2/y_2$ is preferably greater than or equal to ⅓ and less than or equal to 6, more preferably greater than or equal to 1 and less than or equal to 6. Note that when $z_2/y_2$ is greater than or equal to 1 and less than or equal to 6, a CAAC-OS film is easily formed as the oxide semiconductor film 39a. Typical examples of the atomic ratio of the metal elements of the target are In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:Al:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

Note that the proportion of each metal element in the atomic ratio of each of the oxide semiconductor films 19a and 39a varies within a range of ±40% of that in the above atomic ratio as an error.

The oxide semiconductor film 39a also functions as a film that relieves damage to the oxide semiconductor film 19a at the time of forming the oxide insulating film 25 later.

The thickness of the oxide semiconductor film 39a is greater than or equal to 3 nm and less than or equal to 100 nm, preferably greater than or equal to 3 nm and less than or equal to 50 nm.

Furthermore, the oxide semiconductor film 39a can have a crystal structure of the oxide semiconductor film 19a as appropriate.

Note that the oxide semiconductor films 19a and 39a may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure in which two or more of the following regions are stacked: a region having an amorphous structure, a region having a microcrystalline structure, a region having a polycrystalline structure, a CAAC-OS region, and a region having a single-crystal structure.

Here, the oxide semiconductor film 39a is formed between the oxide semiconductor film 19a and the oxide insulating film 23. Thus, if carrier traps are formed between the oxide semiconductor film 39a and the oxide insulating film 23 by impurities and defects, electrons flowing in the oxide semiconductor film 19a are less likely to be captured by the carrier traps because there is a distance between the carrier traps and the oxide semiconductor film 19a. Accordingly, the amount of on-state current of the transistor can be increased, and the field-effect mobility can be increased. When the electrons are captured by the carrier traps, the electrons become negative fixed charges. As a result, the threshold voltage of the transistor changes. However, by the distance between the oxide semiconductor film 19a and the carrier traps, capture of electrons by the carrier traps can be reduced, and accordingly, the amount of change in the threshold voltage can be reduced.

Impurities from the outside can be blocked by the oxide semiconductor film 39a, and accordingly, the amount of impurities that are transferred from the outside to the oxide semiconductor film 19a can be reduced. Furthermore, an oxygen vacancy is less likely to be formed in the oxide semiconductor film 39a. Consequently, the impurity concentration and the number of oxygen vacancies in the oxide semiconductor film 19a can be reduced.

Note that the oxide semiconductor films 19a and 39a are not formed by simply stacking each film, but are formed to have a continuous junction (here, in particular, a structure in which the energy of the bottom of the conduction band is changed continuously between each film). In other words, a stacked-layer structure in which there exist no impurity that forms a defect level such as a trap center or a recombination center at the interface between the films is provided. If an impurity exists between the oxide semiconductor films 19a and 39a which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to a degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

As in a transistor 102c in FIG. 50B, a multilayer film 38a may be provided instead of the multilayer film 37a.

In addition, as in a capacitor 105c in FIG. 50B, a multilayer film 38b may be provided instead of the multilayer film 37b.

The multilayer film 38a includes an oxide semiconductor film 49a, the oxide semiconductor film 19a, and the oxide semiconductor film 39a. That is, the multilayer film 38a has a three-layer structure. Furthermore, the oxide semiconductor film 19a functions as a channel region.

The oxide semiconductor film 49a can be formed using a material and a formation method similar to those of the oxide semiconductor film 39a.

The multilayer film 38b includes an oxide semiconductor film 49b having conductivity, an oxide semiconductor film 19f having conductivity, and an oxide semiconductor film 39b having conductivity. In other words, the multilayer film 38b has a three-layer structure. The multilayer film 38b functions as a pixel electrode.

The oxide semiconductor film 19f can be formed using a material and a formation method similar to those of the oxide semiconductor film having conductivity as appropriate. The oxide semiconductor film 49b can be formed using a material and a formation method similar to those of the oxide semiconductor film 39b as appropriate.

In addition, the oxide insulating film 17 and the oxide semiconductor film 49a are in contact with each other. That is, the oxide semiconductor film 49a is provided between the oxide insulating film 17 and the oxide semiconductor film 19a.

The multilayer film 38a and the oxide insulating film 23 are in contact with each other. In addition, the oxide semiconductor film 39a and the oxide insulating film 23 are in contact with each other. That is, the oxide semiconductor film 39a is provided between the oxide semiconductor film 19a and the oxide insulating film 23.

It is preferable that the thickness of the oxide semiconductor film 49a be smaller than that of the oxide semiconductor film 19a. When the thickness of the oxide semiconductor film 49a is greater than or equal to 1 nm and less than or equal to 5 nm, preferably greater than or equal to 1 nm and less than or equal to 3 nm, the amount of change in the threshold voltage of the transistor can be reduced.

In the transistor described in this embodiment, the oxide semiconductor film 39a is provided between the oxide semiconductor film 19a and the oxide insulating film 23. Thus, if carrier traps are formed between the oxide semiconductor film 39a and the oxide insulating film 23 by impurities and defects, electrons flowing in the oxide semiconductor film 19a are less likely to be captured by the carrier traps because there is a distance between the carrier traps and the oxide semiconductor film 19a. Accordingly, the amount of on-state current of the transistor can be increased, and the field-effect mobility can be increased. When the electrons are captured by the carrier traps, the electrons become negative fixed charges. As a result, the threshold voltage of the transistor changes. However, by the distance between the oxide semiconductor film 19a and the carrier traps, capture of electrons by the carrier traps can be reduced, and accordingly, the amount of change in the threshold voltage can be reduced.

Impurities from the outside can be blocked by the oxide semiconductor film 39a, and accordingly, the amount of impurities that are transferred from the outside to the oxide semiconductor film 19a can be reduced. Furthermore, an oxygen vacancy is less likely to be formed in the oxide semiconductor film 39a. Consequently, the impurity concentration and the number of oxygen vacancies in the oxide semiconductor film 19a can be reduced.

Furthermore, the oxide semiconductor film 49a is provided between the oxide insulating film 17 and the oxide semiconductor film 19a, and the oxide semiconductor film 39a is provided between the oxide semiconductor film 19a and the oxide insulating film 23. Thus, it is possible to reduce the concentration of silicon or carbon in the vicinity of the interface between the oxide semiconductor film 49a and the oxide semiconductor film 19a, the concentration of silicon or carbon in the oxide semiconductor film 19a, or the concentration of silicon or carbon in the vicinity of the interface between the oxide semiconductor film 39a and the oxide semiconductor film 19a. Consequently, in the multilayer film 38a, the absorption coefficient derived from a constant photocurrent method is lower than $1\times10^{-3}$/cm, preferably lower than $1\times10^{-4}$/cm, and thus the density of localized levels is extremely low.

The transistor 102c having such a structure includes very few defects in the multilayer film 38a including the oxide semiconductor film 19a; thus, the electrical characteristics of the transistor can be improved, and typically, the on-state current can be increased and the field-effect mobility can be improved. Moreover, in a BT stress test and a BT photostress test which are examples of a stress test, the amount of change in threshold voltage is small to offer high reliability.

The structures, methods, and the like shown in this embodiment can be used in appropriate combination with any of the structures, methods, and the like shown in the other embodiments.

(Embodiment 9)

In this embodiment, a light-emitting device provided with part of the element layer that is formed over the first substrate 11 in Embodiments 5 to 8 will be described with reference to FIG. 51 and FIG. 52. Note that here, part of the element layer described in Embodiments 5 and 6 is used; however, an element layer having another structure can be used in the light-emitting device as appropriate.

Figure 51:
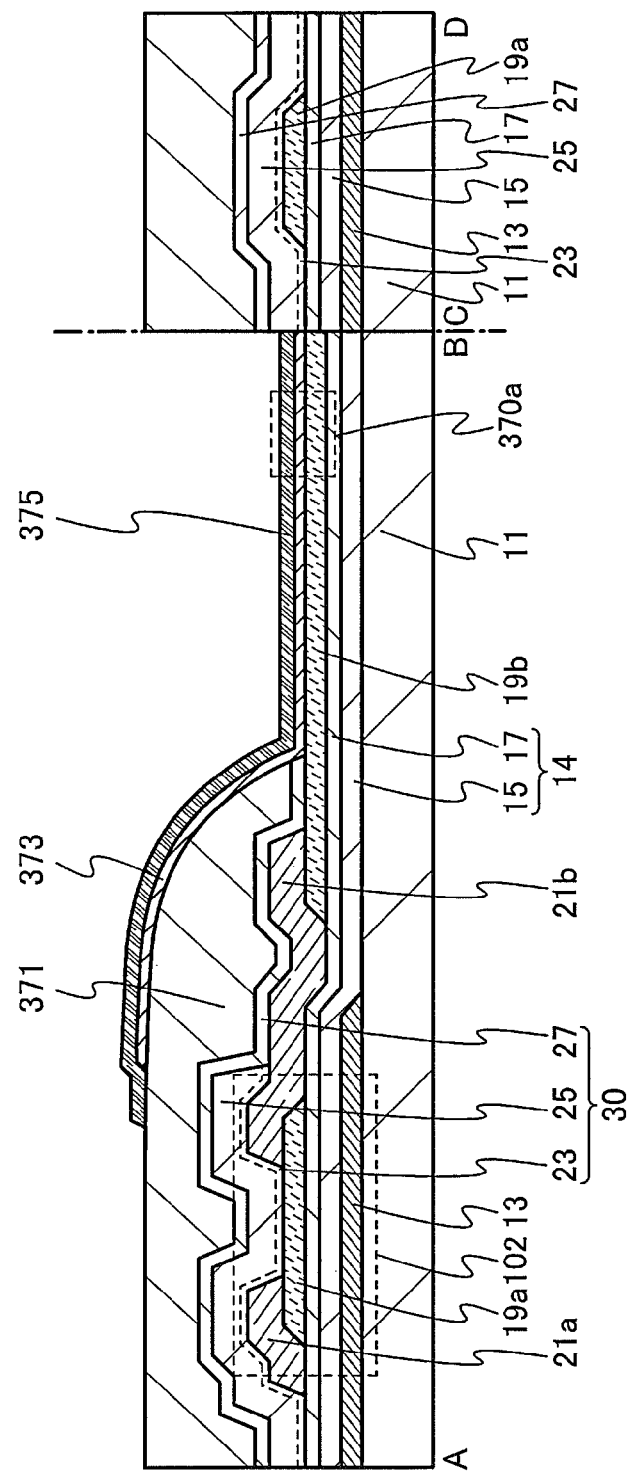
FIG. 51 is a cross-sectional view illustrating one mode of the display device.

A light-emitting device in FIG. 51 includes, in addition to the element layer formed over the first substrate 11 illustrated in FIG. 33 in Embodiment 5, an insulating film 371 provided over the inorganic insulating film 30, an EL layer 373 provided over the inorganic insulating film 30, the oxide semiconductor film 19b having conductivity, and the insulating film 371, and a conductive film 375 provided over the EL layer 373 and the insulating film 371. The oxide semiconductor film 19b having conductivity, the EL layer 373, and the conductive film 375 constitute a light-emitting element 370a.

Figure 52:
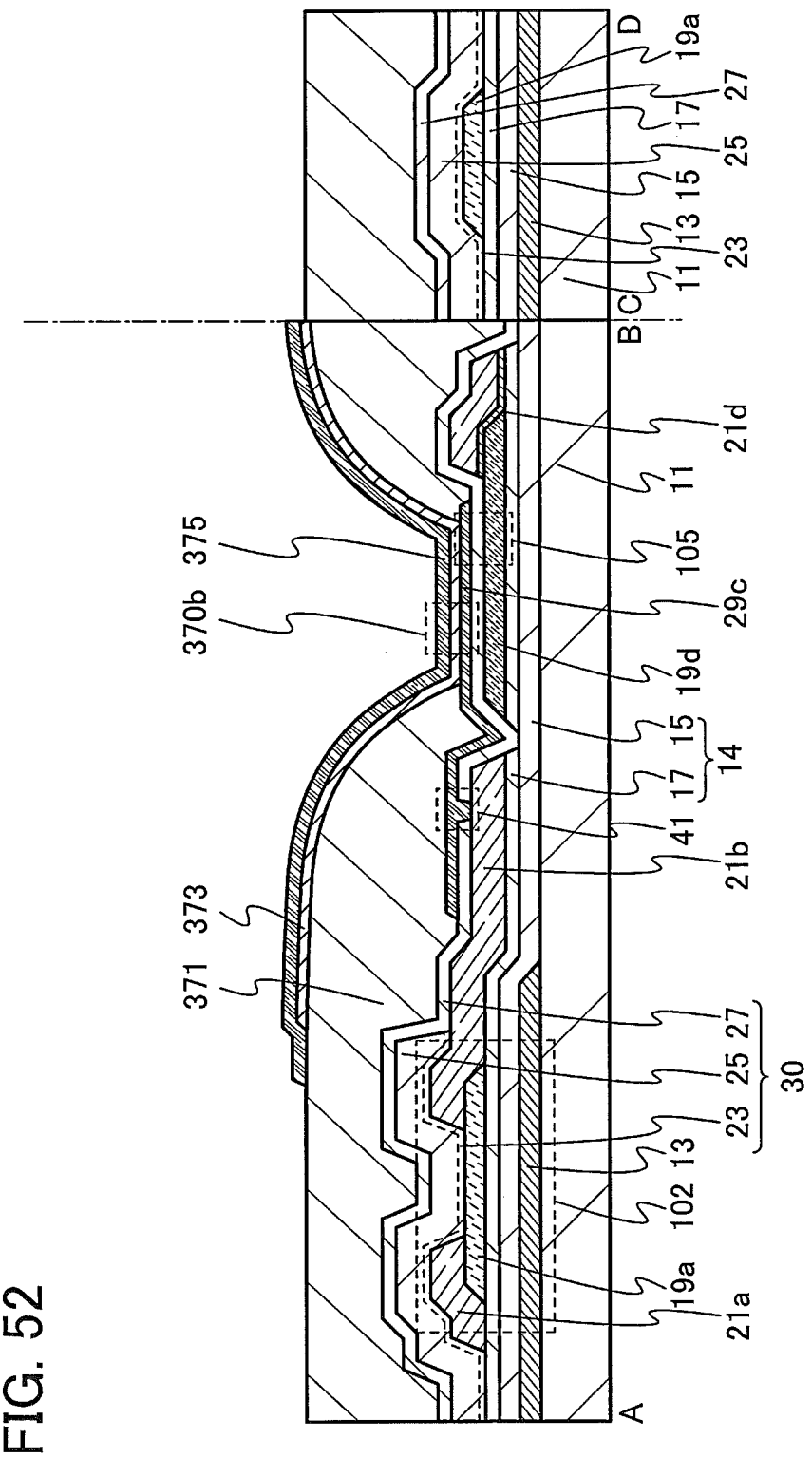
FIG. 52 is a cross-sectional view illustrating one mode of the display device.

A light-emitting device in FIG. 52 includes, in addition to the element layer formed over the first substrate 11 illustrated in FIG. 44 in Embodiment 6, the insulating film 371 provided over the inorganic insulating film 30 and the light-transmitting conductive film 29c, the EL layer 373 provided over the inorganic insulating film 30 and the light-transmitting conductive film 29c, and the conductive film 375 provided over the EL layer 373 and the insulating film 371. The light-transmitting conductive film 29c, the EL layer 373, and the conductive film 375 constitute a light-emitting element 370b.

On the element substrate of the light-emitting device in this embodiment, the oxide semiconductor film having conductivity serving as the pixel electrode is formed at the same time as the oxide semiconductor film of the transistor. Thus, the light-emitting device can be manufactured in fewer steps than the conventional one.

Alternatively, on the element substrate of the light-emitting device in this embodiment, the oxide semiconductor film having conductivity serving as an electrode of the capacitor is formed at the same time as the oxide semiconductor film of the transistor. The oxide semiconductor film having conductivity serves as the electrode of the capacitor. Thus, a step of forming another conductive film is not needed to form the capacitor, reducing the number of manufacturing steps of the light-emitting device. Moreover, the other electrode of the capacitor is formed using a light-transmitting conductive film serving as a pixel electrode. Thus, the capacitor has a light-transmitting property. As a result, the area occupied by the capacitor can be increased while the aperture ratio in a pixel can be increased.

The structures, methods, and the like shown in this embodiment can be used in appropriate combination with any of the structures, methods, and the like shown in the other embodiments.

(Embodiment 10)

Described in this embodiment will be one embodiment that can be applied to an oxide semiconductor film in the transistor included in the display device described in the above embodiment is described.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 72A:
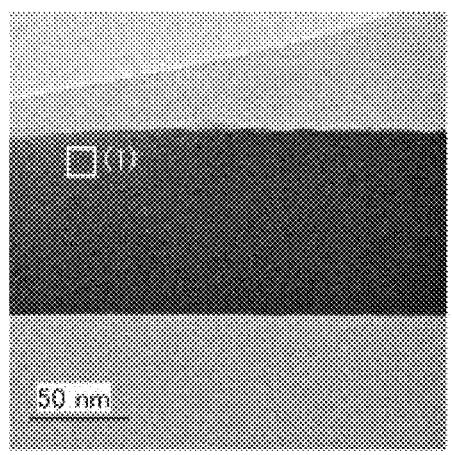
FIGS. 72A to 72C are Cs-corrected high-resolution TEM images of a cross section of a CAAC-OS.

A CAAC-OS observed with TEM is described below. FIG. 72A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 72B:
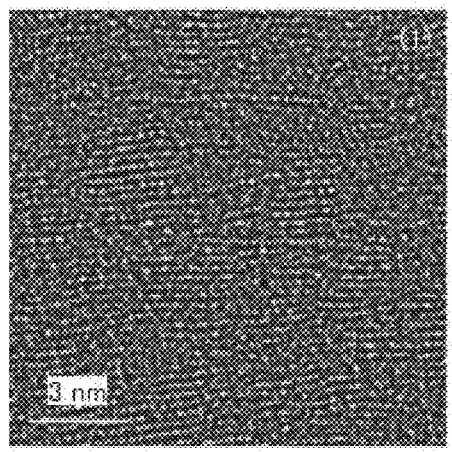

FIG. 72B is an enlarged Cs-corrected high-resolution TEM image of a region (1) in FIG. 72A. FIG. 72B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or top surface of the CAAC-OS.

Figure 72C:
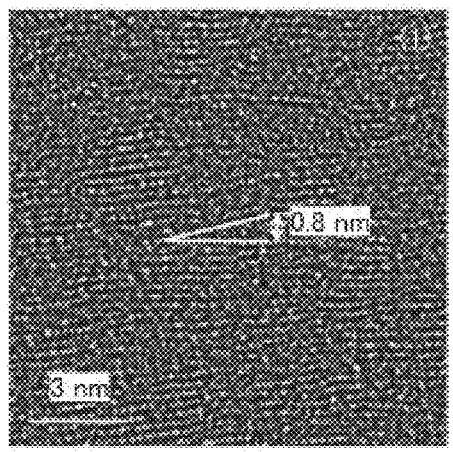

As shown in FIG. 72B, the CAAC-OS has a characteristic atomic arrangement. The characteristic atomic arrangement is denoted by an auxiliary line in FIG. 72C. FIGS. 72B and 72C prove that the size of a pellet is approximately 1 nm to 3 nm, and the size of a space caused by tilt of the pellets is approximately 0.8 nm. Therefore, the pellet can also be referred to as a nanocrystal (nc).

Figure 72D:
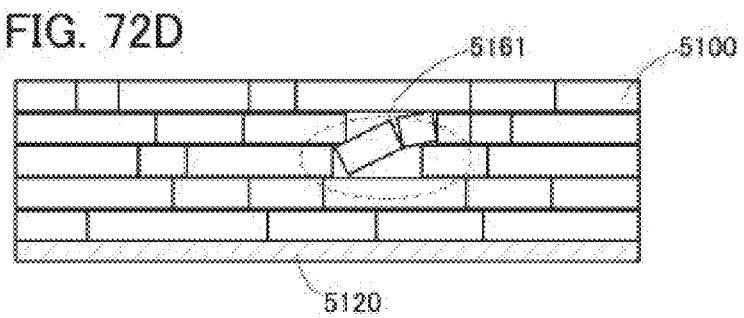
FIG. 72D is a cross-sectional schematic view of the CAAC-OS.

Here, according to the Cs-corrected high-resolution TEM images, the schematic arrangement of pellets 5100 of a CAAC-OS over a substrate 5120 is illustrated by such a structure in which bricks or blocks are stacked (see FIG. 72D). The part in which the pellets are tilted as observed in FIG. 72C corresponds to a region 5161 shown in FIG. 72D.

FIG. 73A shows a Cs-corrected high-resolution TEM image of a plane of the CAAC-OS observed from a direction substantially perpendicular to the sample surface. FIGS. 73B, 73C, and 73D are enlarged Cs-corrected high-resolution TEM images of regions (1), (2), and (3) in FIG. 73A, respectively. FIGS. 73B, 73C, and 73D indicate that metal atoms are arranged in a triangular, quadrangular, or hexagonal configuration in a pellet. However, there is no regularity of arrangement of metal atoms between different pellets.

Figure 74A:
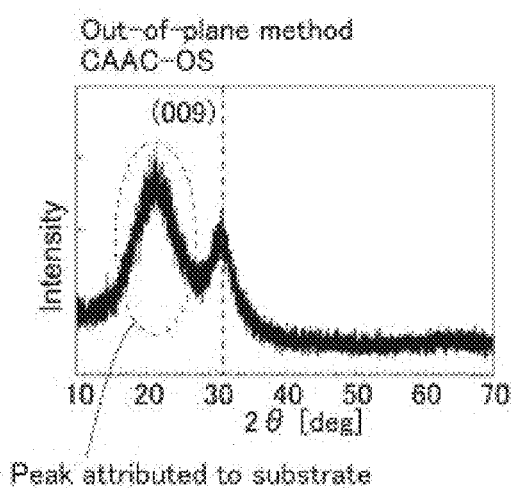
FIGS. 74A to 74C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 74A. This peak is derived from the (009) plane of the InGaZnO$_4$ crystal, which indicates that crystals in the CAAC-OS have c-axis alignment, and that the c-axes are aligned in a direction substantially perpendicular to the formation surface or top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 74B:
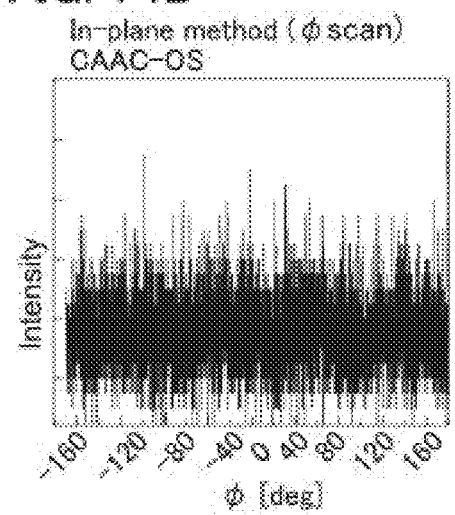
Figure 74C:
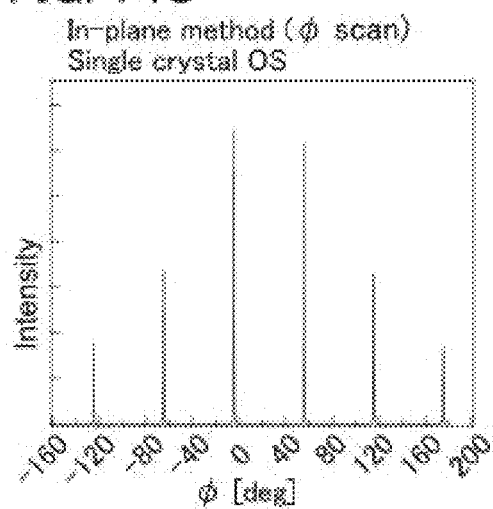

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 74B, a peak is not clearly observed. In contrast, in the case of a single crystal oxide semiconductor of InGaZnO$_4$, when φ scan is performed with 2θ fixed at around 56°, as shown in FIG. 74C, six peaks which are derived from crystal planes equivalent to the (110) plane are observed. Accordingly, the structural analysis using XRD shows that the directions of a-axes and b-axes are different in the CAAC-OS.

Figure 75A:
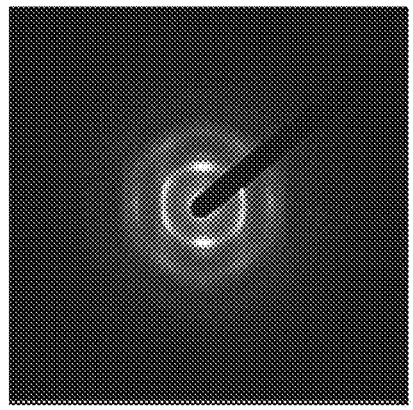
FIGS. 75A and 75B show electron diffraction patterns of a CAAC-OS.
Figure 75B:
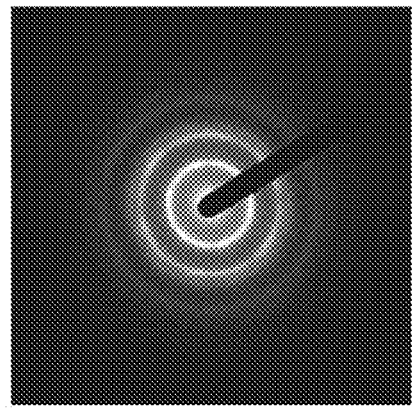

Next, a CAAC-OS analyzed by electron diffraction is described. For example, when an electron beam with a probe diameter of 300 nm is incident on a CAAC-OS including InGaZnO$_4$ crystal in a direction parallel to the sample surface, a diffraction pattern (also referred to as a selected-area transmission electron diffraction pattern) shown in FIG. 75A might be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or top surface of the CAAC-OS. Meanwhile, FIG. 75B shows a diffraction pattern obtained in such a manner that an electron beam with a probe diameter of 300 nm is incident on the same sample in a direction perpendicular to the sample surface. As shown in FIG. 75B, a ring-like diffraction pattern is observed. Thus, the electron diffraction also indicates that the a-axes and b-axes of the pellets included in the CAAC-OS do not have regular alignment. The first ring in FIG. 75B is considered to be derived from the (010) plane, the (100) plane, and the like of the InGaZnO$_4$ crystal. The second ring in FIG. 75B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor will be described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor will be described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 76:
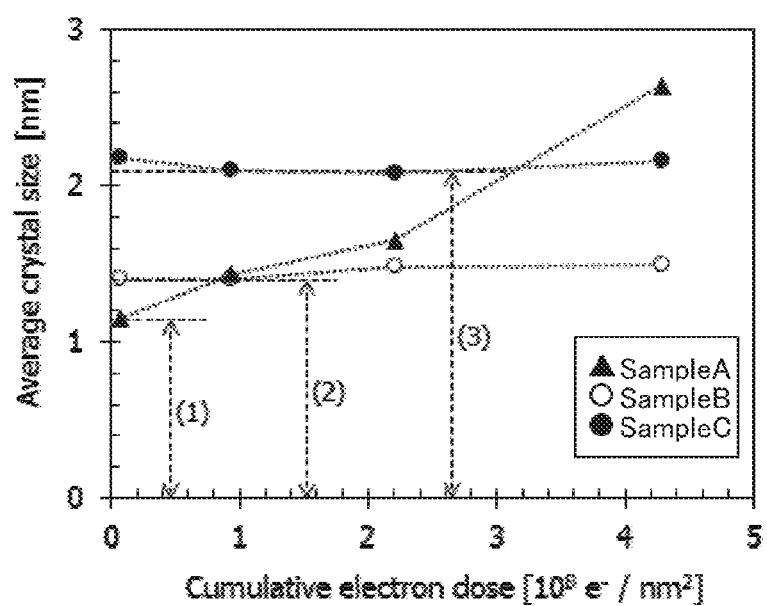
FIG. 76 shows a change of crystal parts in an In—Ga—Zn oxide owing to electron irradiation.

FIG. 76 shows a change in the average size of crystal parts (at 22 points to 45 points) in each sample. Note that the crystal part size corresponds to the length of a lattice fringe. FIG. 76 indicates that the crystal part size in the a-like OS increases with an increase in the cumulative electron dose. Specifically, as shown by (1) in FIG. 76, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 76, the average crystal sizes in an nc-OS and a CAAC-OS are approximately 1.4 nm and approximately 2.1 nm, respectively, regardless of the cumulative electron dose.

As described above, growth of the crystal part in the a-like OS is induced by electron irradiation. In contrast, in the nc-OS and the CAAC-OS, growth of the crystal part is hardly induced by electron irradiation. This indicates that the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate the density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS will be described below.

Figure 77A:
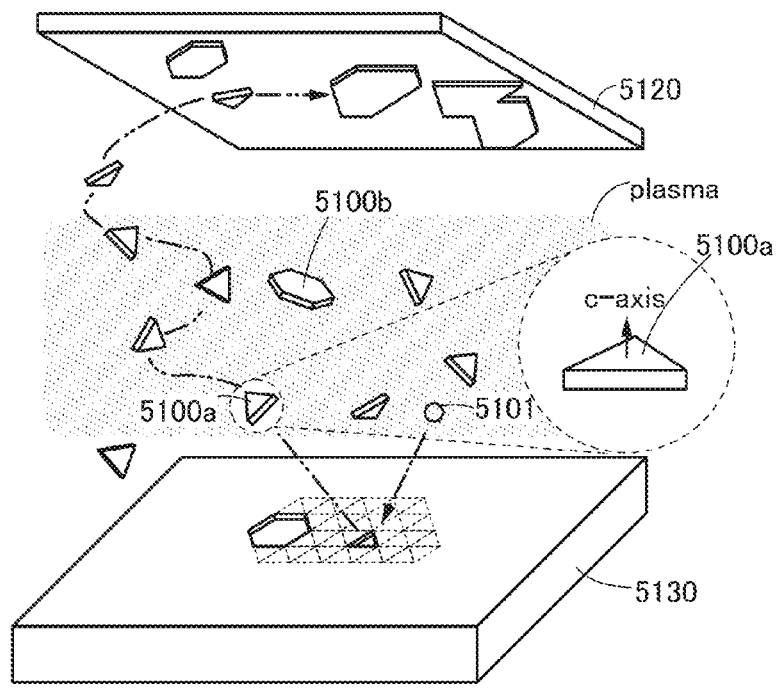
FIGS. 77A and 77B are schematic diagrams illustrating deposition models of a CAAC-OS and an nc-OS.

FIG. 77A is a schematic view of the inside of a deposition chamber where a CAAC-OS is deposited by a sputtering method.

A target 5130 is attached to a backing plate. A plurality of magnets are provided to face the target 5130 with the backing plate positioned therebetween. The plurality of magnets generate a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 78A:
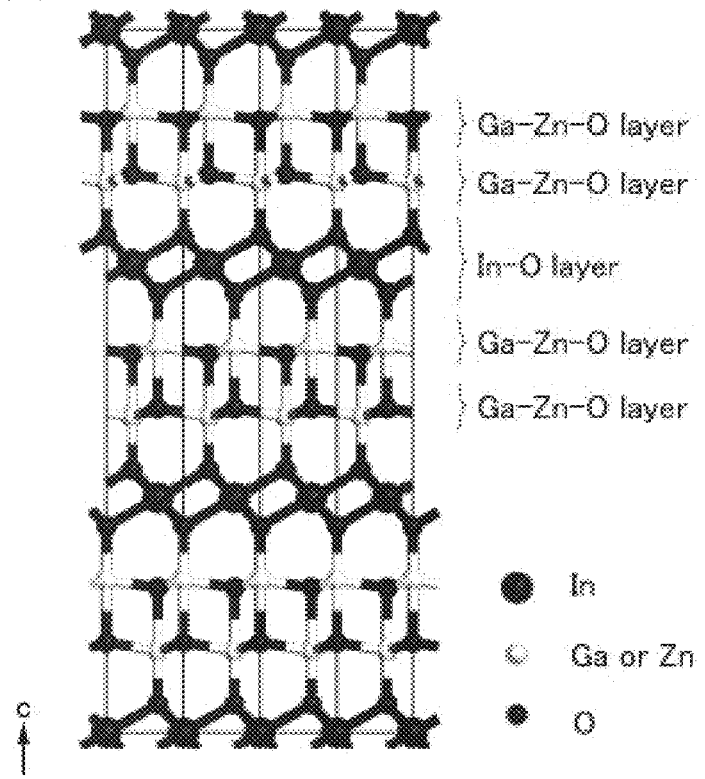
FIGS. 78A to 78C show an $InGaZnO_4$ crystal and a pellet.

Here, the target 5130 has a polycrystalline structure which includes a plurality of crystal grains and in which a cleavage plane exists in at least one crystal grain. FIG. 78A shows a structure of an $InGaZnO_4$ crystal included in the target 5130 as an example. Note that FIG. 78A shows a structure of the case where the $InGaZnO_4$ crystal is observed from a direction parallel to the b-axis. FIG. 78A shows that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100*a* and a pellet 5100*b* which are flat-plate-like (pellet-like) sputtered particles are separated and sputtered from the cleavage plane. Note that structures of the pellet 5100*a* and the pellet 5100*b* may be distorted by an impact of collision of the ion 5101.

The pellet 5100*a* is a flat-plate-like (pellet-like) sputtered particle having a triangle plane, e.g., regular triangle plane. The pellet 5100*b* is a flat-plate-like (pellet-like) sputtered particle having a hexagon plane, e.g., regular hexagon plane. Note that flat-plate-like (pellet-like) sputtered particles such as the pellet 5100*a* and the pellet 5100*b* are collectively called the pellet 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 78B:
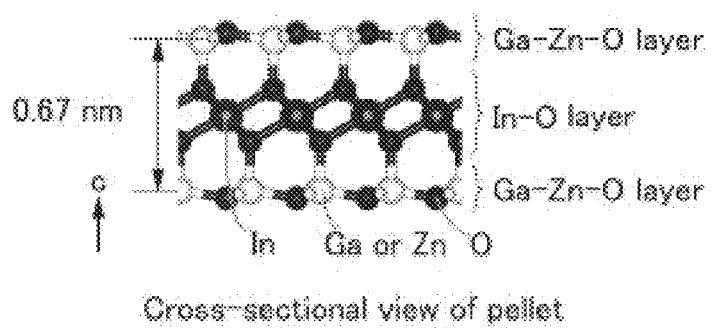
Figure 78C:
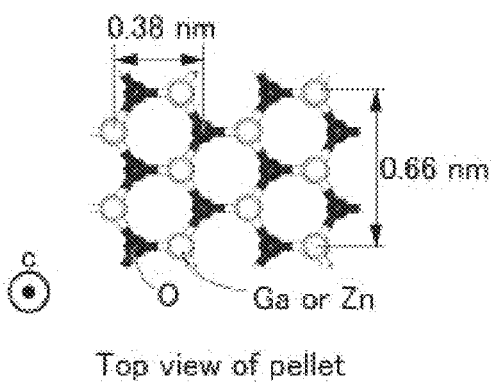

The thickness of the pellet 5100 is determined depending on the kind of deposition gas and the like. The thicknesses of the pellets 5100 are preferably uniform; the reason for this will be described later. In addition, the sputtered particle preferably has a pellet shape with a small thickness rather than a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, the width of the pellet 5100 is, for example, greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 76. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 78B is separated. FIG. 78C shows the structure of the separated pellet 5100 which is observed from a direction parallel to the c-axis. The pellet 5100 has a nanometer-sized sandwich structure including two Ga—Zn—O layers and an In—O layer.

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 76 corresponds to the amount of growth in plasma. Here, in the case where the temperature of the substrate 5120 is at around room temperature, the pellet 5100 on the substrate 5120 hardly grows; thus, an nc-OS is formed (see FIG. 77B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 77B:
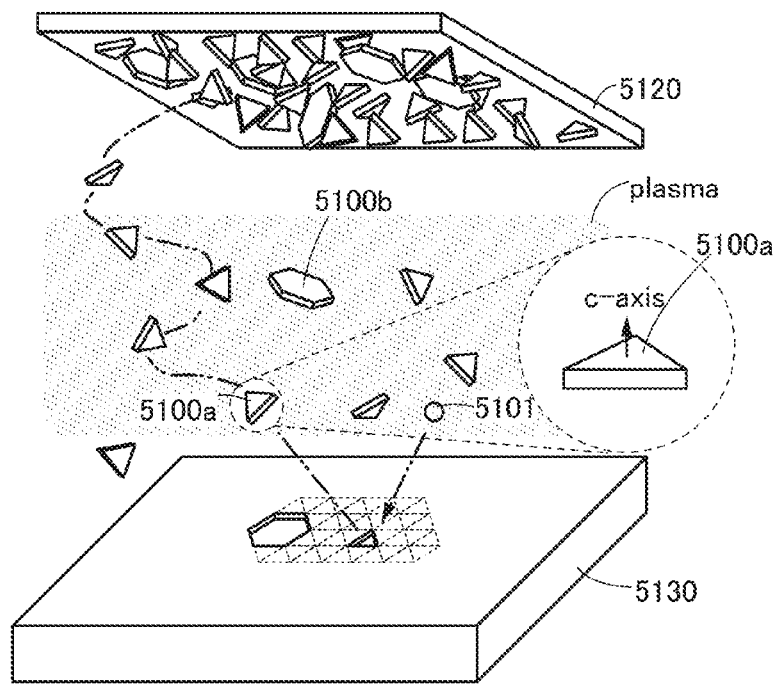

As shown in FIGS. 77A and 77B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, more preferably 30 G or higher, and still more preferably 50 G or higher. Alternatively, it is preferable to provide, on the top surface of the substrate 5120, a region where the magnetic field in a direction parallel to the top surface of the substrate 5120 is 1.5 times or higher, preferably twice or higher, more preferably 3 times or higher, and still more preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 77A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur because the pellet 5100 is turned into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 79A to 79D are cross-sectional schematic views.

Figure 79A:
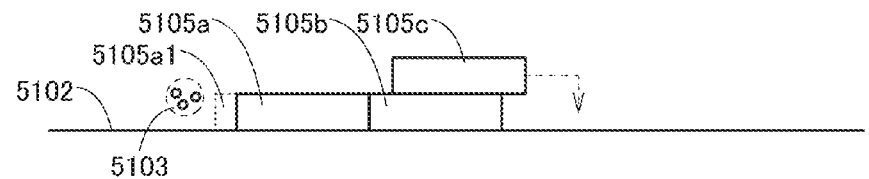
FIGS. 79A to 79D are schematic views illustrating a deposition model of CAAC-OS.

As illustrated in FIG. 79A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide are crystallized by heat from the substrate 5120 to form a region 5105a1 on another side surface of the pellet 5105a. Note that the plurality of particles 5103 may contain oxygen, zinc, indium, gallium, or the like.

Figure 79B:
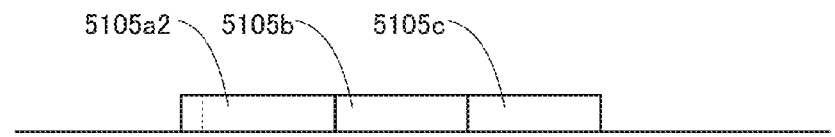

Then, as illustrated in FIG. 79B, the region 5105a1 grows to part of the pellet 5105a to form a pellet 5105a2. In addition, a side surface of the pellet 5105c is in contact with another side surface of the pellet 5105b.

Figure 79C:
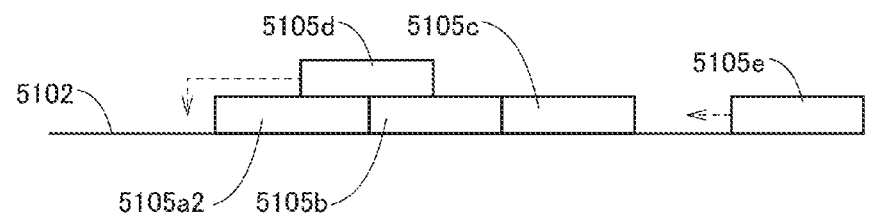

Next, as illustrated in FIG. 79C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 79D:
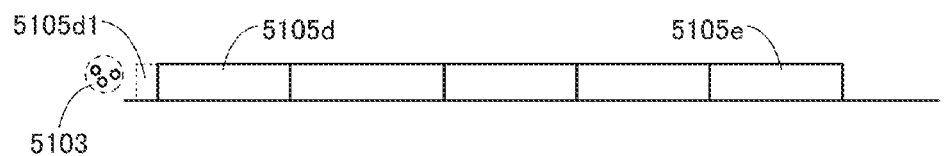

Then, as illustrated in FIG. 79D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide are crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in the size between (3) and (2) in FIG. 76 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might fit inside the large pellet. That is, the region having a single crystal structure can be used as the channel formation region. Furthermore, when the size of the pellet is increased, the region having a single crystal structure can be used as the channel formation region, the source region, and the drain region of the transistor.

When the channel formation region or the like of the transistor is thus formed in a region having a single crystal structure, the frequency characteristics of the transistor can be increased in some cases.

As shown in such a model, the pellets 5100 are considered to be deposited on the substrate 5120. A CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS has a structure in which n layers (n is a natural number) in each of which the pellets 5100 are arranged along the unevenness are stacked. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

The structures, methods, and the like shown in this embodiment can be used in appropriate combination with any of the structures, methods, and the like shown in the other embodiments.

(Embodiment 11)

In this embodiment, structure examples of electronic devices each using a display device of one embodiment of the present invention will be described. In addition, in this embodiment, a display module using a display device of one embodiment of the present invention will be described with reference to FIG. 53.

Figure 53:
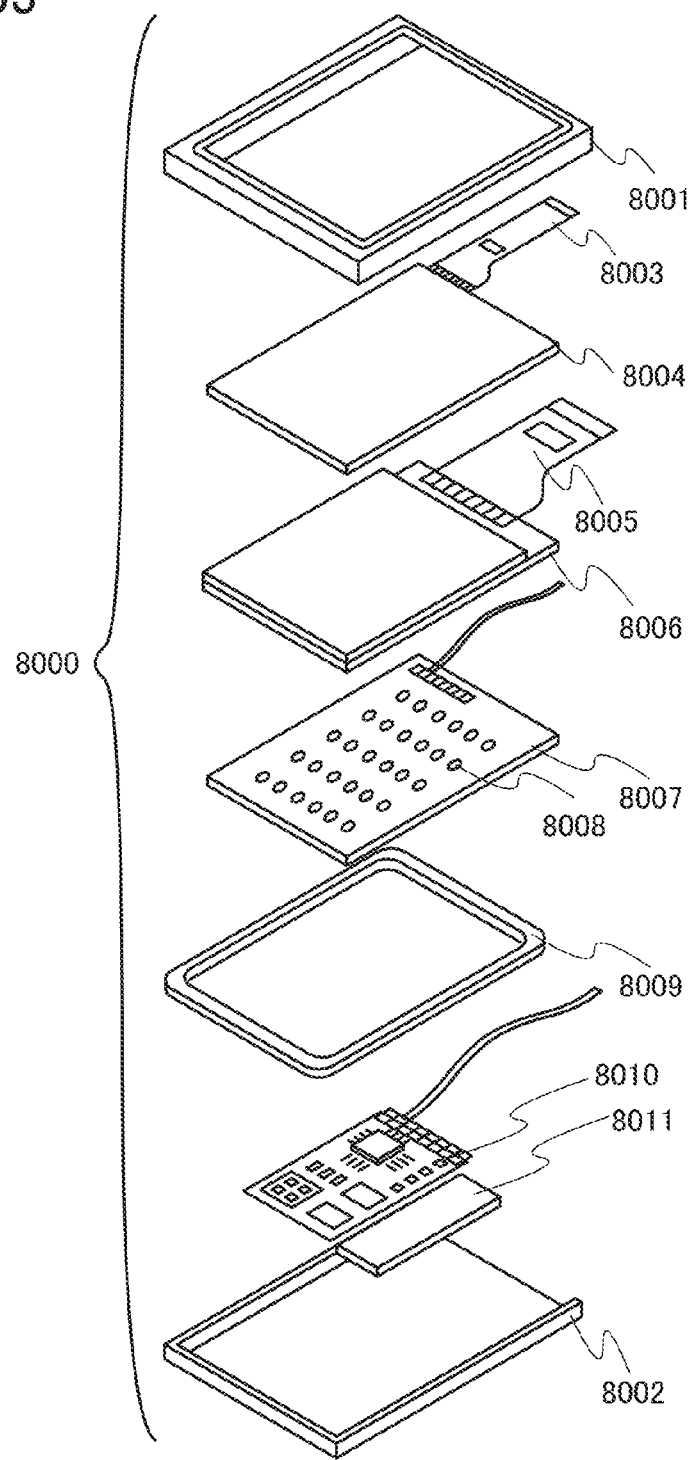
FIG. 53 illustrates a display module.

In a display module 8000 in FIG. 53, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 can also function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 54A to 54E are each an external view of an electronic device including a display device of one embodiment of the present invention.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, and a large-sized game machine such as a pachinko machine.

Figure 54A:
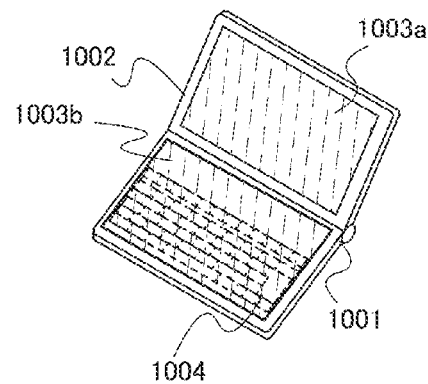
FIGS. 54A to 54E are external views of electronic devices of one embodiment.

FIG. 54A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is fabricated using any of the transistors described in the above embodiments as a switching element and used in the display portion 1003a or 1003b, whereby a highly reliable portable information terminal can be provided.

The portable information terminal illustrated in FIG. 54A can have a function of displaying a variety of information (e.g., a still image, a moving image, and a text image); a function of displaying a calendar, a date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 54A may transmit and receive data wirelessly. Through wireless communication, desired book data or the like can be purchased and downloaded from an e-book server.

Figure 54B:
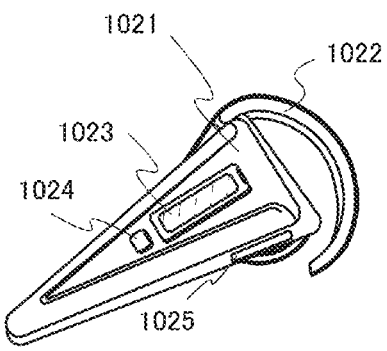

FIG. 54B illustrates a portable music player including, in a main body 1021, a display portion 1023, a fixing portion 1022 with which the portable music player can be worn on the car, a speaker, an operation button 1024, an external memory slot 1025, and the like. A liquid crystal panel or an organic light-emitting panel is fabricated using any of the transistors described in the above embodiments as a switching element and used in the display portion 1023, whereby a highly reliable portable music player can be provided.

Furthermore, when the portable music player illustrated in FIG. 54B has an antenna, a microphone function, or a wireless communication function and is used with a mobile phone, a user can talk on the phone wirelessly in a hands-free way while driving a car or the like.

Figure 54C:
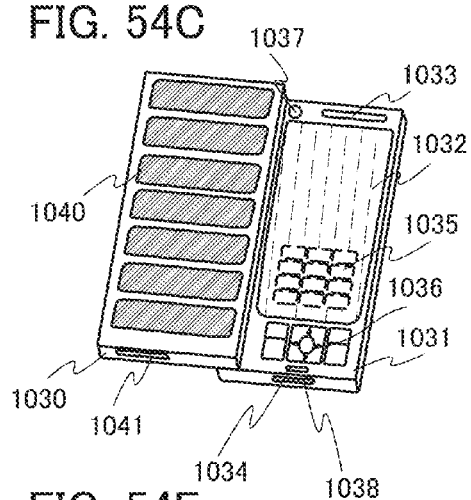

FIG. 54C illustrates a mobile phone, which includes two housings, a housing 1030 and a housing 1031. The housing 1031 includes a display panel 1032, a speaker 1033, a microphone 1034, a pointing device 1036, a camera 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Furthermore, the display panel 1032 includes a touch panel. A plurality of operation keys 1035 that are displayed as images are indicated by dotted lines in FIG. 54C. Note that a boosting circuit by which voltage output from the solar cell 1040 is increased to be sufficiently high for each circuit is also included.

In the display panel 1032, the direction of display is changed as appropriate depending on the application mode. In addition, the mobile phone has the camera 1037 and the display panel 1032 on the same surface, and thus it can be used as a video phone. The speaker 1033 and the microphone 1034 can be used for videophone calls, recording, and playing sound, etc., as well as voice calls. Moreover, the housings 1030 and 1031 in a state where they are developed as illustrated in FIG. 54C can shift by sliding so that one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Furthermore, by inserting a recording medium into the external memory slot 1041, a larger amount of data can be stored and moved.

In addition to the above functions, an infrared communication function, a television reception function, or the like may be provided.

Figure 54D:
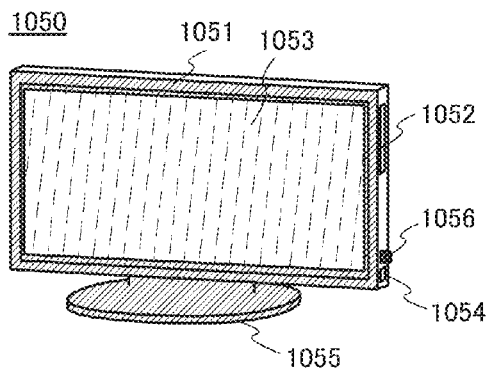

FIG. 54D illustrates an example of a television set. In a television set 1050, a display portion 1053 is incorporated in a housing 1051. Images can be displayed on the display portion 1053. Moreover, a CPU is incorporated in a stand 1055 supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. In addition, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Furthermore, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Furthermore, in the case where the off-state leakage current of the transistor described in the above embodiments is extremely small, when the transistor is used in the external memory 1056 or the CPU, the television set 1050 can have high reliability and sufficiently reduced power consumption.

Figure 54E:
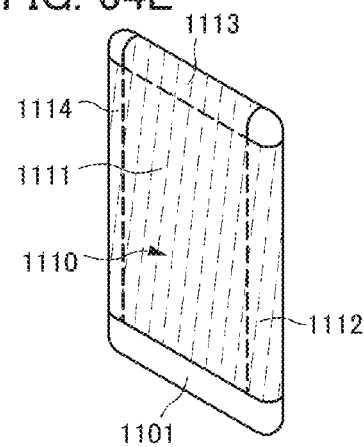

The portable information terminal illustrated in FIG. 54E includes a housing 1101 and a display panel 1110 which is provided so that an image can be displayed on a surface of the housing 1101.

The housing 1101 has a top surface, a rear surface, a first side surface, a second side surface in contact with the first side surface, a third side surface opposite to the first side surface, and a fourth side surface opposite to the second side surface.

The display panel 1110 includes a first display region 1111 overlapping with the top surface of the housing 1101, a second display region 1112 overlapping with one of the side surfaces of the housing 1101, a third display region 1113 overlapping with another one of the side surfaces of the housing 1101, and a fourth display region 1114 opposite to the second display region 1112.

Among the four side surfaces of the housing 1101, at least a region overlapping with the display panel 1110 preferably has a curved surface. For example, it is preferable that there be no corner portion between the top surface and the side surface and between the side surface and the rear surface, and that these surfaces form a continuous surface. Furthermore, the side surface is preferably a curved surface such that the inclination of a tangent line is continuous from the top surface to the rear surface of the housing 1101.

In addition to the display panel 1110, a hardware button, an external connection terminal, and the like may be provided on the surface of the housing 1101. It is preferable that a touch sensor be provided at a position overlapping with the display panel 1110, specifically, in regions overlapping with the display regions.

With the portable information terminal in FIG. 54E, display can be performed not only on a surface parallel to the top surface of the housing but also on a side surface of the housing. In particular, a display region is preferably provided along two or more side surfaces of the housing because the variety of display is further increased.

The structures, methods, and the like shown in this embodiment can be used in appropriate combination with any of the structures, methods, and the like shown in the other embodiments.

Example 1

Figure 55:
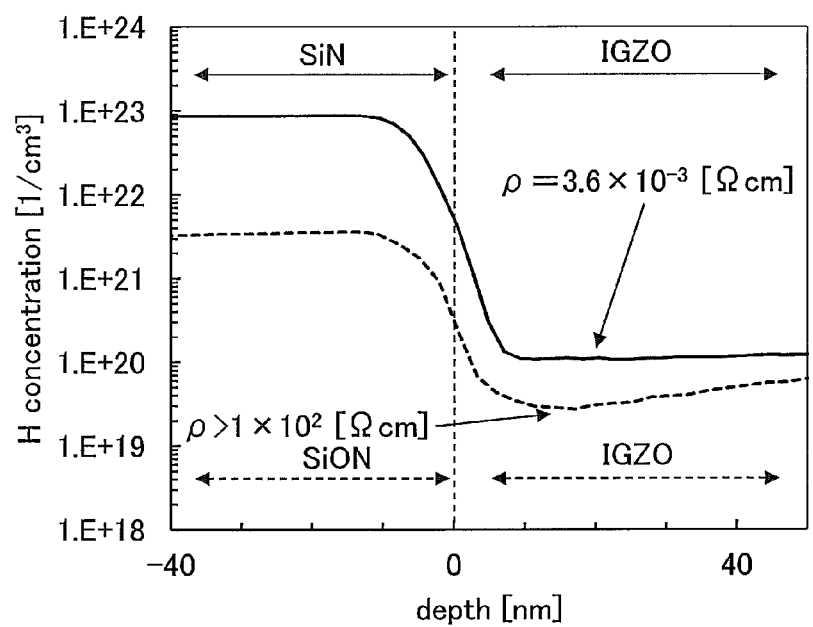
FIG. 55 shows the hydrogen concentration and resistivity of samples.
Figure 56:
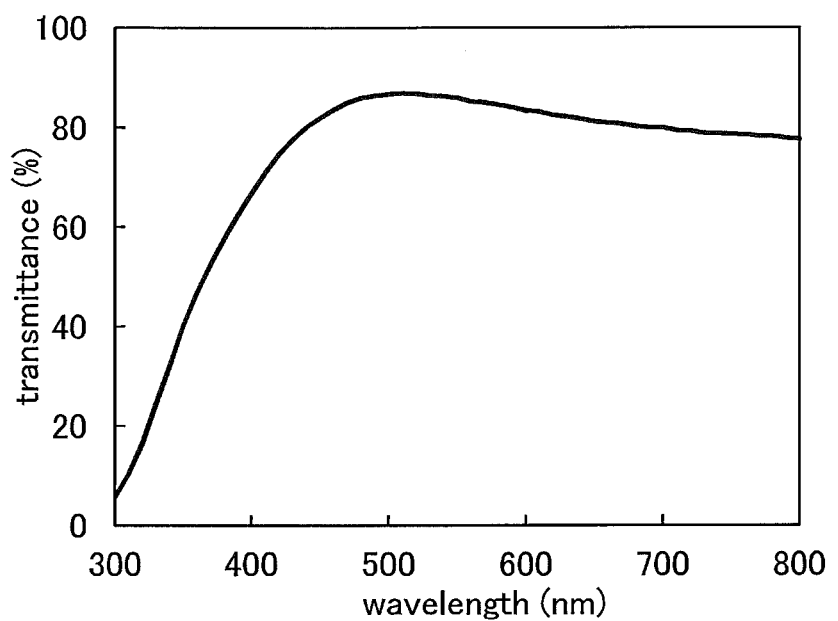
FIG. 56 shows the transmittance of a sample.

In this example, the results of measuring the hydrogen (H) concentration, resistivity, and transmittance of the oxide semiconductor film with a low resistance, which is described in Embodiment 1, will be shown in FIG. 55 and FIG. 56.

<Hydrogen (H) Concentration and Resistivity>

In this example, Sample A1 and Sample A2 were produced to measure impurity concentration.

First, a fabrication method of Sample A1 will be described below.

As Sample A1, a 100-nm-thick In-M-Zn oxide film (hereinafter referred to as an IGZO film, and in FIG. 55, referred to as IGZO) was deposited over a glass substrate. Then, heat treatment was performed at 450° C. for one hour in a nitrogen atmosphere, and successively performed at 450° C. for one hour in a mixed gas atmosphere of nitrogen and oxygen (the proportions of nitrogen and oxygen were 80% and 20%, respectively). After that, a 100-nm-thick silicon nitride film (referred to as SiN in FIG. 55) was deposited.

Note that the IGZO film was formed under the following conditions: a sputtering method was employed; a metal oxide target (In:Ga:Zn=1:1:1) was used; a sputtering gas containing 50 vol % of oxygen diluted with argon was used; the pressure was 0.6 Pa; the formation power was 5000 W; and the substrate temperature was 170° C.

The silicon nitride film was formed under the following conditions: a plasma CVD method was employed; the gas flow rates of $SiH_4$, $N_2$, and $NH_3$ were 50 sccm, 5000 sccm, and 100 sccm, respectively; the pressure was 100 Pa; the formation power was 1000 W; and the substrate temperature was 220° C. Sample A1 was obtained through the above process.

Next, a fabrication method of Sample A2 will be described below.

A 100-nm-thick IGZO film (in FIG. 55, referred to as IGZO) was deposited over a glass substrate. Then, heat treatment was performed at 450° C. for one hour in a nitrogen atmosphere, and successively performed at 450° C. for one hour in a mixed gas atmosphere of nitrogen and oxygen (the proportions of nitrogen and oxygen were 80% and 20%, respectively). After that, 450-nm-thick silicon oxynitride film (referred to as SiON in FIG. 55) and a 100-nm-thick silicon nitride film were deposited to be stacked.

Note that the film formation conditions of the IGZO film and the silicon nitride film were similar to those of Sample A1. In addition, as for the silicon oxynitride film, a 50-nm-thick silicon oxynitride film was formed by a plasma CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, a 400-nm-thick silicon oxynitride film was formed by a plasma CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C. Sample A2 was obtained through the above process.

FIG. 55 shows the results of impurity analysis of Samples A1 and A2.

Note that the impurity analysis was performed from the glass substrate side by secondary ion mass spectrometry (SIMS).

In FIG. 55, a solid line represents the concentration profile of hydrogen (H) which was obtained by measurement of Sample A1. A dashed line represents the concentration profile of hydrogen (H) which was obtained by measurement of Sample A2.

FIG. 55 shows that the concentration of hydrogen (H) in the IGZO film is $1.0 \times 10^{20}$ atoms/cm$^3$ and $5.0 \times 10^{19}$ atoms/cm$^3$ in Sample A1 and in Sample A2, respectively.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) in the film in the thickness direction are analyzed by SIMS, an average value in a region where the film is provided, the value is not greatly changed, and an almost constant level of strength can be obtained is employed as the concentrations of hydrogen (H).

A difference in hydrogen (H) concentration between the IGZO films was thus found by changing the constituent element of the insulating film in contact with the IGZO film. The hydrogen (H) concentration in the IGZO film in contact with the silicon oxynitride film was higher than that in the IGZO film in contact with the silicon nitride film. This indicates that hydrogen (H) diffused from the silicon nitride film to the IGZO film.

Note that the resistivity of the IGZO film in Sample A2 was greater than or equal to the upper measurement limit ($1 \times 10^2$ Ωcm), whereas the resistivity of the IGZO film in Sample A1 was reduced to $\rho = 3.6 \times 10^{-3}$ Ωcm, which was equivalent to the resistivity of an ITO film, an example of a light-transmitting conductive film.

<Transmittance>

Next, the transmittance of the oxide semiconductor film with a low resistance will be described.

First, a fabrication method of Sample A3 will be described below.

A 50-nm-thick IGZO film was deposited over a glass substrate and a 100-nm-thick silicon nitride film was stacked thereover.

Note that the IGZO film was formed under the following conditions: a sputtering method was employed; a metal oxide target (In:Ga:Zn=1:1:1) was used; a sputtering gas containing 33 vol % of oxygen diluted with argon was used; the pressure was 0.4 Pa; the formation power was 200 W; and the substrate temperature was 300° C.

The silicon nitride film was formed under the following conditions: a plasma CVD method was employed; the gas flow rates of $SiH_4$, $N_2$, and $NH_3$ were 50 sccm, 5000 sccm, and 100 sccm, respectively; the pressure was 100 Pa; the formation power was 1000 W; and the substrate temperature was 350° C. Sample A3 was obtained through the above process.

Next, the visible light transmittance of Sample A3 was measured. FIG. 56 shows the measured transmittance of Sample A3. The transmittance of Sample A3 is higher than or equal to 80% in a wide energy region. This indicates that the oxide semiconductor film with a low resistance can be utilized as a light-transmitting electrode.

Example 2

In this example, to find the states related to the resistivity of the oxide semiconductor having conductivity, analysis was performed by constant photocurrent method (CPM), hard X-ray photoelectron spectroscopy (HX-PES), SIMS, electron spin resonance (ESR), and thermal desorption spectroscopy (TDS). In addition, the temperature dependence of resistivity was measured.

<CPM>

First, the relationship between heat treatment in a vacuum atmosphere and the number of oxygen vacancies in the oxide semiconductor film was analyzed by CPM. The CPM measurement allows the amount of light absorbed in defects forming a deep level to be measured with high sensitivity and compared relatively.

A fabrication method of samples that were subjected to CPM measurement will be described below.

Here, an IGZO film was deposited over a quartz substrate by a sputtering method, and then a pair of electrodes were formed on the IGZO film, so that the samples were obtained. Note that some of the samples were subjected to heat treatment at 700° C. or 800° C. in a vacuum atmosphere ($4 \times 10^{-4}$ Pa) after the IGZO film was formed. Table 8 shows the fabrication conditions of the IGZO film in each sample. Note that in Table. 8, a sample that was not subjected to heat treatment is denoted by as-depo, a sample that was subjected to heat treatment at 700° C. in a vacuum atmosphere is denoted by 700° C. vac. Anneal, and a sample that was subjected to heat treatment at 800° C. in a vacuum atmosphere is denoted by 800° C. vac. Anneal.

TABLE 8

|  | Film thickness [nm] | Substrate temperature | Sputtering gas | Pressure [Pa] | Power [W] | Heat treatment |
|---|---|---|---|---|---|---|
| as-depo | 100 | 170° C. | O2 = 50% (diluted with Ar) | 0.6 | DC = 2.5 kW | Not performed |
| 700° C. vac. Anneal | 100 | 170° C. | O2 = 50% (diluted with Ar) | 0.6 | DC = 2.5 kW | 700° C. |
| 800° C. vac. Anneal | 100 | 170° C. | O2 = 50% (diluted with Ar) | 0.6 | DC = 2.5 kW | 800° C. |

Next, each sample was measured by CPM. In the CPM measurement, in a state where voltage is applied between the pair of electrodes in contact with the IGZO film in each sample, the amount of light with which a sample surface between the pair of electrodes is irradiated is adjusted so that a photocurrent value is kept constant, and an absorption coefficient is derived from the amount of irradiation light at each wavelength. When the measurement object has a defect in the CPM measurement, the absorption coefficient at energy which corresponds to a level at which the defect exists (calculated from a wavelength) is increased. By multiplying an increase in the absorption coefficient by a constant, the defect density of the measurement object can be obtained.

Figure 57:
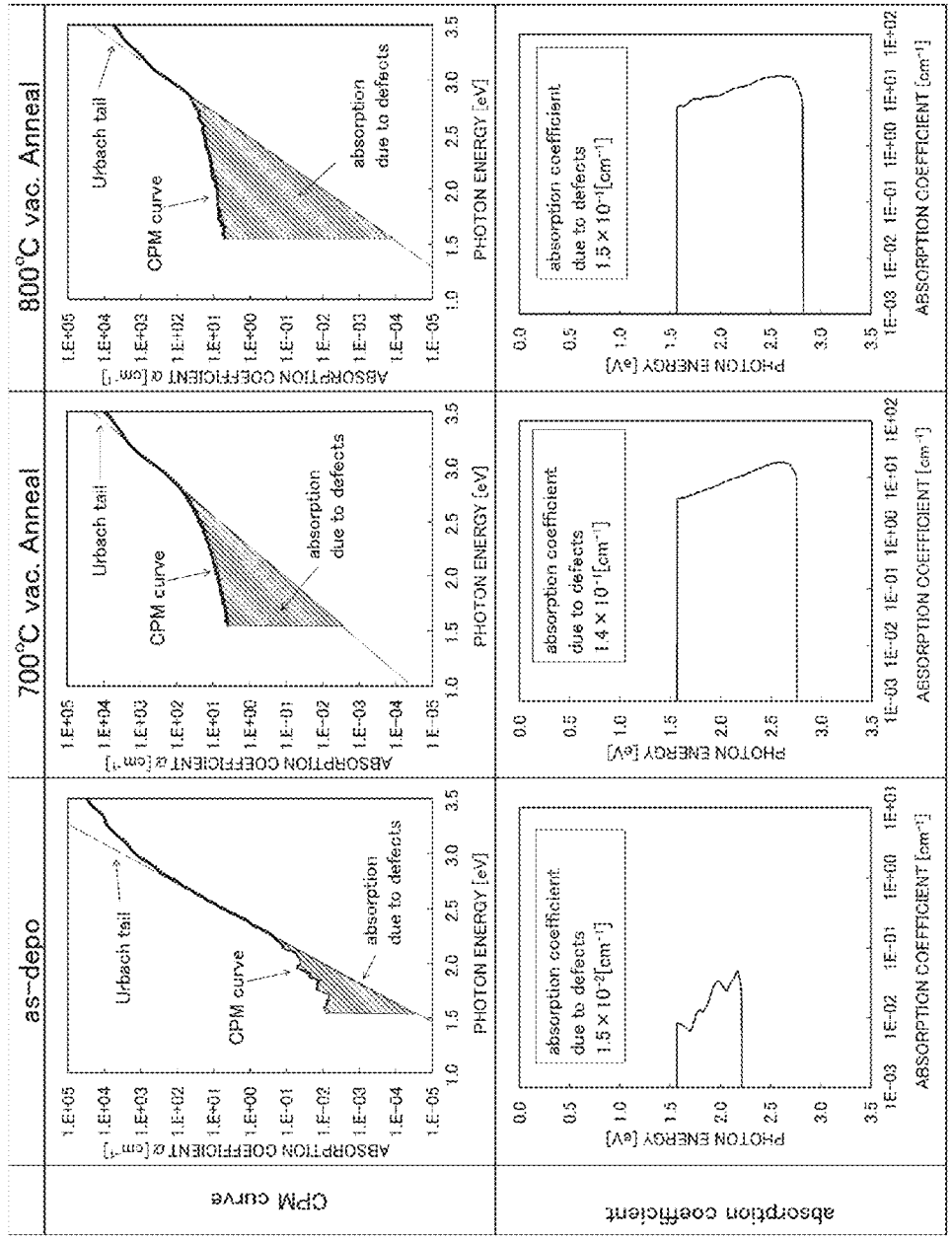
FIG. 57 shows the CPM measurement results of samples.

The upper section of FIG. 57 shows the CPM measurement results of each sample. A part of the absorption coefficient which is called an urbach tail (dashed line in the upper section of FIG. 57) due to the band tail is removed from a curve (solid line in the upper section of FIG. 57) of the absorption coefficient obtained by the CPM measurement, whereby the absorption coefficient due to the localized levels can be calculated. Note that the urbach tail indicates a constant gradient region on a curve of the absorption coefficient obtained by the CPM measurement, and the gradient is called urbach energy. In the upper section of FIG. 57, the horizontal axis represents photon energy while the vertical axis represents absorption coefficient.

The lower section of FIG. 57 shows the integral values of shaded regions in the upper section of FIG. 57. In the lower section of FIG. 57, the horizontal axis represents absorption coefficient while the vertical axis represents photon energy. On the vertical axis in the lower section of FIG. 57, the bottom of the conduction band and the top of the valence band of the IGZO film are 0 eV and 3.5 eV, respectively. In the lower section of FIG. 57, solid curves correspond to deep levels in the band gap of each sample. In each sample, absorption due to the deep level in the band gap was found in a range of photon energy of 1.6 eV to 2.8 eV. Table 9 shows the quantitative values of the absorption coefficient due to the deep level in the band gap of each sample.

TABLE 9

| | Absorption coefficient due to detects [cm$^{-1}$] |
|---|---|
| as-depo | $1.5 \times 10^{-2}$ |
| 700° C. vac. anneal | $1.4 \times 10^{-1}$ |
| 800° C. vac. anneal | $1.4 \times 10^{-1}$ |

Table 9 shows that the quantitative value of the absorption coefficient due to the deep level in band gap increases when heat treatment is performed in a vacuum atmosphere. Note that according to the first-principles calculations, oxygen vacancies $V_O$ in an IGZO film probably make a deep level in the band gap; therefore, the deep level in the band gap measured by CPM will also be related to the oxygen vacancies $V_O$. In other words, oxygen vacancies $V_O$ in an IGZO film might be generated by heat treatment in a vacuum atmosphere.

<HX-PES (1)>

First, the level in the gap of an oxide semiconductor film was measured by HX-PES.

A fabrication method of Sample B1 will be described.

A 100-nm thick IGZO film was deposited over a silicon wafer.

Note that the IGZO film was formed under the following conditions: a sputtering method was employed; a metal oxide target (In:Ga:Zn=1:1:1) was used; a sputtering gas containing 33 vol % of oxygen diluted with argon was used; the pressure was 0.4 Pa; the formation power was 500 W; and the substrate temperature was 300° C. Sample B1 was obtained through the above process.

Next, a fabrication method of Sample B2 will be described.

After a 100-nm-thick IGZO film was deposited over a silicon wafer under the same conditions as those of Sample B1, argon was added to the IGZO film, so that an IGZO film having oxygen vacancies was formed.

Here, an argon ion was added to the IGZO film by an ion implantation method, thereby forming an IGZO film including argon at a concentration of $1 \times 10^{20}$ 1/cm$^3$. Sample B2 was obtained through the above process.

Next, a fabrication method of Sample B3 will be described.

Sample B3 was obtained by heating Sample B2 in a hydrogen atmosphere at 133 Pa and 350° C. for one hour, thereby obtaining an IGZO film to which H was introduced.

Figure 58:
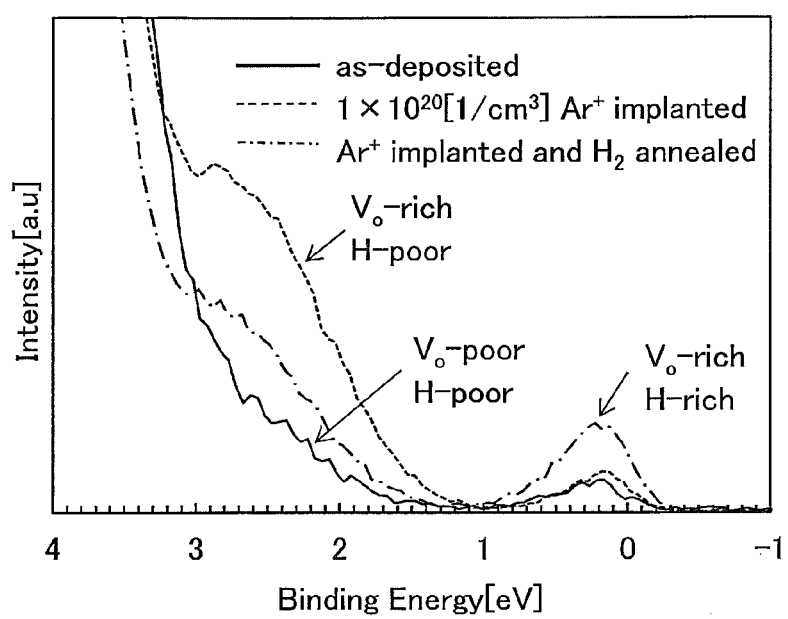
FIG. 58 shows the HX-PES analysis results of samples.

FIG. 58 shows the results of analyzing Samples B1 to B3 by HX-PES. In FIG. 58, the horizontal axis represents binding energy and the vertical axis represents the intensity of a signal (arbitrary unit).

In FIG. 58, a binding energy of 0 eV on the horizontal axis substantially represents the Fermi level. A level in the gap is found at a position of approximately 0.2 eV from the Fermi level (hereinafter referred to as a shallow level).

The level in the gap is also found at a position of approximately 2 eV from the Fermi level (hereinafter referred to as a deep level).

Sample B1 has a small number of oxygen vacancies $V_O$ ($V_O$-poor) and a low hydrogen concentration (H-poor). Sample B2 includes a large number of oxygen vacancies $V_O$ ($V_O$-rich) and a low hydrogen concentration (H-poor). Sample B3 includes a large number of oxygen vacancies $V_O$ ($V_O$-rich) and a high hydrogen concentration (H-rich).

In Sample B3, a signal with a high intensity is found at a position of approximately 0.2 eV from the Fermi level. This suggests that a shallow level at approximately 0.2 eV from the Fermi level is essential to decrease the resistance of the oxide semiconductor film.

<SIMS>

Figure 59:
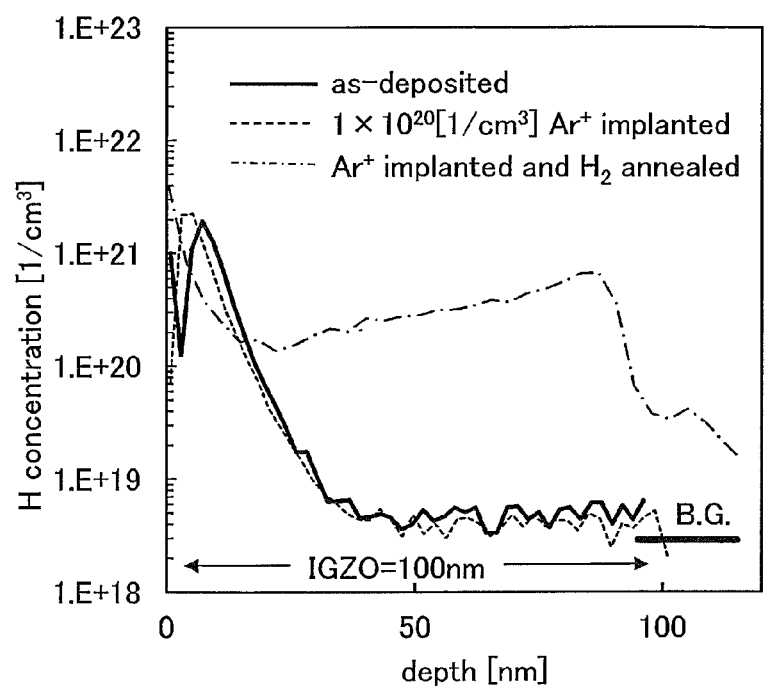
FIG. 59 shows the SIMS measurement results of samples.

Next, the hydrogen (H) concentration in the IGZO films of Samples B1 to B3 was measured by SIMS, and the results are shown in FIG. 59. In FIG. 59, a solid line, a dashed line, and a dashed-dotted line represent the measurement results of Samples B1, B2, and B3, respectively.

FIG. 59 shows that the hydrogen (H) concentration is almost the same in Samples B1 and B2. In contrast, the hydrogen (H) concentration in Sample B3 is higher than that in Samples B1 and B2, and specifically is approximately $1 \times 10^{20}$ 1/cm$^3$.

Furthermore, as shown in Samples B2 and B3, the number of oxygen vacancies ($V_O$) in the IGZO film to which Ar was added increases because of the disordered crystal structure. The increase in the number of oxygen vacancies ($V_O$) increases the intensity of signal at a deep level as shown in Samples B2 and B3 in FIG. 58. In contrast, in Sample B2, the signal intensity increases only at a deep level, while in Sample B3 in which hydrogen (H) was introduced to Sample B2, the signal intensity decreases at a deep level and the signal intensity increases at a shallow level.

These results indicate that a shallow level, which causes a decreased resistance of the IGZO film, is related to $H_O$ generated by oxygen vacancies ($V_O$) and hydrogen (H) in the IGZO film.

<ESR>

Next, defects in an IGZO film were analyzed by ESR to examine the behavior of oxygen vacancies ($V_O$) and hydrogen (H) in the IGZO film in more detail.

To find out the origin of an ESR signal in an IGZO film, ESR measurement was performed on samples including thin films of oxide semiconductors (IGZO, zinc oxide, gallium oxide, and indium oxide).

Here, thin films were deposited over a quartz substrate by a sputtering method, whereby each sample was obtained. Table 10 and Table 11 show the fabrication conditions of the thin films in the samples. Note that Table 10 shows the fabrication conditions of samples that were not subjected to heat treatment after the deposition, and Table 11 shows the fabrication conditions of samples that were subjected to heat treatment after the deposition.

than the g value of a free electron (g=2.0023). This suggests that the ESR signal observed in the sample including the IGZO film is related to a metal element.

Next, the relationship between the film thickness and the integral intensity of the ESR signal observed at g=1.93 in the sample including the IGZO film was measured. The measurement was performed on samples in which IGZO films with thicknesses ranging from 20 nm to 100 nm were deposited over a quartz substrate. Note that the IGZO film was formed under the following conditions: a sputtering method was employed; a metal oxide target (In:Ga:Zn=1:1:1) was used; a sputtering gas containing 33 vol % of oxygen diluted with argon was used; the pressure was 0.4 Pa; the formation power was 500 W; and the substrate temperature was 200° C.

TABLE 10

| Films | Film thickness [nm] | Substrate temperature | Sputtering gas | Pressure [Pa] | Power [W] | Heat treatment after deposition |
|---|---|---|---|---|---|---|
| IGZO (1:1:1) | 100 | room temperature | O2 = 33% (diluted with Ar) | 0.4 | DC = 200 W | not performed |
| Zinc oxide | 100 | room temperature | O2 = 33% (diluted with Ar) | 0.4 | DC = 200 W | not performed |
| Gallium oxide | 100 | 200° C. | O2 = 33% (diluted with Ar) | 0.4 | RF = 400 W | not performed |
| Indium oxide | 100 | room temperature | O2 = 33% (diluted with Ar) | 0.4 | DC = 200 W | not performed |

TABLE 11

| Films | Film thickness [nm] | Substrate temperature | Sputtering gas | Pressure [Pa] | Power [W] | Heat treatment after deposition |
|---|---|---|---|---|---|---|
| IGZO (1:1:1) | 100 | 300° C. | O2 = 33% (diluted with Ar) | 0.4 | DC = 500 W | 450° C. N2 1 hr |
| Zinc oxide | 100 | 200° C. | O2 = 33% (diluted with Ar) | 0.4 | DC = 200 W | 850° C. N2 1 hr |
| Gallium oxide | 100 | 200° C. | O2 = 33% (diluted with Ar) | 0.4 | RF = 400 W | 850° C. N2 1 hr |
| Indium oxide | 100 | 200° C. | O2 = 0% (diluted with Ar) | 0.4 | DC = 200 W | 850° C. N2 1 hr |

Figure 60:
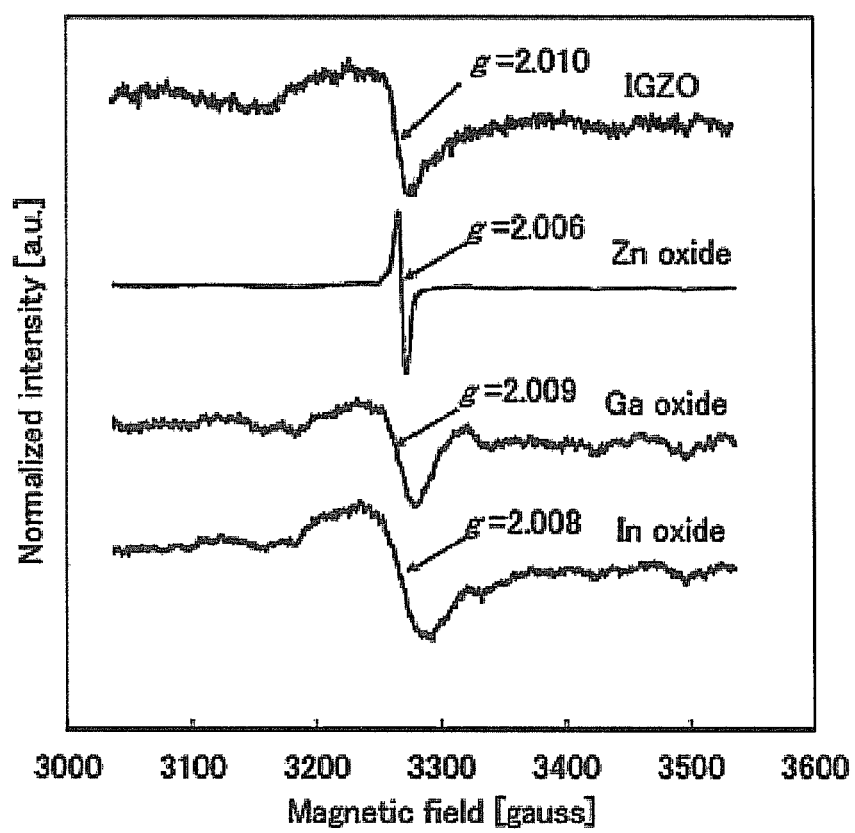
FIG. 60 shows ESR signals observed at around g=2 in samples that were not subjected to heat treatment.

FIG. 60 shows the ESR measurement results of the samples including the oxide semiconductor films formed under the conditions shown in Table 10. In FIG. 60, the horizontal axis represents magnetic field and the vertical axis represents normalized ESR signal intensity. An asymmetric ESR signal was observed at around g=2 in all the samples including an IGZO film, a zinc oxide film, a gallium oxide film, and an indium oxide film.

Figure 61:
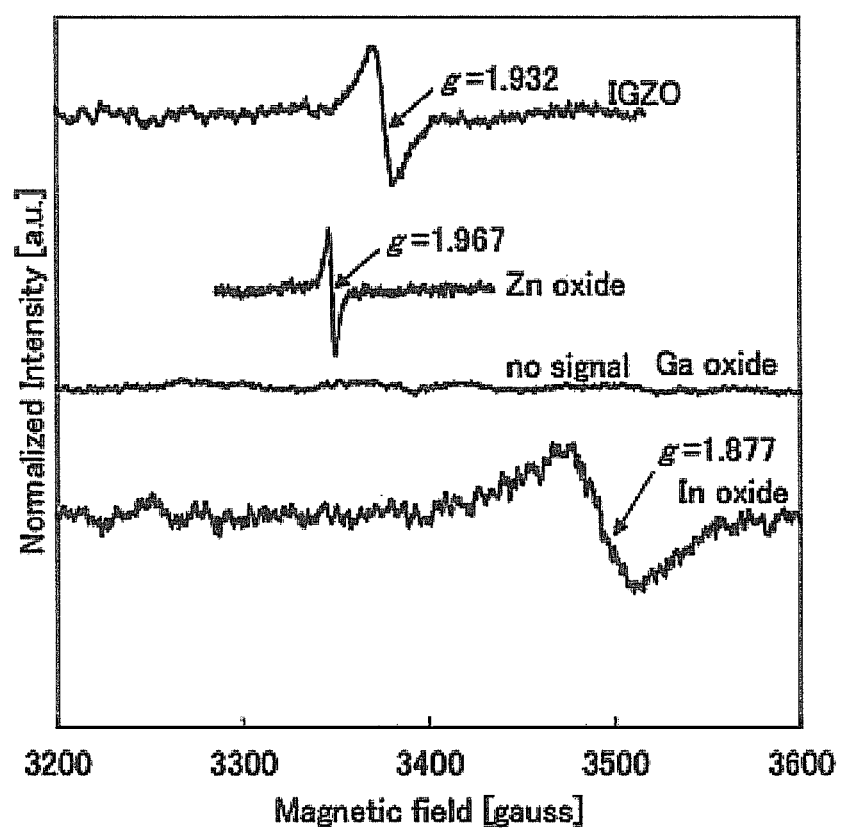
FIG. 61 shows ESR signals observed at around g=1.9 in samples that were subjected to heat treatment in a nitrogen atmosphere.

FIG. 61 shows the ESR measurement results of the samples including the oxide semiconductor films formed under the conditions shown in Table 11. In FIG. 61, the horizontal axis represents magnetic field and the vertical axis represents normalized ESR signal intensity. An ESR signal was observed at g=1.932 in the sample including an IGZO film, an ESR signal was observed at g=1.967 in the sample including a zinc oxide film, and an ESR signal was observed at g=1.877 in the sample including an indium oxide film. In contrast, no ESR signal was observed in the sample including a gallium oxide film.

Figure 62:
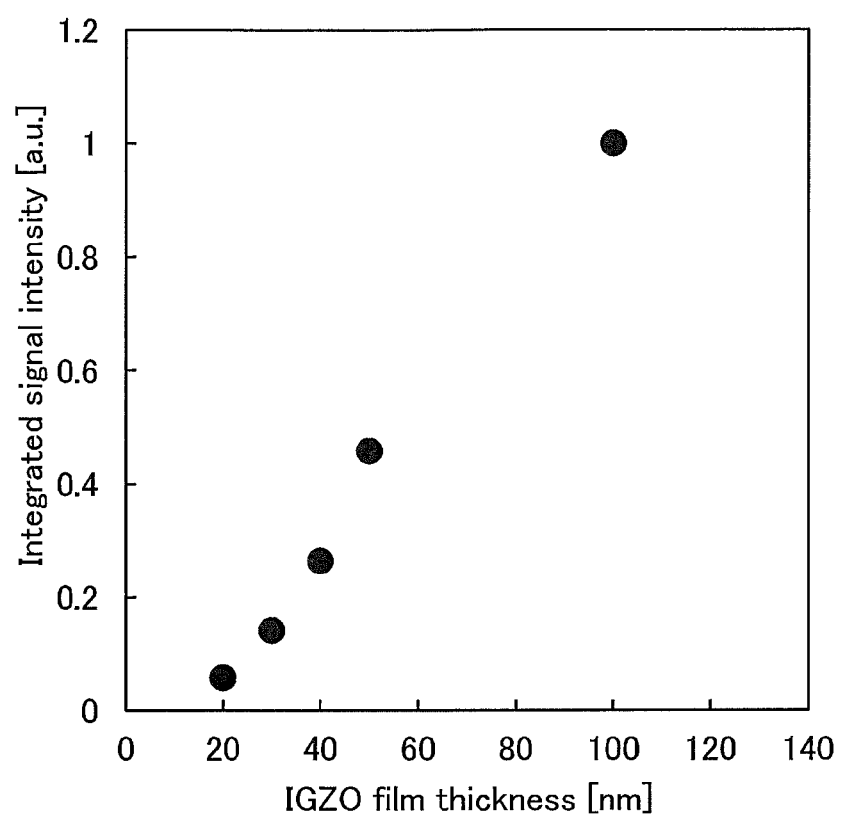
FIG. 62 shows an ESR signal observed at g=1.93 of the IGZO films with varying thicknesses.

From the above results, the ESR signal observed at g=1.93 in the sample including the IGZO film subjected to heat treatment in a nitrogen atmosphere was found to be different from the ESR signal observed in the samples including the zinc oxide film, the gallium oxide film, and the indium oxide film which includes oxides of constituent elements of IGZO. The ESR signal observed in the sample including the IGZO film has a g value considerably smaller FIG. 62 shows the results of ESR measurement of the IGZO films with varying thicknesses. In FIG. 62, the horizontal axis represents the thickness of the IGZO film in each sample, and the vertical axis represents the integral intensity of the ESR signal observed at g=1.93. In the above samples, the ESR signal was observed at g=1.93. Note that by integrating the ESR signal, the number of spins causing the ESR signal can be calculated. In other words, FIG. 62 shows the IGZO film thickness dependence of the number of spins calculated from the integral intensity of the ESR signal observed at g=1.93. From FIG. 62, the integral intensity of the ESR signal observed at g=1.93 in the IGZO film is substantially proportional to the film thickness. This indicates that the spins causing the ESR signal observed at g=1.93 are present uniformly in the IGZO film and are not localized at the interface between the quartz substrate and the IGZO film or on the surface of the IGZO film.

Figure 63:
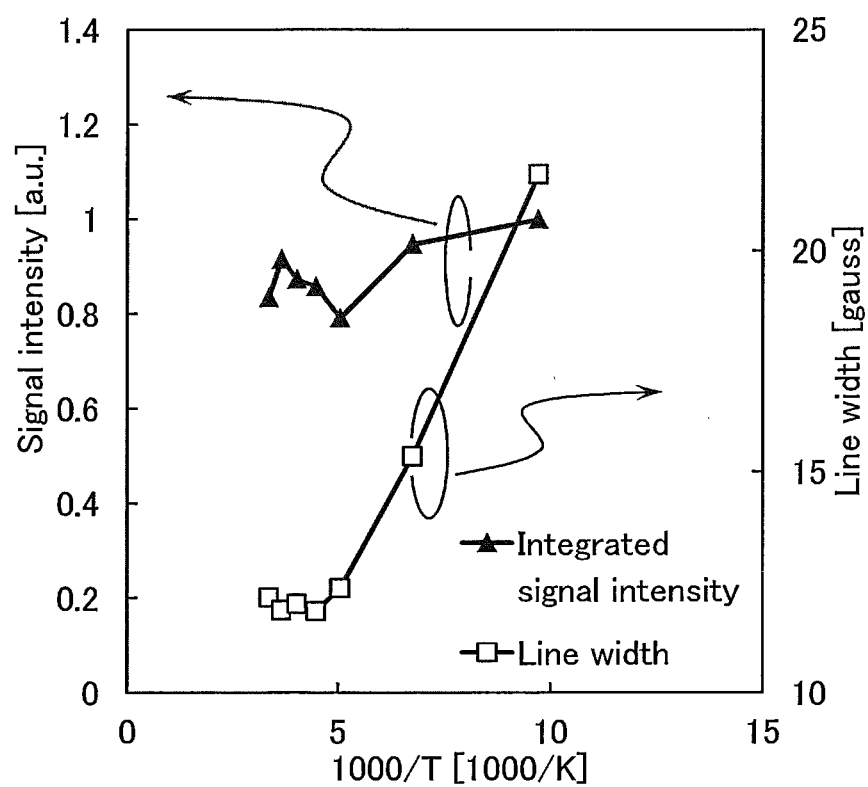
FIG. 63 shows the intensity of ESR signals observed at g=1.93 and line width of an IGZO films.

Next, a change in the ESR signal observed at g=1.93 with varying temperatures was measured and the results are shown in FIG. 63. In FIG. 63, the horizontal axis represents 1000/T (T: the absolute temperature), the left vertical axis represents the intensity of the ESR signal observed at g=1.93, and the right vertical axis represents ESR line width. Here, the ESR line width is defined as the distance between magnetic fields having the maximum signal intensity and the minimum signal intensity in ESR measurement data output as the first derivative of Lorentz function. The signal intensity was obtained in such a manner that a value obtained by performing the second-order integration of the signal intensity in the ESR measurement data output as a derivative is normalized to be 1 at room temperature. FIG. 63 shows that the intensity of the ESR signal observed at g=1.93 hardly depends on the measurement temperature. In addition, the ESR line width is found to increase with a decrease in temperature. Such temperature dependence is the feature of an ESR signal obtained by ESR measurement of a Pauli paramagnetic such as graphite. That is, the ESR signal shown in FIG. 63, which has temperature dependence, would be caused by conductive electrons.

Next, to examine the behavior of oxygen vacancies ($V_O$) and hydrogen (H) in the IGZO film in more detail, analysis was performed on samples in which oxygen vacancies ($V_O$) and hydrogen (H) were introduced into IGZO films by heat treatment in a vacuum atmosphere and heat treatment in a reduced $H_2$ atmosphere. Here, Samples B5 to B12 were produced by heat treatment with different conditions. Table 12 shows the conditions of the heat treatment for each sample. In each of Samples B5 to B12, a 100-nm-thick IGZO film was formed over a quartz substrate. The IGZO film was deposited under the conditions of the IGZO film in Sample A1, in which the power was 2500 W.

In Samples B5 to B12, heat treatment in a vacuum atmosphere was performed at $4 \times 10^{-4}$ Pa for one hour. By the aforementioned <CMP> in this example, the heat treatment in a vacuum atmosphere increases oxygen vacancies in the IGZO film. The heat treatment is also expected to reduce the hydrogen concentration in the IGZO film.

In addition, Samples B6, B8, B10, and B12 were subjected to heat treatment in a reduced $H_2$ atmosphere in order to add hydrogen to the IGZO film. That is, Samples B6, B8, B10, and B12 will include a larger amount of oxygen vacancies and hydrogen. Note that the heat treatment in a reduced $H_2$ atmosphere was performed at 133 Pa for one hour so that elements other than hydrogen would enter the IGZO film as little as possible.

TABLE 12

|  | Annealed in vacuum | Annealed in $H_2$ atmosphere |
| --- | --- | --- |
| Sample B5 | as-deposited | — |
| Sample B6 |  | 350° C. |
| Sample B7 | 450° C. | — |
| Sample B8 |  | 350° C. |
| Sample B9 | 600° C. | — |
| Sample B10 |  | 350° C. |
| Sample B11 | 800° C. | — |
| Sample B12 |  | 350° C. |

Figure 64:
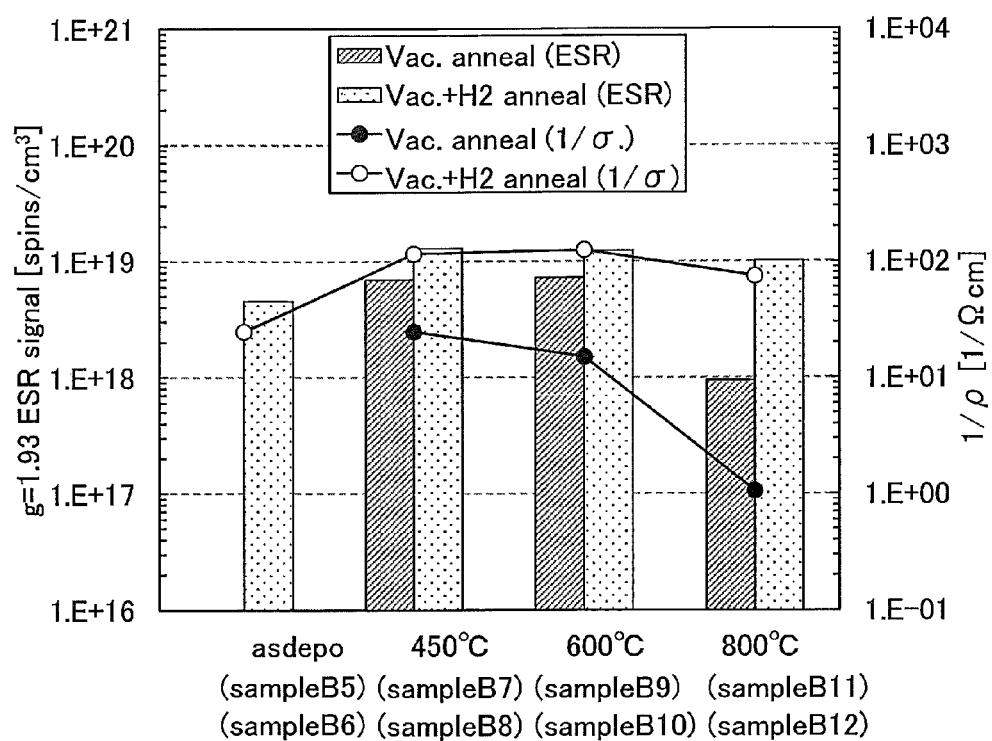
FIG. 64 shows the resistivity and ESR spin density of samples.

FIG. 64 shows the relationship between the resistivity of the IGZO films in Samples B5 to B12, the ESR spin density, and the heat treatment conditions. The ESR spin density is the integral intensity of the signal observed at g=1.93 in the IGZO film. In FIG. 64, bar graphs represent the ESR spin density and line charts represent changes in the resistivity with the ESR spin density. To clarify the tendency, 1/ρ was plotted instead of the resistivity ρ in FIG. 64. Black dots represent 1/ρ of Samples B7, B9, and B11, and white dots represent 1/ρ of Samples B6, B8, B10, and B12.

Figure 65:
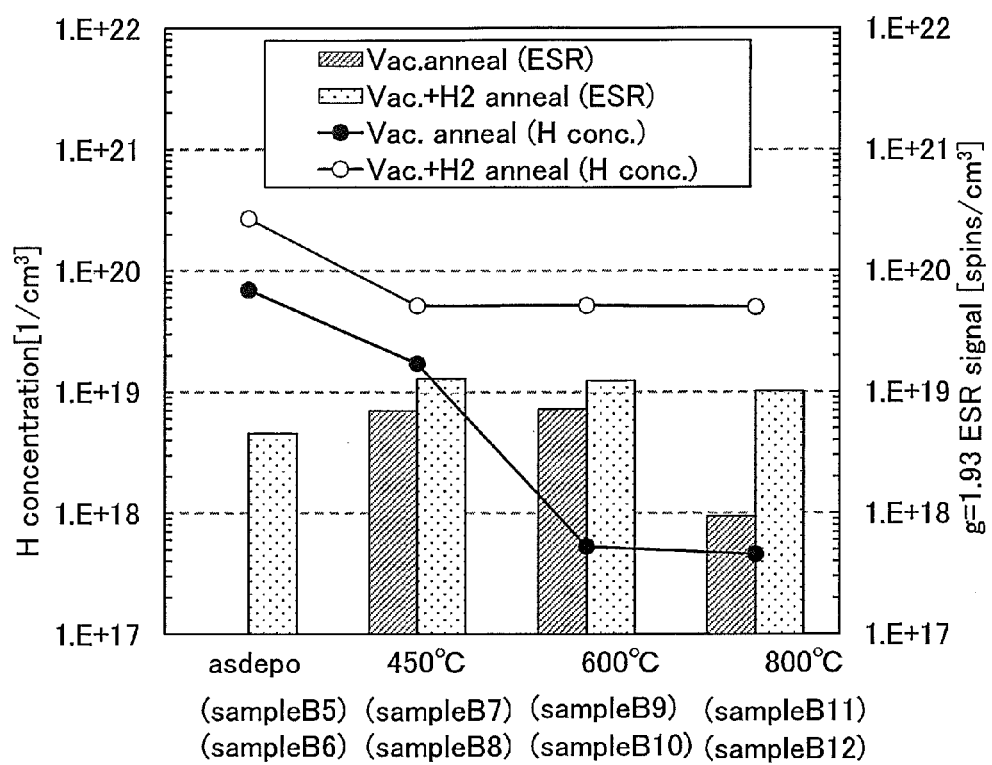
FIG. 65 the relationship between the ESR spin density and hydrogen concentration of samples.

FIG. 65 shows the relationship between the hydrogen concentration in the IGZO films in Samples B5 to B12, the ESR spin density, and the heat treatment conditions. The ESR spin density is the integral intensity of the ESR signal observed at g=1.93 in the IGZO film. In FIG. 65, bar graphs represent the ESR spin density and line charts represent changes in the hydrogen concentration in the IGZO film. Black dots represent the hydrogen concentrations of Samples B5, B7, B9, and B11, and white dots represent the hydrogen concentration of Samples B6, B8, B10, and B12.

Figure 66:
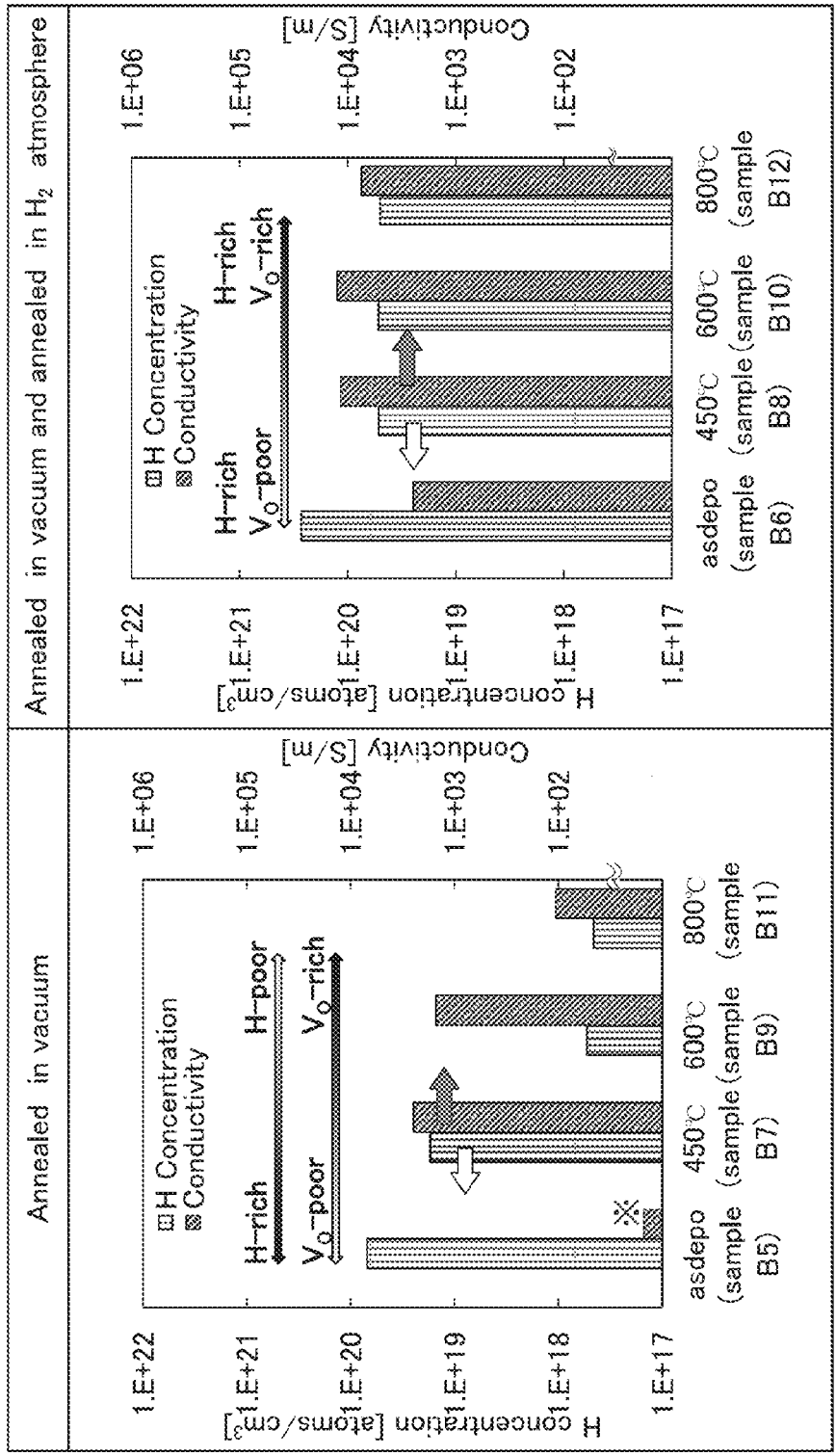
FIG. 66 shows the hydrogen concentration and conductivity of samples.

FIG. 66 shows the relationship between the hydrogen concentration in the IGZO films in Samples B5 to B12, the conductivity (1/ρ), and the heat treatment conditions. In FIG. 66, bar graphs with vertical lines represent hydrogen concentration and bar graphs with oblique lines represent conductivity.

In FIG. 64, the resistivity and ESR spin density of Sample B5 are not plotted because the resistivity is greater than or equal to the upper detection limit ($1 \times 10^2$ Ωcm) and the ESR spin density is less than or equal to the lower detection limit ($3.7 \times 10^6$ spins/cm$^3$).

In FIG. 64, the resistivity apparently increases in Samples B7, B9, and B11, which were subjected to heat treatment in a vacuum atmosphere. In FIG. 66, the conductivity decreases in Samples B7, B9, and B11. In contrast, FIG. 65 and FIG. 66 show that in Samples B7, B9, and B11, which were subjected to heat treatment in a vacuum atmosphere, the hydrogen concentration decreases with an increase in heat treatment temperature. In addition, the ESR spin density in Sample B11 decreases.

FIG. 64 also shows that in Samples B8, B10, and B12, which were subjected to heat treatment in a reduced $H_2$ atmosphere, the resistivity is almost the same regardless of the heat treatment temperature in a vacuum atmosphere. Furthermore, in FIG. 66, the conductivity of Samples B8, B10, and B12 is almost the same. In addition, FIG. 65 and FIG. 66 show that in Samples B8, B10, and B12, which were subjected to heat treatment in a reduced $H_2$ atmosphere, the hydrogen concentration is almost the same regardless of the heat treatment temperature in a vacuum atmosphere. Moreover, the ESR spin density in Sample B12 increases by heat treatment performed in a reduced $H_2$ atmosphere.

The above results indicated that by performing heat treatment in a reduced $H_2$ atmosphere after the heat treatment in a vacuum atmosphere, the ESR spin density increases when both the hydrogen concentration and the number of oxygen vacancies increase. In other words, the coexistence of oxygen vacancies ($V_O$) and hydrogen (H) will considerably influence the resistivity and the conductivity.

Figure 67:
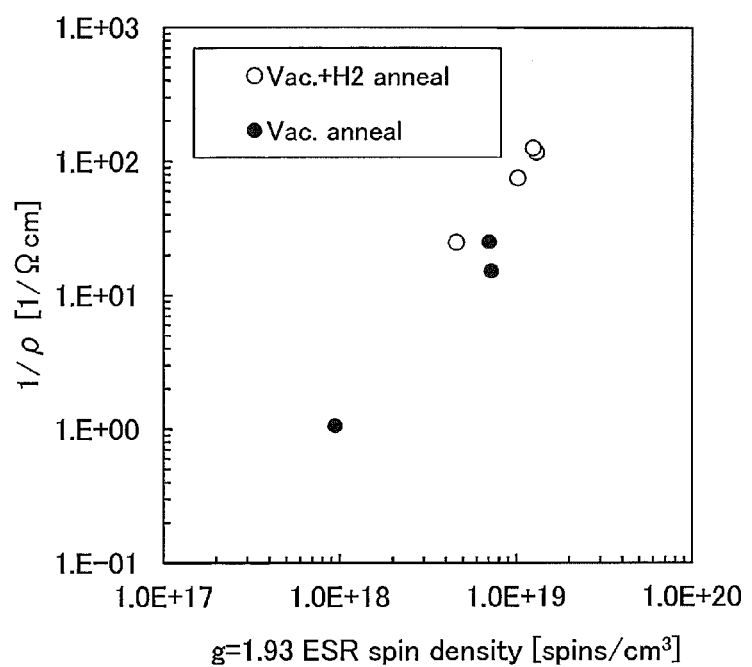
FIG. 67 shows the relationship between the ESR spin density and 1/ρ of samples.

FIG. 67 shows the relationship between the ESR spin density and 1/ρ of Samples B5 to B12. In FIG. 67, the horizontal axis represents the ESR spin density of the signal observed at g=1.93 in the IGZO film of each sample, and the vertical axis represents the 1/ρ of the IGZO film in each sample. In FIG. 67, black dots represent the measurement results of Samples B7, B9, and B11, and white dots represent the measurement results of Samples B6, B8, B10, and B12.

In FIG. 67, the ESR spin density apparently has a positive correlation with the 1/ρ. This suggest that the ESR signal observed at g=1.93 in the IGZO film is closely related to $H_O$ and the resistivity.

<TDS>

Figure 68:
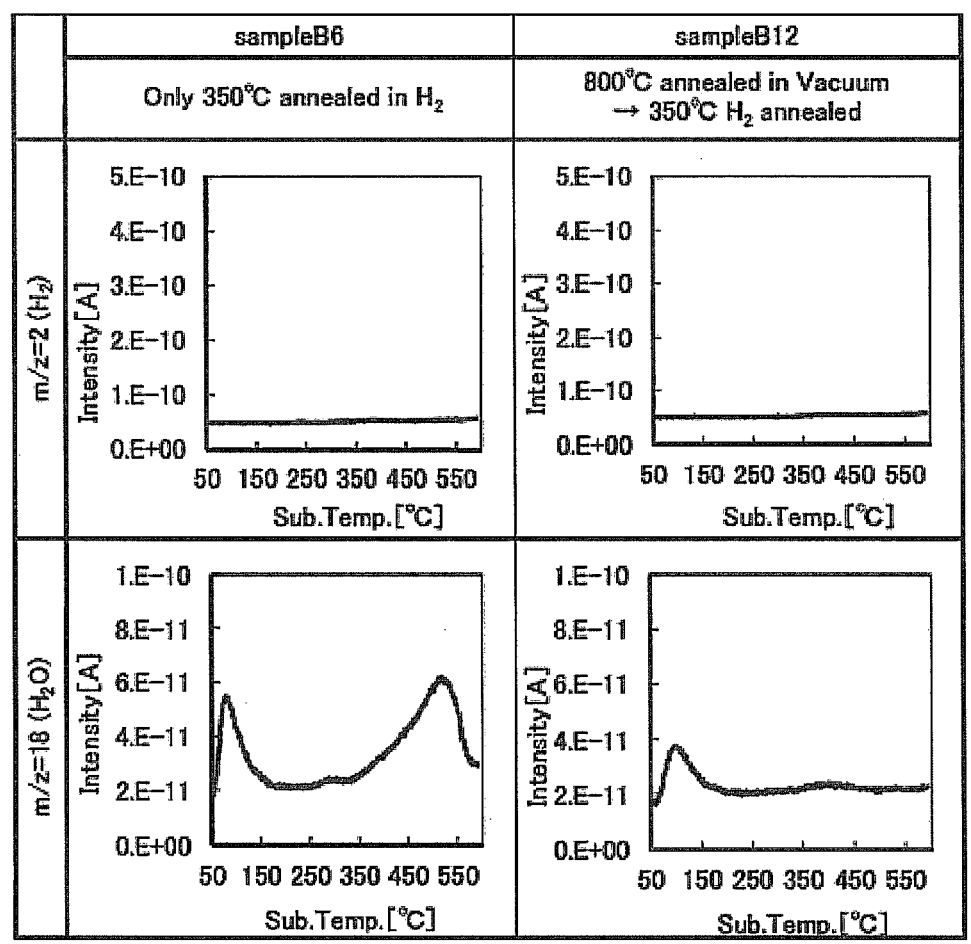
FIG. 68 shows the results of TDS analysis of samples.

To examine the stability of $H_O$, TDS analysis was performed on Samples B6 and B12 shown in Table 12. FIG. 68 shows the TDS analysis results. Samples B6 and B12 were subjected to heat treatment at surface temperatures ranging from 50° C. to 600° C., and FIG. 68 shows the intensity proportional to the amount of released $H_2$ (mass-to-charge ratio m/z=2) and released $H_2O$ (mass-to-charge ratio m/z=18). Note that the release of $H_2O$ at a surface temperature of 100° C. or lower is caused by release of water adsorbed on the surface.

Samples B6 and B12 contain a large amount of H; however, release of H$_2$O gas is not found in Sample B12 which was baked in a vacuum at 800° C., even when Sample B12 is heated to 550° C. This is probably because oxygen vacancies (V$_O$) are introduced and hydrogen (H) entering therein becomes stable as H$_O$ to be unlikely to be released by heat treatment. This result is coincident with the calculation results described in Embodiment 4.

<HX-PES (2)>

To examine whether the mechanism described in Embodiment 4 is a cause of a decrease in the resistance of the stacked film of an IGZO film and a silicon nitride film, HX-PES analysis was performed on samples in which a silicon nitride film was formed over an IGZO film and then etched back.

First, a fabrication method of Sample B13 will be described.

A 100-nm thick IGZO film was deposited over a silicon wafer.

Note that the IGZO film was formed under the following conditions: a sputtering method was employed; a metal oxide target (In:Ga:Zn=1:1:1) was used; a sputtering gas containing 50 vol % of oxygen diluted with argon was used; the pressure was 0.6 Pa; the formation power was 2500 W; and the substrate temperature was 170° C. Sample B13 was obtained through the above process.

Next, a fabrication method of Sample B14 will be described.

A 100-nm-thick IGZO film was deposited over a silicon wafer under the same conditions as those of Sample B13; then, a 100-nm-thick silicon nitride film was formed.

The silicon nitride film was formed under the following conditions: a plasma CVD method was employed; the gas flow rates of SiH$_4$, N$_2$, and NH$_3$ were 50 sccm, 5000 sccm, and 100 sccm, respectively; the pressure was 100 Pa; the formation power was 1000 W; and the substrate temperature was 350° C.

Next, the silicon nitride film was etched to expose the IGZO film. Sample B14 was obtained through the above process. Note that the IGZO film included in Sample B14 has a reduced resistance.

Figure 69:
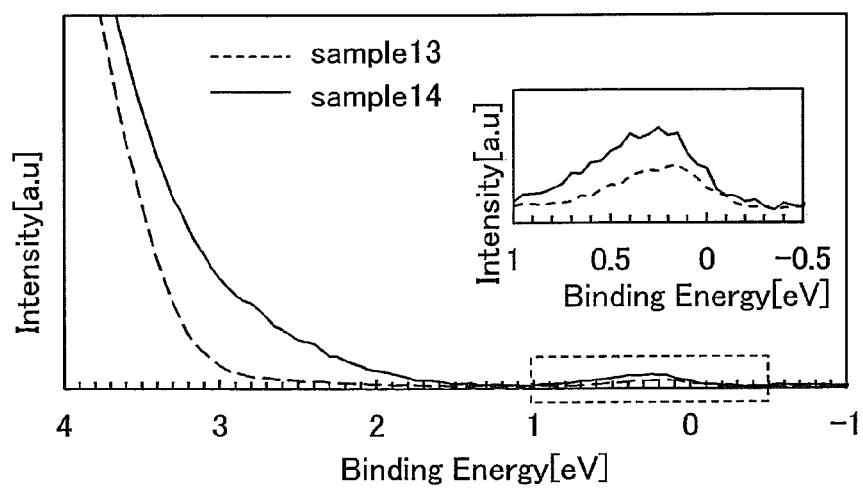
FIG. 69 shows the results of HX-PES analysis of samples.

FIG. 69 shows the results of HX-PES analyze of Samples B13 and B14. Note that FIG. 69 also shows an enlarged view of spectrum with binding energies ranging from −0.5 eV to 0.5 eV. In FIG. 69, a solid line represents the analysis result of Sample B14 while a dashed line represents the analysis result of Sample B13.

It was found that a shallow level at approximately 0.2 eV from the Fermi level increased in Sample B14 as compared with Sample B13. It was also found that a deep level at approximately 2 eV from the Fermi level increased in Sample B14 as compared with Sample B13. These increases in level are probably caused by, as described above, an increase in oxygen vacancies (V$_O$) due to damage generated when the silicon nitride film is deposited over the IGZO film, and an increase in H$_O$ due to diffusion of hydrogen (H) contained in the silicon nitride film into the IGZO film.

The above results indicate that a donor level is formed in the oxide semiconductor film by oxygen vacancies (V$_O$) due to damage generated when a film is deposited over the oxide semiconductor film and by H$_O$ due to diffusion of hydrogen (H) from the outside.

<Temperature Dependence of Resistivity>

Figure 70:
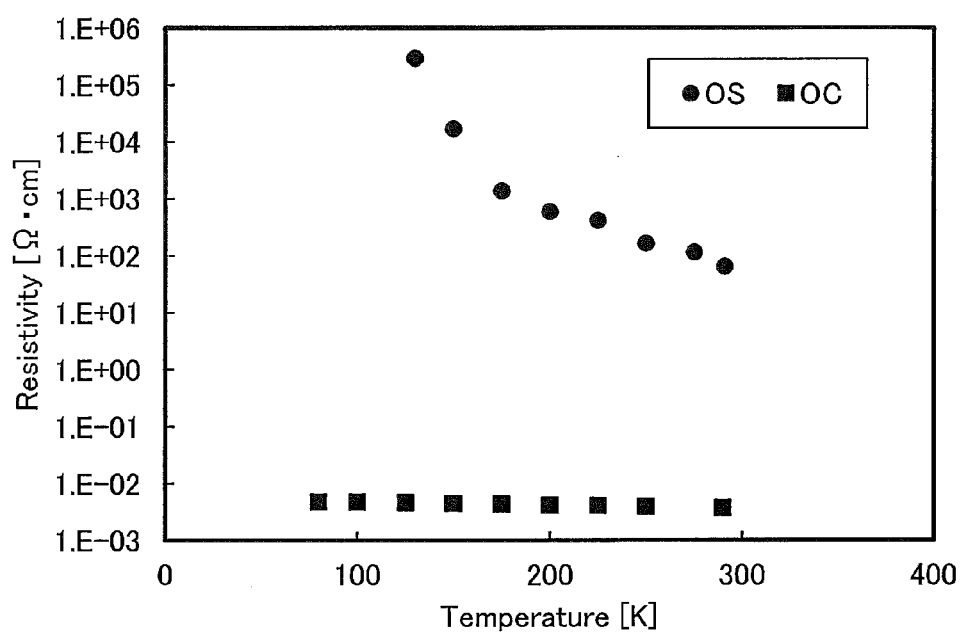
FIG. 70 shows the temperature dependence of resistivity.

Next, the temperature dependence of resistivity of a film formed using an oxide semiconductor (hereinafter referred to as an oxide semiconductor film (OS)) and that of a film formed using an oxide conductor (hereinafter referred to as an oxide conductor film (OC)) will be described with reference to FIG. 70. In FIG. 70, the horizontal axis represents measurement temperature, and the vertical axis represents resistivity. Here, the resistivity was measured by a four-point van der Pauw method. Measurement results of the oxide semiconductor film (OS) are plotted as circles, and measurement results of the oxide conductor film (OC) are plotted as squares.

Note that a sample including the oxide semiconductor film (OS) is prepared by forming a 35-nm-thick In—Ga—Zn oxide film over a glass substrate by a sputtering method using a sputtering target with an atomic ratio of In:Ga:Zn=1:1:1.2, forming a 20-nm-thick In—Ga—Zn oxide film over the 35-nm-thick In—Ga—Zn oxide film by a sputtering method using a sputtering target with an atomic ratio of In:Ga:Zn=1:4:5, performing heat treatment at 450° C. in a nitrogen atmosphere and then performing heat treatment at 450° C. in the atmosphere of a mixed gas of nitrogen and oxygen, and forming a silicon oxynitride film by a plasma CVD method.

A sample including the oxide conductor film (OC) is prepared by forming a 100-nm-thick In—Ga—Zn oxide film over a glass substrate by a sputtering method using a sputtering target with an atomic ratio of In:Ga:Zn=1:1:1, performing heat treatment at 450° C. in a nitrogen atmosphere and then performing heat treatment at 450° C. in the atmosphere of a mixed gas of nitrogen and oxygen, and forming a silicon nitride film by a plasma CVD method.

As can be seen from FIG. 70, the temperature dependence of resistivity of the oxide conductor film (OC) is lower than the temperature dependence of resistivity of the oxide semiconductor film (OS). Typically, the range of variation in the resistivity of the oxide conductor film (OC) at temperatures from 80 K to 290 K is more than −20% and less than +20%. Alternatively, the range of variation in resistivity at temperatures from 150 K to 250 K is more than −10% and less than +10%. In other words, the oxide conductor is a degenerate semiconductor and it is suggested that the conduction band edge agrees with or substantially agrees with the Fermi level.

Example 3

In this example, a liquid crystal display device was fabricated using Embodiment 5. The specifications and display image of the liquid crystal display device will be described.

Table 13 shows the specifications of the liquid crystal display device.

TABLE 13

| | |
|---|---|
| Screen Diagonal | 4.29 inch |
| Resolution | 1080 × RGB(H) × 1920(V): Full-HD |
| Pixel Pitch | 15 μnm(H) × 49.5 μm(V) |
| Pixel Density | 513 ppi |
| Liquid Crystal Mode | Fringe Field Switching |
| Aperture Ratio | 45.50% |
| FET | CAAC-OS |

Figure 71:
FIG. 71 an image displayed on a liquid crystal display device.

FIG. 71 shows a photograph of an image displayed on the liquid crystal display device fabricated in this example. As seen in FIG. 71, the display device of one embodiment of the present invention is a high-definition liquid crystal display device with high display quality. Note that the liquid crystal display device manufactured in this example can be driven at a low frequency and thus, can consume less power.

This application is based on Japanese Patent Application serial No. 2013-248320 filed with Japan Patent Office on Nov. 29, 2013, Japanese Patent Application serial No. 2014-033904 filed with Japan Patent Office on Feb. 25, 2014, and Japanese Patent Application serial No. 2014-107582 filed with Japan Patent Office on May 23, 2014, the entire contents of which are hereby incorporated by references.

REFERENCE NUMERALS

10: transistor, 11: substrate, 12: conductive film, 13: conductive film, 14: gate insulating film, 15: nitride insulating film, 16: oxide insulating film, 17: oxide insulating film, 18: oxide semiconductor film, 19a: oxide semiconductor film, 19b: oxide semiconductor film, 19c: oxide semiconductor film, 19d: oxide semiconductor film, 19f: oxide semiconductor film, 19g: oxide semiconductor film, 20: conductive film, 21a: conductive film, 21b: conductive film, 21c: conductive film, 21d: conductive film, 21e: conductive film, 21f: conductive film, 22: oxide insulating film, 23: oxide insulating film, 24: oxide insulating film, 25: oxide insulating film, 26: nitride insulating film, 27: nitride insulating film, 28: conductive film, 29: common electrode, 29b: conductive film, 29c: conductive film, 29d: conductive film, 30: inorganic insulating film, 30a: inorganic insulating film, 31: organic insulating film, 31a: organic resin film, 33: alignment film. 37a: multilayer film, 37b: multilayer film, 38a: multilayer film, 38b: multilayer film, 39a: oxide semiconductor film, 39b: oxide semiconductor film, 40: opening, 41: opening, 41a: opening, 41b: opening, 49a: oxide semiconductor film, 49b: oxide semiconductor film, 101: pixel portion, 102: transistor, 102a: transistor, 102b: transistor, 102c: transistor, 102d: transistor, 102e: transistor, 103: pixel, 103a: pixel, 103b: pixel, 103c: pixel, 104: scan line driver circuit, 105: capacitor, 105a: capacitor, 105b: capacitor, 105c: capacitor, 106: signal line driver circuit, 107: scan line, 109: signal line, 115: capacitor line, 121: liquid crystal element, 131: light-emitting element, 133: transistor, 135: transistor, 137: wiring, 139: wiring, 141: wiring, 151: substrate, 153: insulating film, 154: rare gas, 155: oxide semiconductor film, 155a: oxide semiconductor film, 155b: oxide semiconductor film, 155c: oxide semiconductor film, 157: insulating film, 157a: insulating film, 159: conductive film, 160a: resistor, 160b: resistor, 160c: resistor, 160d: resistor, 160g: resistor, 161: conductive film, 162: conductive film, 163: conductive film, 164: conductive film, 170a: protection circuit, 170b: protection circuit, 171: wiring, 172: wiring, 173: resistor, 173a: resistor, 173b: resistor, 173c: resistor, 174: transistor, 174a: transistor, 174b: transistor, 174c: transistor, 174d: transistor, 175: wiring, 176: wiring, 177: wiring, 180a: capacitor, 180b: capacitor, 180e: capacitor, 181: conductive film, 320: liquid crystal layer, 322: liquid crystal element, 322a: liquid crystal element, 342: substrate, 344: light-blocking film, 346: coloring film, 348: insulating film, 350: conductive film, 352: alignment film, 370a: light-emitting element, 370b: light-emitting element, 371: insulating film, 373: EL layer, 375: conductive film, 1001: main body, 1002: housing, 1003a: display portion, 1003b: display portion, 1004: keyboard button, 1021: main body, 1022: fixing portion, 1023: display portion, 1024: operating button, 1025: external memory slot, 1030: housing, 1031: housing, 1032: display panel, 1033: speaker, 1034: microphone, 1035: operation keys, 1036: pointing device, 1037: camera, 1038: external connection terminal, 1040: solar cell, 1041: external memory slot, 1050: television set, 1051: housing, 1052: storage medium recording and reproducing portion, 1053: display portion, 1054: external connection terminal, 1055: stand, 1056: external memory, 1100: display panel, 1101: housing, 1110: display panel, 1111: display region, 1112: display region, 1113: display region, 1114: display region, 5100: pellet, 5100a: pellet, 5100b: pellet, 5101: ion, 5102: oxide zinc layer, 5103: particles, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, 8011: battery.

The invention claimed is:

1. A method for manufacturing a semiconductor device, comprising the steps of: forming an oxide semiconductor film over a first insulating film; performing a first heat treatment in a vacuum atmosphere where oxygen in the oxide semiconductor film is released; performing a second heat treatment in a hydrogen-containing atmosphere to form an oxide semiconductor film having conductivity after the first heat treatment, and wherein a hydrogen concentration in the oxide semiconductor film having conductivity is increased to higher than or equal to $5 \times 10^{20}$ atoms/cm$^3$.

2. The method for manufacturing a semiconductor device according to claim 1,
wherein the first heat treatment is performed at a temperature higher than or equal to 350° C. and lower than or equal to 800° C., and
wherein the first heat treatment is performed in the vacuum atmosphere with a pressure greater than or equal to $1 \times 10^{-7}$ Pa and less than or equal to 10 Pa.

3. The method for manufacturing a semiconductor device according to claim 1,
wherein a resistivity of the oxide semiconductor film having conductivity is greater than or equal to $1 \times 10^{-3}$ Ωcm and less than $1 \times 10^4$ Ωcm.

4. The method for manufacturing a semiconductor device according to claim 1,
wherein the oxide semiconductor film having conductivity includes a crystal part, and an angle formed between a c-axis of the crystal part and a normal vector of a surface over which the oxide semiconductor film is formed is greater than or equal to −30° and less than or equal to 30°.

5. The method for manufacturing a semiconductor device according to claim 1,
wherein the oxide semiconductor film having conductivity includes at least one of an In-Ga oxide, an In-Zn oxide, and an In-M-Zn oxide (M is Al, Ga, Y, Zr, Sn, La, Ce, or Nd).

6. The method for manufacturing a semiconductor device according to claim 1,
wherein the semiconductor device includes a resistor, and
wherein the resistor includes the oxide semiconductor film having conductivity.

7. The method for manufacturing a semiconductor device according to claim 1,
wherein the semiconductor device includes a capacitor, and
wherein the capacitor includes the oxide semiconductor film having conductivity.

8. A method for manufacturing a semiconductor device, comprising the steps of:
forming an oxide semiconductor film over a first insulating film; adding a rare gas to the oxide semiconductor film by a doping method or an ion implantation method; performing a heat treatment in a hydrogen-containing atmosphere to form an oxide semiconductor film having conductivity, and wherein a hydrogen concentration in the oxide semiconductor film having conductivity is increased to higher than or equal to $5 \times 10^{20}$ atoms/cm$^3$.

9. The method for manufacturing a semiconductor device according to claim 8,
wherein the rare gas is at least one of helium, neon, argon, krypton, and xenon.

10. The method for manufacturing a semiconductor device according to claim 8,
wherein a resistivity of the oxide semiconductor film having conductivity is greater than or equal to $1 \times 10^{-3}$ Ωcm and less than $1 \times 10^4$ Ωcm.

11. The method for manufacturing a semiconductor device according to claim 8,
wherein the oxide semiconductor film having conductivity includes a crystal part, and an angle formed between a c-axis of the crystal part and a normal vector of a surface over which the oxide semiconductor film is formed is greater than or equal to −30° and less than or equal to 30°.

12. The method for manufacturing a semiconductor device according to claim 8,
wherein the oxide semiconductor film having conductivity includes at least one of an In-Ga oxide, an In-Zn oxide, and an In-M-Zn oxide (M is Al, Ga, Y, Zr, Sn, La, Ce, or Nd).

13. The method for manufacturing a semiconductor device according to claim 8,
wherein the semiconductor device includes a resistor, and
wherein the resistor includes the oxide semiconductor film having conductivity.

14. The method for manufacturing a semiconductor device according to claim 8,
wherein the semiconductor device includes a capacitor, and
wherein the capacitor includes the oxide semiconductor film having conductivity.

* * * * *